US007230764B2

(12) United States Patent
Mullen et al.

(10) Patent No.: US 7,230,764 B2
(45) Date of Patent: Jun. 12, 2007

(54) DIFFERENTIALLY-CURED MATERIALS AND PROCESS FOR FORMING SAME

(75) Inventors: Patrick W. Mullen, Barkhamsted, CT (US); Robert B. Nilsen, Mystic, CT (US); William P. Rowland, Plattsburgh, NY (US)

(73) Assignee: Reflexite Corporation, Avon, CT (US)

( * ) Notice: Subject to any disclaimer, the term of this patent is extended or adjusted under 35 U.S.C. 154(b) by 0 days.

(21) Appl. No.: 11/022,559

(22) Filed: Dec. 22, 2004

(65) Prior Publication Data

US 2005/0141243 A1 Jun. 30, 2005

Related U.S. Application Data

(63) Continuation-in-part of application No. 10/744,916, filed on Dec. 23, 2003, which is a continuation-in-part of application No. 10/428,318, filed on May 2, 2003, now abandoned, which is a continuation-in-part of application No. 09/928,247, filed on Aug. 10, 2001.

(60) Provisional application No. 60/226,697, filed on Aug. 18, 2000, provisional application No. 60/256,176, filed on Dec. 15, 2000.

(51) Int. Cl.
*G02B 27/10* (2006.01)

(52) U.S. Cl. ..................................... 359/619; 359/628

(58) Field of Classification Search ................ 359/454, 359/455, 619–628; 349/62–65, 95, 112
See application file for complete search history.

(56) References Cited

U.S. PATENT DOCUMENTS

| 1,241,886 A | 10/1917 | Rowe |
| 2,248,638 A | 7/1941 | Merton |
| 2,310,790 A | 2/1943 | Jungersen |
| 2,380,447 A | 7/1945 | Jungersen |
| 2,474,317 A | 6/1949 | McPhail |
| 2,904,674 A | 9/1959 | Guth, Sr. |

(Continued)

FOREIGN PATENT DOCUMENTS

JP 8137375 5/1996

(Continued)

OTHER PUBLICATIONS

Avrutsky, Ivan A. et al., "Multiwavelength Diffraction and Apodization Using Binary Superimposed Gratings," *IEEE Photonics Technology Letters*, 10(6):839-841 (1998).

(Continued)

*Primary Examiner*—Hung Dang
*Assistant Examiner*—Joseph Martinez
(74) *Attorney, Agent, or Firm*—Hamilton, Brook, Smith & Reynolds, P.C.

(57) ABSTRACT

A light-redirecting optical structure includes a first side and a second side, the first side including plurality of linear prisms having a visibly random shaped surface on the prisms and a plurality of cross-cut prisms on first side which are oriented at an angle such that it is greater than zero degrees but less than 180 degrees.

A backlight wedge includes a stepped structure on a bottom side that decreases in size traversing the wedge away from a light source which is positioned at an end and having a visibly random shaped surface on said wedge.

11 Claims, 47 Drawing Sheets

U.S. PATENT DOCUMENTS

| | | | |
|---|---|---|---|
| 3,670,260 A * | 6/1972 | Koester et al. ............... 372/9 |
| 3,684,348 A | 8/1972 | Rowland |
| 3,712,706 A | 1/1973 | Stamm |
| 3,718,078 A | 2/1973 | Plummer |
| 3,853,578 A | 12/1974 | Suzuki et al. |
| 4,013,465 A | 3/1977 | Clapham et al. |
| 4,064,433 A | 12/1977 | Korn |
| 4,154,219 A | 5/1979 | Gupta et al. |
| 4,242,723 A | 12/1980 | Fabbri et al. |
| 4,260,220 A | 4/1981 | Whitehead |
| 4,374,077 A | 2/1983 | Kerfeld |
| 4,402,571 A | 9/1983 | Cowan et al. |
| 4,469,407 A | 9/1984 | Cowan et al. |
| 4,477,529 A | 10/1984 | Campbell |
| 4,485,123 A | 11/1984 | Troue |
| 4,496,216 A | 1/1985 | Cowan |
| 4,514,345 A | 4/1985 | Johnson et al. |
| 4,542,449 A | 9/1985 | Whitehead |
| 4,576,850 A | 3/1986 | Martens |
| 4,732,715 A | 3/1988 | Bawa et al. |
| 4,791,540 A | 12/1988 | Dreyer, Jr. et al. |
| 4,839,250 A | 6/1989 | Cowan |
| 4,874,213 A | 10/1989 | Cowan |
| 4,874,228 A | 10/1989 | Aho et al. |
| 4,883,341 A | 11/1989 | Whitehead |
| 4,888,260 A | 12/1989 | Cowan |
| 4,906,070 A | 3/1990 | Cobb, Jr. |
| 4,937,716 A | 6/1990 | Whitehead |
| 4,984,144 A | 1/1991 | Cobb, Jr. et al. |
| 4,999,234 A | 3/1991 | Cowan |
| 5,005,108 A | 4/1991 | Pristash et al. |
| 5,015,524 A | 5/1991 | Kobayashi et al. |
| 5,056,892 A | 10/1991 | Cobb, Jr. |
| 5,093,765 A | 3/1992 | Kashima et al. |
| 5,126,882 A | 6/1992 | Oe et al. |
| 5,161,041 A | 11/1992 | Abileah et al. |
| 5,175,030 A | 12/1992 | Lu et al. |
| 5,183,597 A | 2/1993 | Lu |
| 5,186,530 A | 2/1993 | Whitehead |
| 5,190,370 A | 3/1993 | Miller et al. |
| 5,267,062 A | 11/1993 | Bottorf |
| 5,289,351 A | 2/1994 | Kashima et al. |
| 5,394,255 A | 2/1995 | Yokota et al. |
| 5,396,350 A | 3/1995 | Beeson et al. |
| 5,442,523 A | 8/1995 | Kashima et al. |
| 5,521,797 A | 5/1996 | Kashima et al. |
| 5,550,676 A | 8/1996 | Ohe et al. |
| 5,565,151 A | 10/1996 | Nilsen |
| 5,579,134 A | 11/1996 | Lengyel |
| 5,592,332 A | 1/1997 | Nishio et al. |
| 5,598,280 A | 1/1997 | Nishio et al. |
| 5,600,462 A | 2/1997 | Suzuki et al. |
| 5,629,784 A | 5/1997 | Abileah et al. |
| 5,635,278 A | 6/1997 | Williams |
| 5,670,096 A | 9/1997 | Lu |
| 5,711,589 A | 1/1998 | Oe et al. |
| 5,716,681 A | 2/1998 | Williams |
| 5,721,603 A | 2/1998 | De Vaan et al. |
| 5,724,108 A | 3/1998 | Shibata |
| 5,730,518 A | 3/1998 | Kashima et al. |
| 5,769,522 A | 6/1998 | Kaneko et al. |
| 5,771,328 A | 6/1998 | Wortman et al. |
| 5,780,140 A | 7/1998 | Nilsen |
| 5,816,677 A | 10/1998 | Kurematsu et al. |
| 5,838,403 A | 11/1998 | Jannson et al. |
| 5,844,720 A | 12/1998 | Ohara et al. |
| 5,851,062 A | 12/1998 | Shinohara et al. |
| 5,857,561 A | 1/1999 | Hardman et al. |
| 5,863,113 A | 1/1999 | Oe et al. |
| 5,917,664 A | 6/1999 | O'Neill et al. |
| 5,919,551 A | 7/1999 | Cobb, Jr. et al. |
| 5,932,626 A | 8/1999 | Fong et al. |
| 5,946,991 A | 9/1999 | Hoopman |
| 5,995,690 A | 11/1999 | Kotz et al. |
| 6,052,164 A | 4/2000 | Cobb, Jr. et al. |
| 6,075,649 A | 6/2000 | Naito |
| 6,114,010 A | 9/2000 | Williams |
| 6,147,804 A | 11/2000 | Kashima et al. |
| 6,164,782 A | 12/2000 | Pojar |
| 6,239,851 B1 | 5/2001 | Hatazawa et al. |
| 6,277,471 B1 | 8/2001 | Tang |
| 6,280,063 B1 | 8/2001 | Fong et al. |
| 6,322,236 B1 | 11/2001 | Campbell et al. |
| 6,354,709 B1 | 3/2002 | Campbell et al. |
| 6,356,389 B1 | 3/2002 | Nilsen et al. |
| 6,357,888 B1 | 3/2002 | Takata et al. |
| 6,359,735 B1 | 3/2002 | Gombert et al. |
| 6,570,710 B1 | 5/2003 | Nilsen et al. |
| 6,576,887 B2 | 6/2003 | Whitney et al. |
| 6,588,883 B2 | 7/2003 | Nakatani et al. |
| 6,673,425 B1 | 1/2004 | Hebrink et al. |
| 6,787,202 B2 | 9/2004 | Mizutani et al. |
| 6,845,212 B2 | 1/2005 | Gardiner et al. |
| 2002/0051866 A1 | 5/2002 | Mullen |
| 2002/0057497 A1 | 5/2002 | Gardiner et al. |
| 2003/0103760 A1 | 6/2003 | Gardiner et al. |
| 2003/0214728 A1 | 11/2003 | Olczak |

FOREIGN PATENT DOCUMENTS

| | | |
|---|---|---|
| JP | 2000210963 | 2/2000 |
| WO | WO 97/30604 | 8/1997 |
| WO | WO 02/04858 A2 | 1/2002 |
| WO | WO 02/16106 A2 | 2/2002 |

OTHER PUBLICATIONS

Cowan, James J., "Aztek surface-relief volume diffractive structure," *Journal of the Optical Society of America A*, 7(8):1529-1544 (1990).

Cowan, James J., "The Holographic Honeycomb Microlens," *Proceedings of SPIE-The International Society for Optical Engineering*, 523:251-259 (1985).

Francon, M., *Optical Interferometry*, pp. 40-41 (1966).

Guerra, John M., P.E., President, "Preliminary Report: Suitability of PTM to Analysis of Optikos Sample," Optikos Corp. and Nanoptek Corp. (2002).

Jenkins, Francis A. et al., *Fundamentals of Optics*, Third Edition, 2 pages (1957).

Mihailov, Stephen J. et al., "Apodization technique for fiber grating fabrication with a halftone transmission amplitude mask," *Applied Optics*, 39(21):3670-3677 (2000).

* cited by examiner

DIFFERENTIALLY-CURED MATERIALS AND PROCESS FOR FORMING SAME

RELATED APPLICATIONS

This application is a Continuation-in-Part of U.S. patent application Ser. No. 10/744,916, filed on Dec. 23, 2003, which is a Continuation-in-Part of U.S. patent application Ser. No. 10/428,318, filed on May 2, 2003 now abandoned, which is a Continuation-in-Part of U.S. patent application Ser. No. 09/928,247, filed on Aug. 10, 2001, which claims the benefit of U.S. Provisional Application No. 60/226,697, filed on Aug. 18, 2000, and U.S. Provisional Application No. 60/256,176, filed on Dec. 15, 2000. The entire teachings of the above applications are incorporated herein by reference.

BACKGROUND OF THE INVENTION

Many retroreflective sheeting, collimating films, etc. are made to exacting dimensions in metal molds that are difficult and expensive to make. The metal molds can represent a significant barrier of entry into a high quality market for optical sheeting and films. However, knock-off manufacturers of retroreflective sheeting and collimating film can form inexpensive, low quality molds from the high quality optical sheeting and film. As a means to deter such copying, the metal molds are often engraved with a company logo or trademark, which can cause the logo or trademark to appear on the knock-off end product. A disadvantage of the added logo is that it can be more difficult to engrave at the tolerances required.

Therefore, a need exists for better marked products and a method of marking products better.

SUMMARY OF THE INVENTION

A structure includes a microstructured layer that includes a first cured portion and a second cured portion that are formed from a same light or radiation-curable material. The first cured portion is cured to a first amount of time or at a first rate, and the second cured portion is cured to a second amount of time or at a second rate. The first amount of time or rate is sufficiently different than the second amount of time or rate to result in a discontinuity on the surface of the structure. The layer can be connected to a base. The layer and the base can be formed of the same material. The first amount of curing can be sufficiently different than the second amount of curing to result in a difference between the thickness of the first portion and the thickness of the second portion. The difference in particular embodiments can be in a range of between about 0.02 and 2.0 micrometers. In particular embodiments, the microstructured layer includes linear prisms, prisms, pyramids, truncated pyramids, lenticulars, cones, moth-eye structured surfaces, diffractive structures, diffractive structured surfaces, textured surfaces, lenses, and/or lens arrays. In other embodiments, the cross-section of the microstructures can include any polygonal or curved cross-sectional shape.

A discontinuity is considered a rise or depression in the surface of a structure that causes incident light to display a different shade of light than when incident light strikes a portion of the surface not having a rise or depression. In a particular embodiment, the discontinuity can be discerned with the naked eye. The layer can be a prism array, such as linear prisms or cube-corner prisms, a lenticular structure, or a sub-wavelength structure, or a non-structured layer, such as a coating.

A method for forming a pattern in a radiation-curable material includes providing, between a radiation source and the radiation-curable material, a blocking pattern that can block a portion of the radiation from the radiation source. The material is cured with radiation from the radiation source through the blocking pattern to form a pattern in the radiation-curable material.

A pattern transfer structure includes a radiation source for emitting radiation, a radiation-curable material that can be cured by the radiation, and a pattern for blocking a portion of the radiation. The pattern is disposed between the radiation source and the radiation-curable material during the curing of the material such that a pattern is formed in the material.

A method for forming a prism structure includes providing a prism mold and placing a radiation-curable material in the mold. A pattern is provided between a radiation source and the radiation-curable material that can block a portion of the radiation-curable material. The radiation-curable material is cured with radiation from the radiation source to form a pattern in the radiation-curable material.

A prism structure includes a base and a prism array connected to the base. The prism array includes a first cured portion and a second cured portion that are formed from a same radiation-curable material. The first cured portion has a first index of refraction value and the second cured portion has a second index of refraction value. It is believed that the index of refraction is sufficiently different from the first index of refraction value to result with a discontinuity, which can be visible in particular embodiments, on the surface of the structure. In particular embodiments, the prism array includes a random differentially-cured pattern on the facets of the array to minimize wet-out when the array is positioned adjacent to a surface or layer. In alternative embodiments, the window side of the prism array includes a regular or uniform differentially-cured pattern formed on and/or therein. The differentially-cured pattern can cause the contour of the surface of the prism and/or window side to change shape, such as continuous concave-convex surface non-smooth surface. In further embodiments, the window side of the prism array can include a series of base planes and a series of plateaus, with the base planes and the plateaus running along a first axis. The plateaus and base planes alternate along a second axis, the plateaus not being coplanar with the base planes.

A backlighting system includes a light source, a first light-redirecting film, a second light-redirecting film, a differentially-cured pattern, and a waveguide. The first light-redirecting film includes a plurality of linear prisms with the differentially-cured pattern on and/or therein. The second light-redirecting film includes a plurality of linear prisms on a first side and a differentially-cured pattern formed on and/or in a second side that faces the linear prisms of the first light-redirecting film. The waveguide is for receiving light from the light source and redirecting the light toward the first light-redirecting film.

In other embodiments, an optical structure comprising a microstructured layer can be provided on a non-smooth surface. The non-smooth surface can include an undulating pattern. In a particular embodiment, the microstructured layer includes a moth-eye structure formed on an excess resin layer on a substrate film, which can be differentially-cured to form the non-smooth surface.

A method for forming a microstructured layer provided on a non-smooth surface, comprising dispensing a resin layer between a substrate film and tool used to form a microstructured surface in the resin layer, and curing the resin layer through a mask to form a differentially-cured structure that is non-smooth with the microstructured layer being formed on the non-smooth surface.

A light-redirecting optical structure includes a first side and a second side. The first side includes a plurality of linear prisms having a visibly random shaped surface on the prisms. A plurality of cross-cut prisms on first side are oriented at an angle such that it is greater than zero degrees but less than 180 degrees. In one embodiment, the cross-cut prisms are oriented at an angle such that it is greater than zero degrees but less than 180 degrees, but the angle is not ninety degrees. In another embodiment, the light-redirecting optical has a first side that includes a plurality of first cured portions and a plurality of second cured portions that are formed from a same radiation-curable material. The first plurality of cured portions are cured to a first amount of time or at a first rate. The plurality of second cured portions are cured to a second amount of time or at a second rate. The first amount of time or rate is sufficiently different than the second amount of time or rate to result with discontinuities on and/or within the surface of the structure.

A backlight wedge includes a stepped structure on a bottom side that decreases in size traversing the wedge away from a light source which is positioned at an end and having a visibly random shaped surface on said wedge. In one embodiment, the tapered prisms of the wedge include a plurality of first cured portions and a plurality of second cured portions that are formed from a same radiation-curable material. The first plurality of cured portions are cured to a first amount of time or at a first rate. The plurality of second cured portions are cured to a second amount of time or at a second rate. The first amount of time or rate is sufficiently different than the second amount of time or rate to result with discontinuities on and/or within the surface of the structure.

The invention has many advantages including forming a permanent pattern in materials that is transparent and does not significantly detract from other functions while adding the benefits described below. The material can have the pattern act similar to a watermark in paper to provide a means of identification for a product's source that is difficult to forge. Also, the pattern can serve as a function of light management by altering the path of light that is transmitted through such a structure having the pattern.

Figure 1:
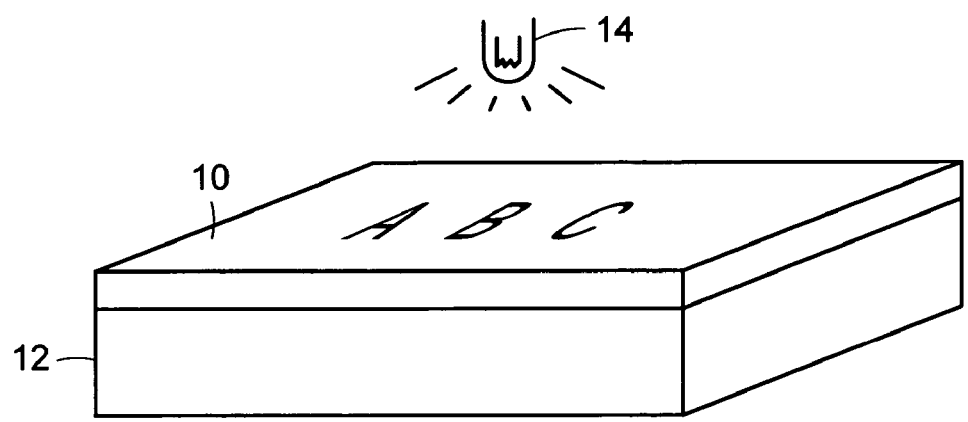
FIG. 1 is a perspective view of a radiation-curable material and a pattern layer positioned thereover for forming a pattern in the curable material.

The foregoing and other objects, features and advantages of the invention will be apparent from the following more particular description of various embodiments of the invention, as illustrated in the accompanying drawings in which like reference characters refer to the same parts throughout the different views. The drawings are not necessarily to scale, emphasis instead being placed upon illustrating the principles of the invention. All parts and percentages are by weight unless otherwise specified.

DETAILED DESCRIPTION OF THE INVENTION

A description of various embodiments of the invention follows. Generally, the invention is directed to forming a pattern in a radiation-curable material. The pattern, in one embodiment, is transparent when viewed in a direction substantially normal to the material. However, in a particular embodiment, the pattern can be seen more clearly at a viewing angle of about fifteen degrees from the normal.

Often, the term optical "sheets" refers to a more rigid substrate, for example, one that could be leaned against a wall without folding over on itself, and the term optical "films" refers to a substrate that is more flexible, for example, one that could be rolled up. However, depending on the size and thickness of the sample, a film can act as a sheet. For example, a small, thin polyester film can be rigid enough to lean against a wall without folding over on itself. For purposes of understanding aspects of the present invention, the terms "sheet" and "film" can be used interchangeably. Sheets and films of the present invention can be formed from plastic material, such as, polyurethane, polypropylene, acrylic, polyurea, polyvinyl chloride, polycarbonate, polyester, or polymethylmethacrylate. Polyurea is disclosed in U.S. patent application Ser. No. 10/634,122, filed Aug. 4, 2003, the entire teachings of which are incorporated herein by reference.

FIG. 1 illustrates an embodiment of the present invention for forming a pattern, such as exemplary pattern "ABC" provided by, for example, mask or pattern layer 10 disposed between a radiation source 14 and a radiation-curable material 12. In one embodiment, the mask layer 10 can include polycarbonate, polyethylene, polybutylene or the like, and may include a low-tack adhesive. The curable material 12 can include coatings and microstructured or patterned materials formulated from materials, such as monomers and/or oligomers that include epoxy, polyester, urethane, polyether and acrylic acrylates or methacrylates or cationic monomers and oligomers. Various additives including fillers, free-radical initiators, and cationic initiators can be included in the material 12 to improve processing or performance. See, for example, Sartomer Company Bulletin Nos. 4018 or 4303, the entire teachings of which are incorporated herein by reference. The radiation source 14 preferably provides actinic radiation, which causes photochemical activity in the curable material 12. For example, typical ultraviolet light can be used. In particular embodiments, a silicone-based coating can be provided on the mask layer 10 to prevent the mask from adhering to the radiation-curable material 12 after it has been cured. In other embodiments, the material that forms the mask layer 10 and the radiation-curable material 12 can be selected to prevent the mask from adhering to the material after it has cured.

The pattern layer 10 can include any kind of material that blocks at least a portion of the radiation from the radiation source to leave a similar pattern in the cured material 12. For example, the pattern can be formed by a colored pattern, such as using common printing inks, printed on a transparent polymer film or light redirection properties of the film. The pattern can also be formed by embossing patterns that affect the transparency of the film. In one embodiment, the pattern can be applied directly on either side of a substrate that carries the curable material 12 and, after curing, the pattern may or may not be removed to leave the cured pattern in the cured layer 12. In alternative embodiments, the pattern layer 10 can include a stencil or the like, such as a colored or semi-transparent film material or a clear resin with ultraviolet blocking chemical therein.

Figure 2:
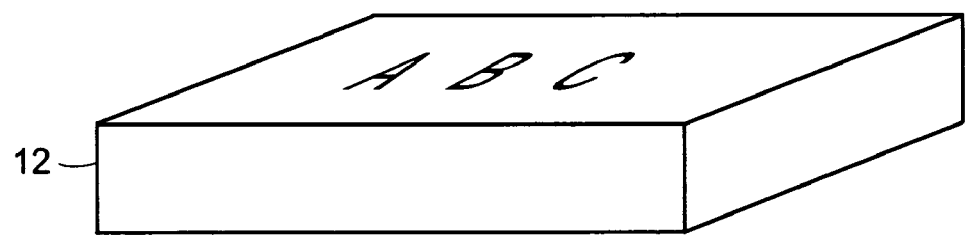
FIG. 2 is a perspective view of the radiation-curable material having a pattern formed therein.

As shown in FIG. 2, the pattern layer 10 has been removed but the pattern "ABC" has been transferred to the cured material 12. It is believed that the pattern changes the curing rate of the material 12 to form the pattern in the cured material. It is believed that the molecules in the formed pattern are denser because the molecules have a longer time to cross-link than the molecules that do not have a mask thereover. These denser regions appear to have different indices of refraction. The pattern is best viewed at an angle of about fifteen degrees to the surface.

Figure 3:
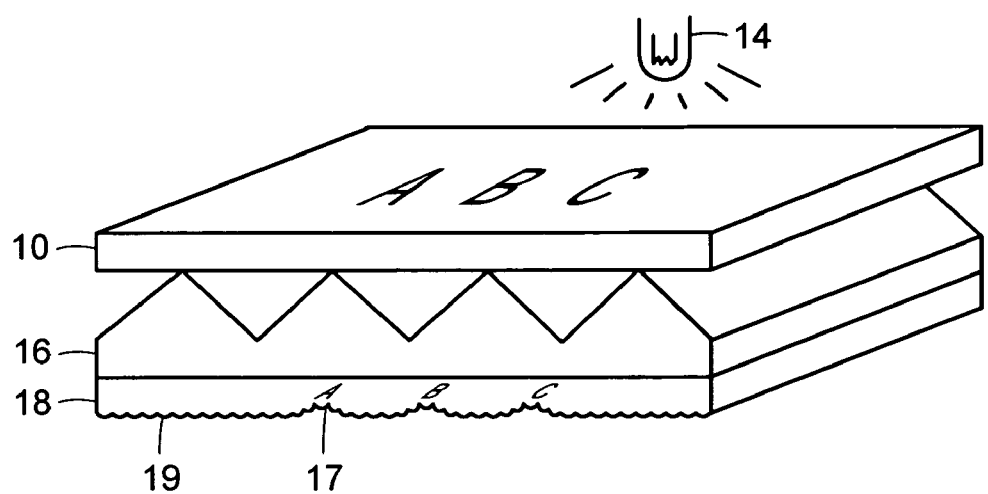
FIG. 3 is a perspective view of a light-redirecting structure having moth-eye structures formed thereon, the moth-eye structures having a pattern formed therein in accordance with another embodiment of the invention.

FIG. 3 illustrates another embodiment for forming a pattern in a material. In this embodiment, a pattern layer 10 is positioned over a cured light-redirecting or retroreflective structure 16 that can contain, for example, linear or cube-corner prisms. Examples of suitable cube-corner prisms are disclosed in U.S. Pat. No. 3,684,348, issued to Rowland on Aug. 15, 1972, the entire teachings of which are incorporated herein by reference.

A moth-eye structured layer 18 can be formed on the opposite side of the light-redirecting or retroreflective structure 16 as shown in FIG. 3. Moth-eye subwavelength structures are explained in more detail in U.S. Pat. No. 6,356,389, which issued to Nilsen et al. on Mar. 12, 2002, which corresponds to International Publication No. WO 01/35128, published on May 17, 2001. The entire teachings of each are incorporated herein in their entirety. The moth-eye structures 19 are cured by the radiation source 14 through the pattern layer 10 and light-redirecting structure 16 such that the pattern is formed in the resin layer just below moth-eye structures 18 without changing the shape of the moth-eye structures or diffusing structure or other suitable structures. The outside surface of the layer 18 can include indentations or contours 17 that are formed adjacent to the differentially-cured pattern.

A sub-wavelength structure applied can have an amplitude of about 0.4 microns and a period of less than about 0.3 microns. The structure is sinusoidal in appearance and can provide a deep green to deep blue color when viewed at grazing angles of incidence if the period is about 200 nanometers or about 0.15 micrometers. In a particular embodiment, the amplitude is greater than two times the period to provide a two or greater to one aspect ratio.

To form a sub-wavelength structure, the structure is first produced on a photo resist-covered glass substrate by a holographic exposure using an ultraviolet laser. A suitable device is available from Holographic Lithography Systems of Bedford, Mass. An example of a method is disclosed in U.S. Pat. No. 4,013,465, issued to Clapham et al. on Mar. 22, 1977, the entire teachings of which are incorporated herein by reference. This method is sensitive to any changes in the environment, such as temperature and dust, and care must be taken. The structure is then replicated in a nickel shim by an electroforming process.

Figure 4:
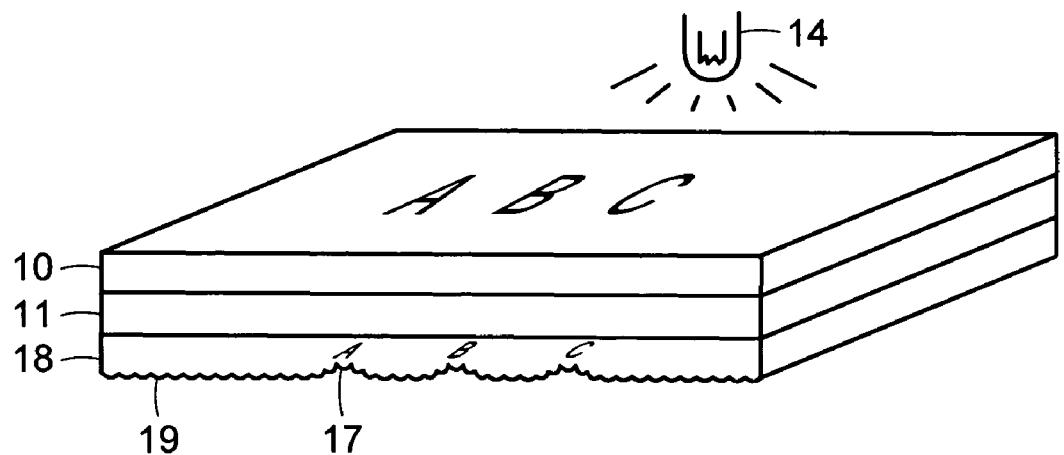
FIG. 4 is a perspective view of a microstructured layer being formed on a substrate and cured through a pattern layer positioned on the substrate.
Figure 5:
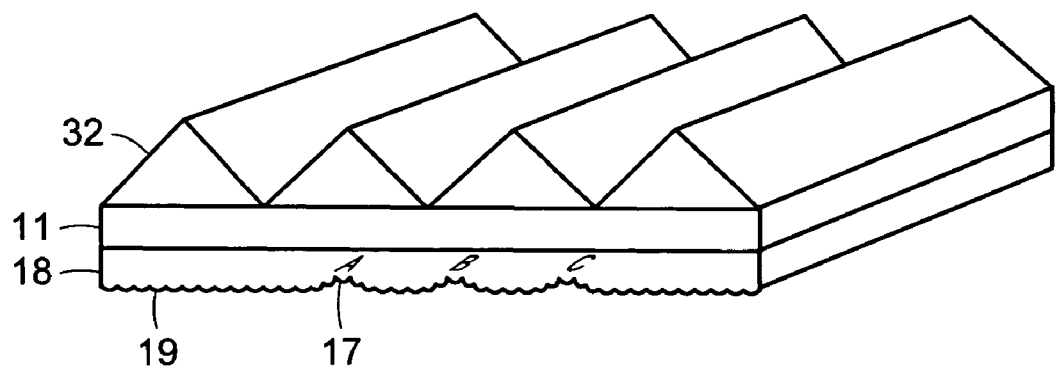
FIG. 5 is a perspective view of a light-redirecting film that includes a microstructured layer disposed on each side of a substrate.

In other embodiments, as illustrated in FIG. 4, a pattern layer 10 can be placed on a first side of a substrate 11 and a microstructured layer, such as a moth-eye structured layer 18, can be formed on a second side of the substrate 11. The moth-eye structures 19 are cured by the radiation source 14 through the pattern layer 10 such that the pattern is formed in the resin layer just below moth-eye structures 19 without changing the shape of the moth-eye structures or diffusing structure or other suitable structures. The outside surface of the layer 18 can include indentations or contours 17 that are formed adjacent to the differentially-cured pattern. As illustrated in FIG. 5, the mask 10 can be removed and micro-structures, such as linear prisms 32, can be formed on the first side of the substrate 11. In particular embodiments, the substrate 11 can be formed from a thermoset or thermoplastic material and layers 18 and 32 can be formed from a thermoset material.

In various embodiments, the optical structures described by James J. Cowan in the following references can be implemented herein: Cowan, J. J., "The Holographic Honeycomb Microlens," *Proc. SPIE—The International Society of Optical Engineering,* 523: 251–259 (1985), and Cowan, J. J., "Aztec Surface-relief Volume Diffractive Structure," *J. Optical Soc. Am.*, Vol. 7, No. 8: 1529–1544 (1990). The entire teachings of these references are incorporated herein by reference.

In another embodiment, a fine pattern can be formed on the mask layer 10. For example, the pattern can be a few tenths of a millimeter or less in width. A curable material, which can be substantially clear when cured, is formed on the opposite side of the mask layer 10 of the pattern and cured by a radiation source 14. The fine pattern is thus transferred to the cured material. The mask layer 10 is removed and the cured sheet is placed in front of a display, such as a liquid crystal display. The fine pattern breaks up the pixel pattern in the display without as much light loss as with diffuser sheets. The result is similar to surface structures that are designed to apodize the wavefront.

In radiation cured casting processes where it is desirable to produce features with multiple angles, one normally cuts multiple angle features into the mold that is used for the reproduction of the features. This is commonly true in the manufacture of light-guiding or light-reflecting products where small angle changes can strongly affect the product performance. The cutting and replication of molds are costly and time consuming processes.

With embodiments of this invention, one can produce a variety of angle and pattern variations in a product from a single mold design. One prints a "photomask" onto the surface of a carrier sheet or film prior to formation and radiation cure of a mold formed structure. The "photomask" can be clear or colored and be applied to either side of the carrier. If the curing radiation is highly collimated, it is desirable to have the "mask" be semi-transparent to allow for slow curing in that area. In cases where the radiation is less collimated, one can obtain cure through totally opaque masks via scattering and reflections into the masked area.

The resulting product then displays different optical behavior in areas that have been masked due to the variation in shrinkage and refractive index related to the speed of cure that is varied by the "mask".

Figure 6:
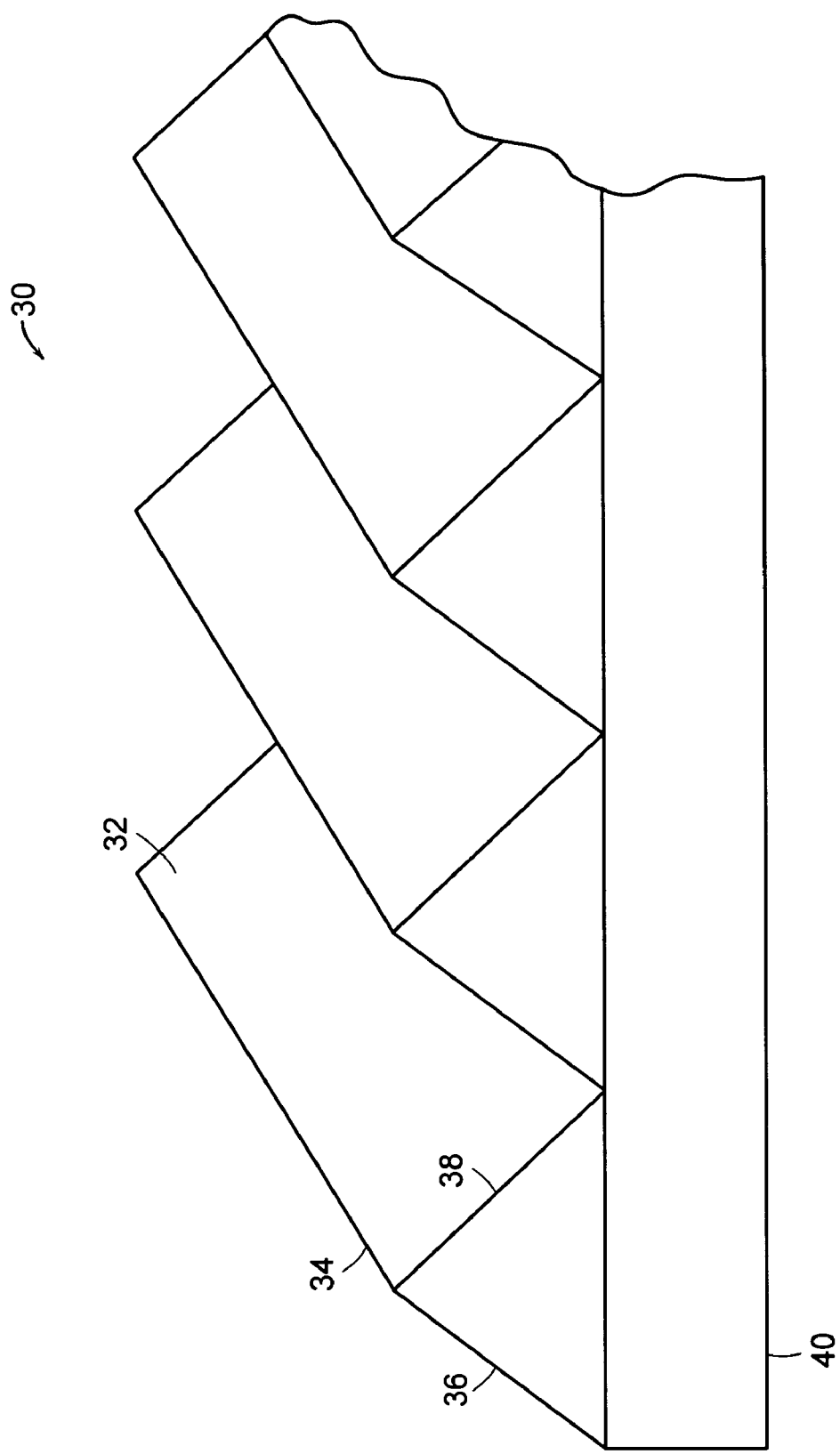
FIG. 6 is a perspective view of a standard light-redirecting film.

FIG. 6 shows a perspective view of a typical collimating film 30 with linear prisms 32 having linear peaks 34 and valleys 36. The dihedral angle of the first side 38 and second side 39 of the peak 34 is typically ninety degrees. However, it can be a non-right angle. The linear prisms 32 can be formed on a base film 40.

It has been discovered that when the film 30 is positioned adjacent to an optical element such as a diffuser or collimating film, a portion of film 30 such as prism peaks 34 can "wet-out," which results in a visible defect. The wetting is believed to be a result of both the contact point and the shape of the prism tip. A sharp prism tip creates angles with the adjacent film and light source that cause optical paths for the light reflection and refraction that causes fringes that create a wetting appearance.

Figure 7:
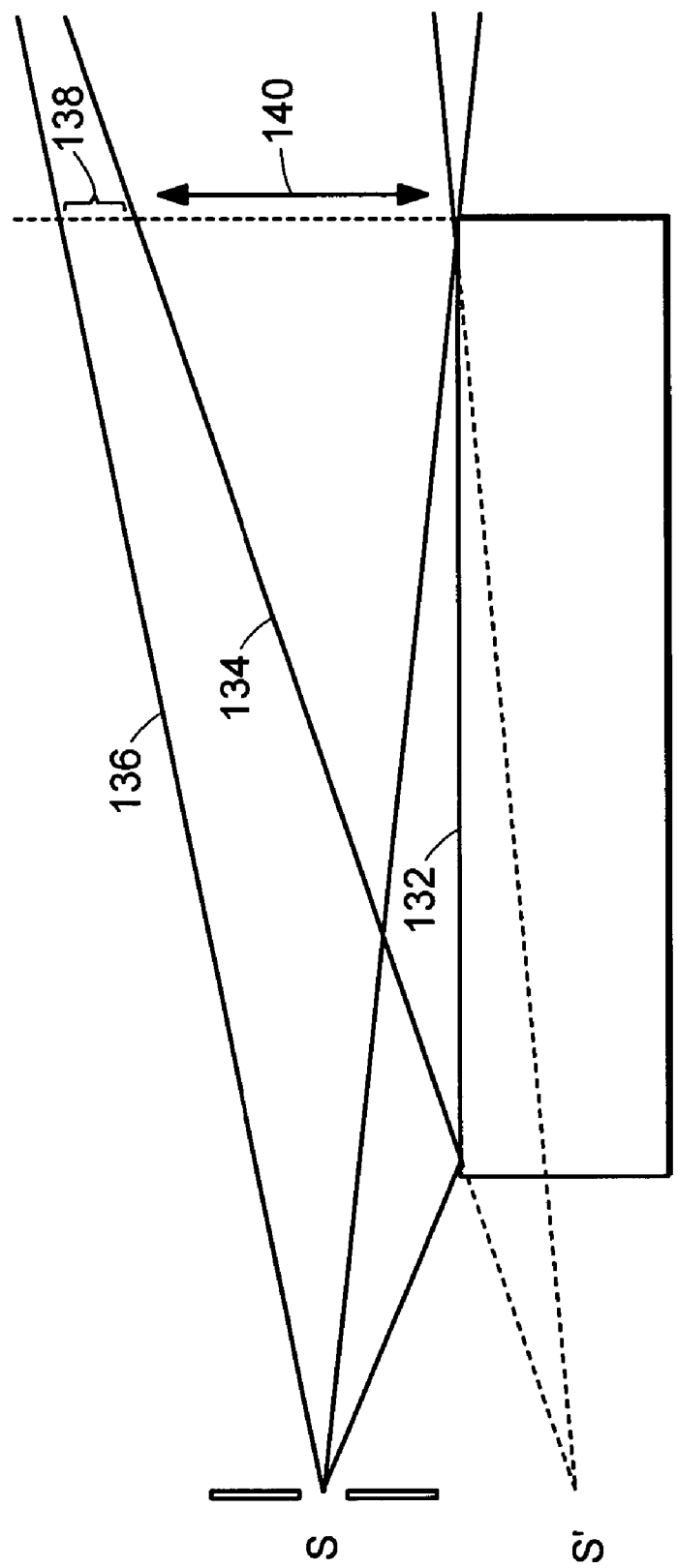
FIG. 7 is a cross-sectional view of a system used to illustrate how wet-out can occur, for example, between prism peaks and adjacent surfaces.
Figure 8:
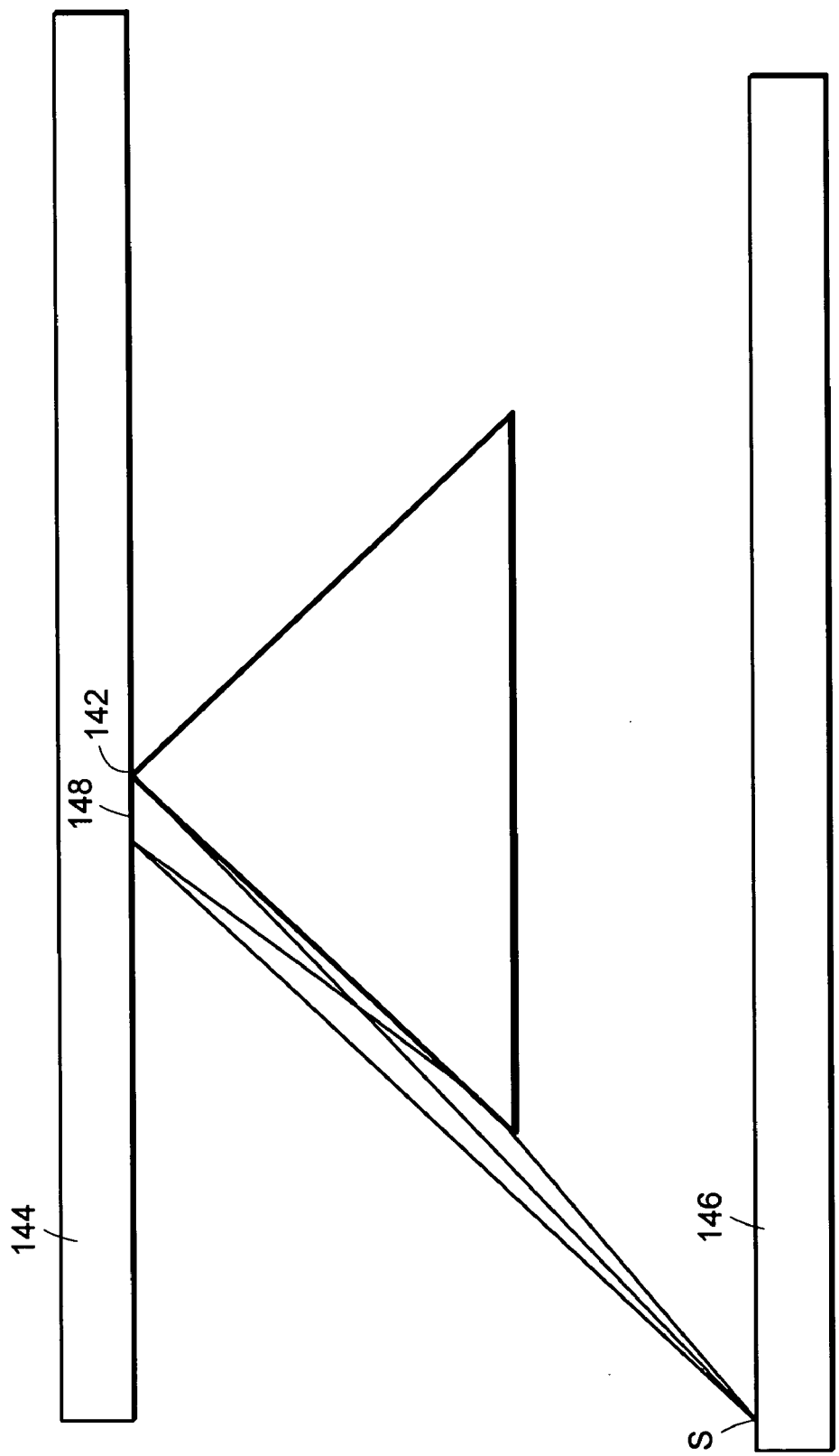
FIG. 8 is a diagram illustrating a first fringe area that can occur at the interface between a prism tip and an adjacent surface.
Figure 9:
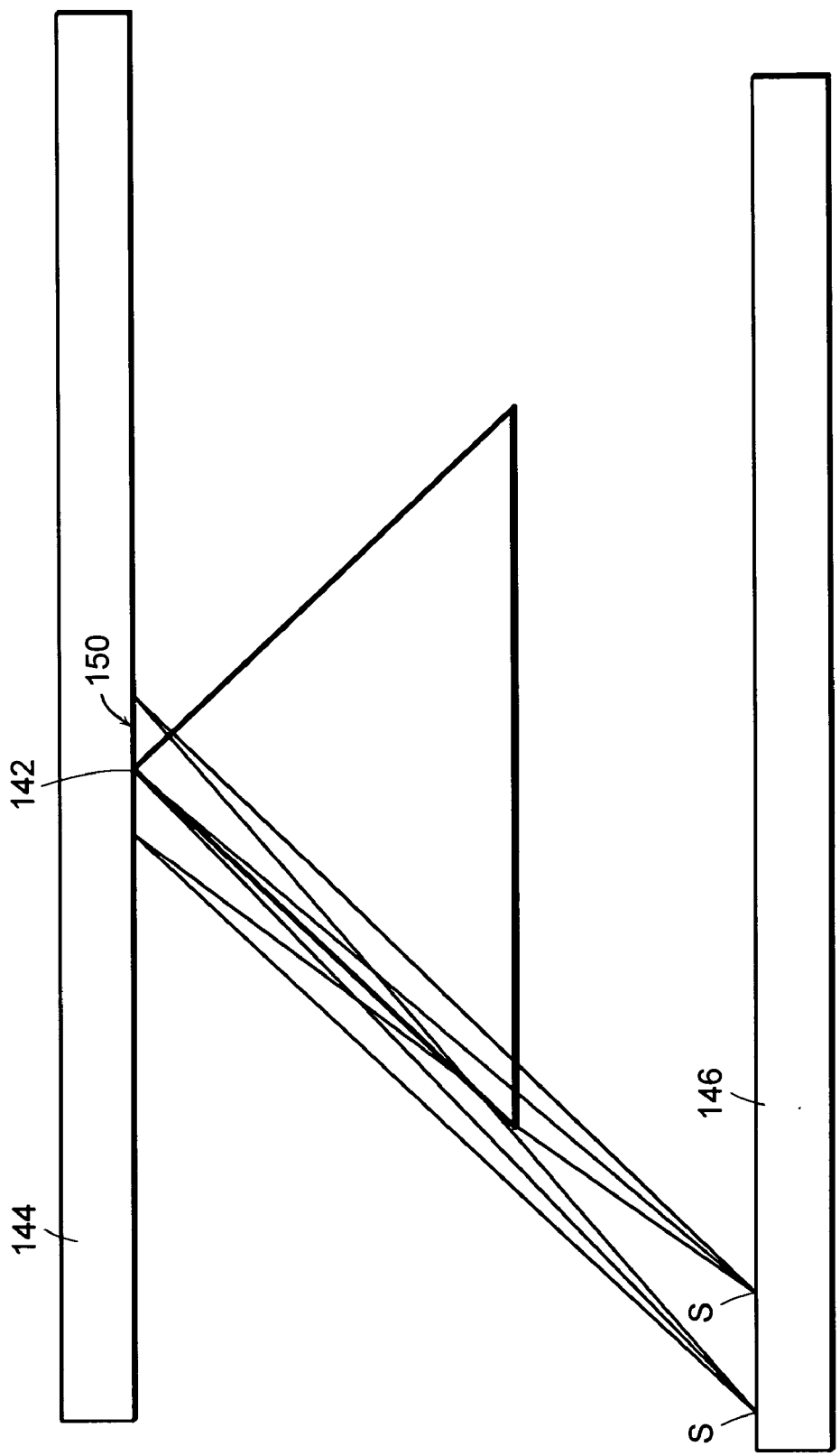
FIG. 9 is a diagram illustrating a second fringe area that can occur at the interface between a prism tip and an adjacent surface.
Figure 10:
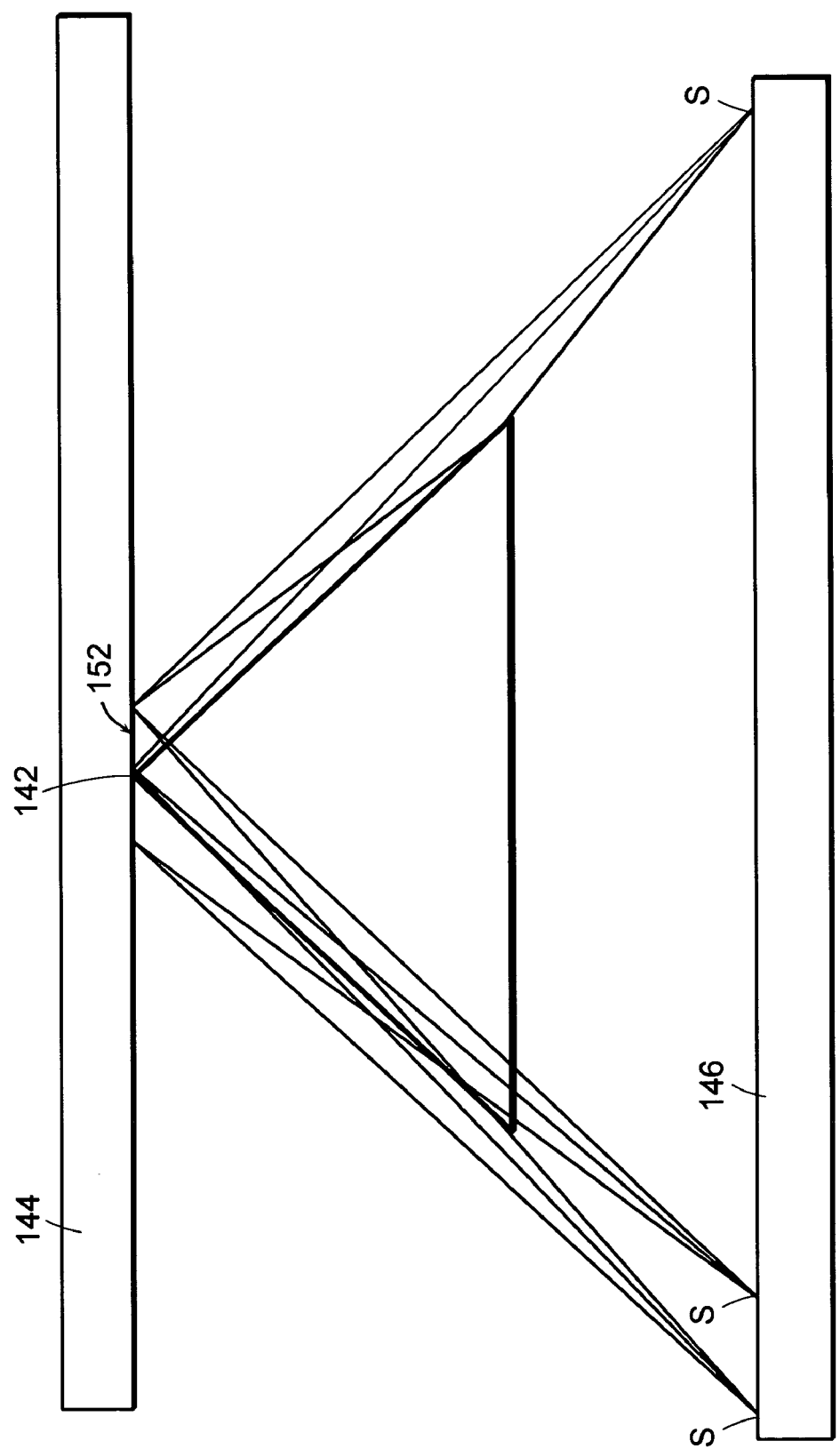
FIG. 10 is a diagram illustrating a third fringe area that can occur at the interface between a prism tip and an adjacent surface.
Figure 11:
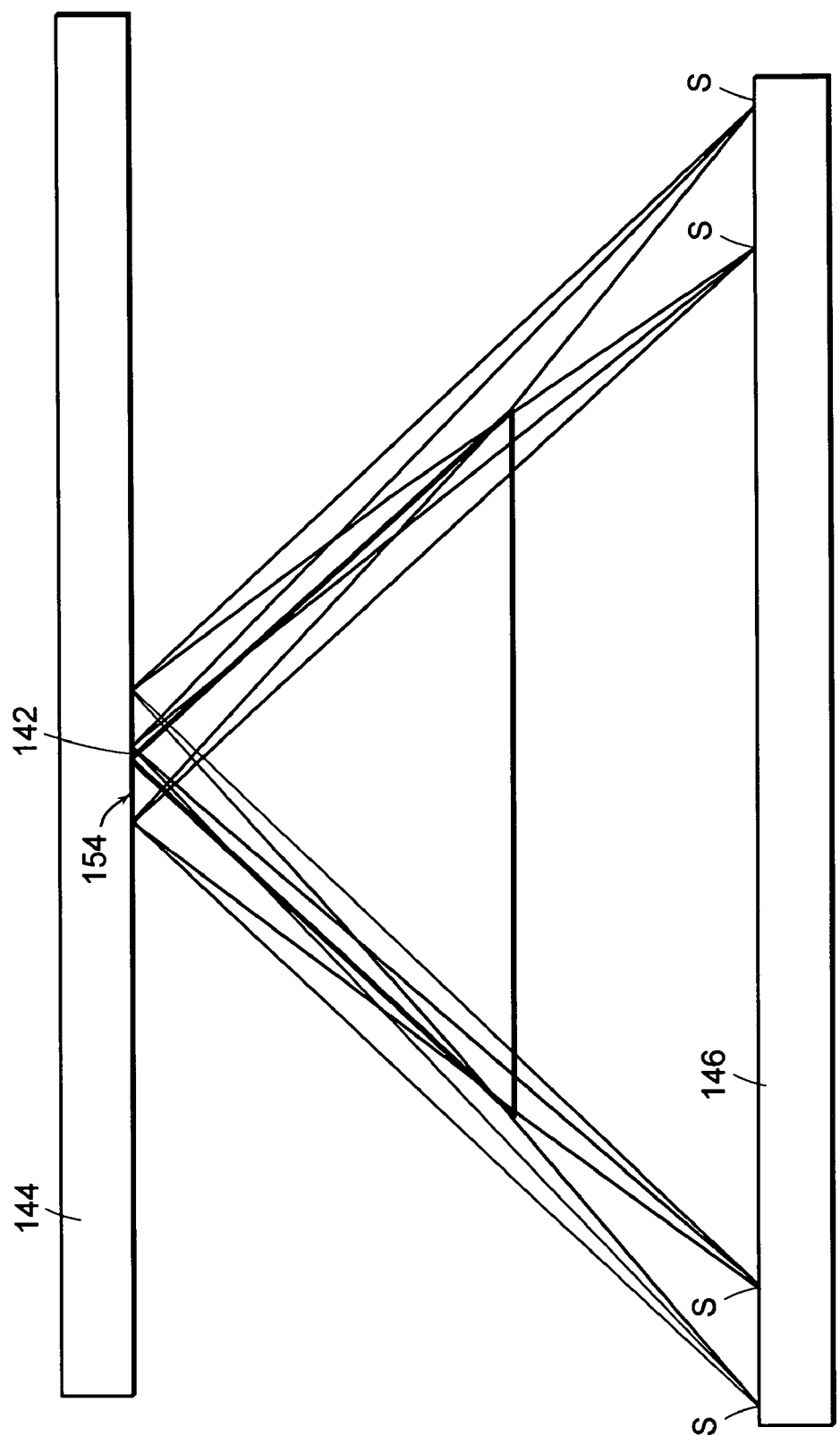
FIG. 11 is a diagram illustrating a fourth fringe area that can occur at the interface between a prism tip and an adjacent surface.

FIG. 7 illustrates a concept called "Lloyd's mirror" that explains how wet-out occurs, for example, at the interface between prism peaks and adjacent surfaces. Lloyd's mirror is described in the book entitled *Fundamentals of Optics*, F. A. Jenkins and H. E. White (New York, McGraw-Hill), third edition, pp. 241–243 (1957), the entire teachings of which are incorporated herein by reference.

When light from a point source S reflects at grazing incidence off of a flat surface 132 of a glass plate, for example, there is a one-half wavelength phase change in the reflected light. When the reflected beam, for example, beam 134, combines with a beam 136 from the source S that is not reflected, interference fringes are produced. For example, area 138 is a dark band because beams 134 and 136 are 180 degrees out of phase. Alternating dark and bright bands are produced along area 140. The same result occurs if the light is traveling within the glass plate because the total internal reflection is at an angle beyond the critical angle.

FIGS. 8, 9, 10, and 11 illustrate four locations at which Lloyd's mirror fringes can occur for each sharp prism tip 142 at the interface between the tip and an adjacent surface, for example, a diffuser 144. The diffuser surface acts as an imaging screen making the fringes visible. The light source 146 is shown at the bottom of each figure. FIGS. 8, 9, 10, and 11 illustrate a first fringe area 148, a second fringe area 150, a third fringe area 152, and a fourth fringe area 154, respectively, in which interference fringes can occur.

The result for white light sources is a relatively wide band of gray fringes on either side of the prism tip 142. If the prism tip 142 is flat or slightly rounded in any way, there may also be Newton's fringes or rings on top of the prism tips 142. One can calculate the distance, Delta X, between the successive Lloyd's mirror-type fringes using the following formula (although the fringes are actually wider apart than calculated because of the forty-five degree angle of the diffuser 144 to the tip 142): Wavelength of a given light= [(Delta X)×(Distance between real and virtual images)]/ Distance from source to diffuser surface. For example, assuming that the wavelength of red light is about 0.6 micrometers, the distance between real and virtual images is about ten micrometers, and the distance from the source to the diffuser surface is about 150.0 micrometers. These assumptions give a Delta X of about nine micrometers or, allowing for the forty-five degree diffuser tilt, it is about twelve micrometers. Thus, for red light, a dark fringe can occur just adjacent to the tip and then another dark fringe can occur about twelve micrometers from the tip.

With white light, there is a continuum of overlapping light and dark fringes in this area because of the continuum of wavelengths from about 300 to 700 nanometers. It has been discovered that by spacing the prism tip 142 away from adjacent surfaces, such as a diffuser, Lloyd's mirror fringes can be substantially minimized or even eliminated altogether.

Figure 12:
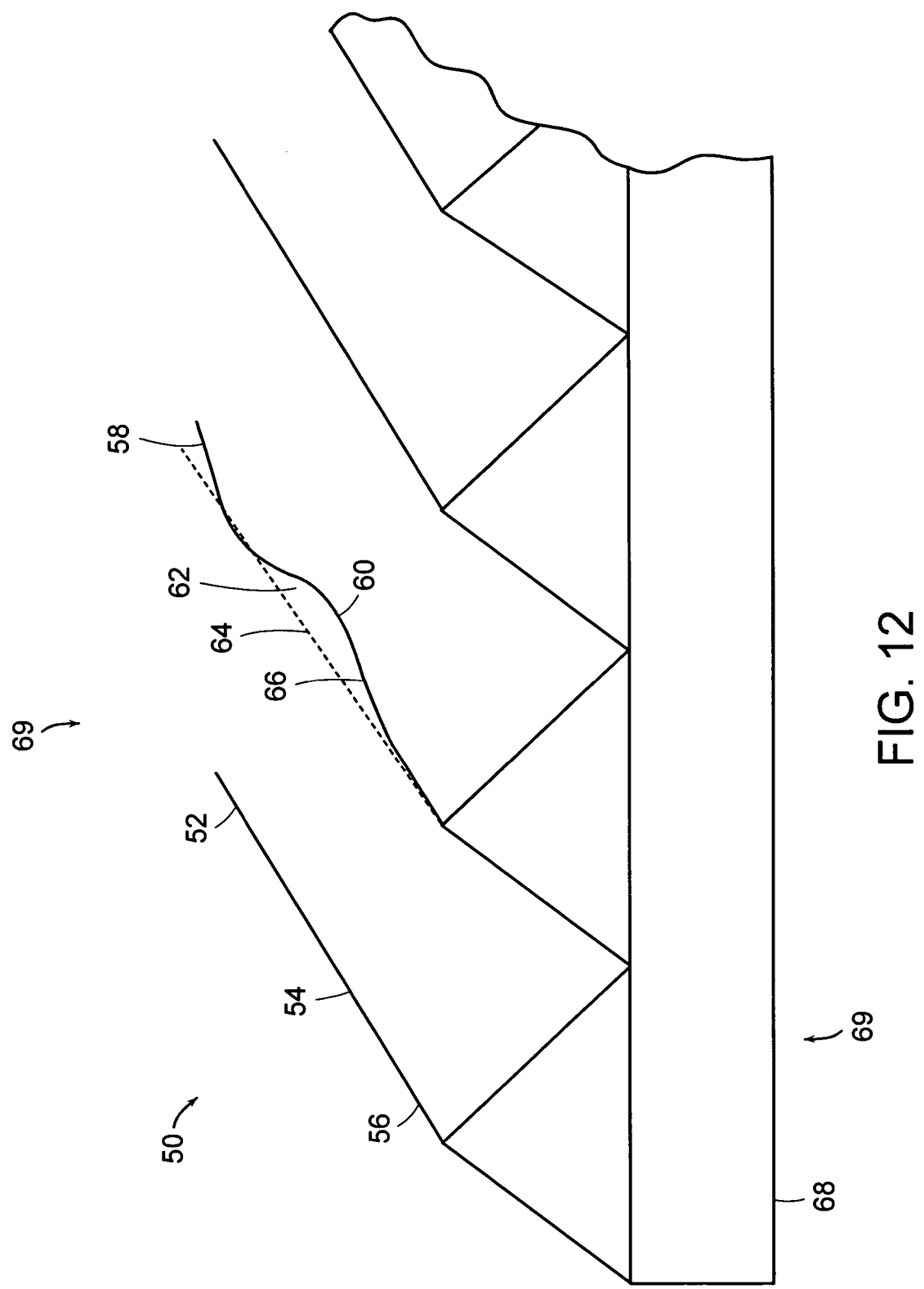
FIG. 12 is a perspective view of a differentially-cured light-redirecting film.

FIG. 12 shows a perspective view of a prism array 52 of a differentially-cured collimating film 50. Many of the prisms that are not blocked by a mask, such as prism 54, have a linear peak 56. Many of the prisms that are blocked, such as prism 58, are believed to have a curved peak 60 that can be reduced in height. The curved and reduced height peak is a result of curing through a mask, which reduces or increases the cure rate with respect to the surrounding areas. Typically, peak 60 is shaped compared to the normal apex of linear peak 56 of prism 58. The region 62 is shaped in respect to another region, which can result in a wider light distribution. The shaped center line 66 of the peak in this prism can be off center in respect to the normal center line 64 depending upon the curing mask used. This region 62 also can have a slightly different index of refraction in respect to other areas. The prisms can be formed on a base film 68, such as a polyester, polycarbonate, polyurethane, acrylic and polyvinyl chloride. In a particular embodiment, the mask can cover up to about fifty percent of the area of the product to be formed, such as a collimating film. The shape of the differential cure area can be essentially any configuration or size. This allows one to tailor the light/ distribution in specification areas of the sheet, such as to corners or edges, instead of the center of the sheet. Also, if a greater percentage of the area of the structure were blocked as compared to exposed to ultraviolet light, the exposed portion can result in raised portions or bumps. In structures where a lesser percentage of the area of the structure were blocked as compared to exposed to ultraviolet light, the structure can have an appearance with recesses. The valleys of the prisms do not appear to change the shape. If significant excess resin is present, the valley can change shape as a result of the added volume of resin being cured.

In alternative embodiments, one or both sides 69 of base film 68 can have a differentially-cured pattern formed therein. By providing a differentially-cured pattern on both sides of a film, the film is strengthened and is more rigid. For example, the film is more stable to temperature and humidity changes. In other embodiments, a thermoplastic polymeric layer is extruded and optical structures, such as micro optical structures, are applied to both sides of the layer to form a mechanically stable composite film.

The slight rounding of the tips or peaks 60 caused by the differentially-cured process causes the angles between an adjacent prism facets and the prism tips to be varied, thus reducing the wetting effect.

Figure 13:
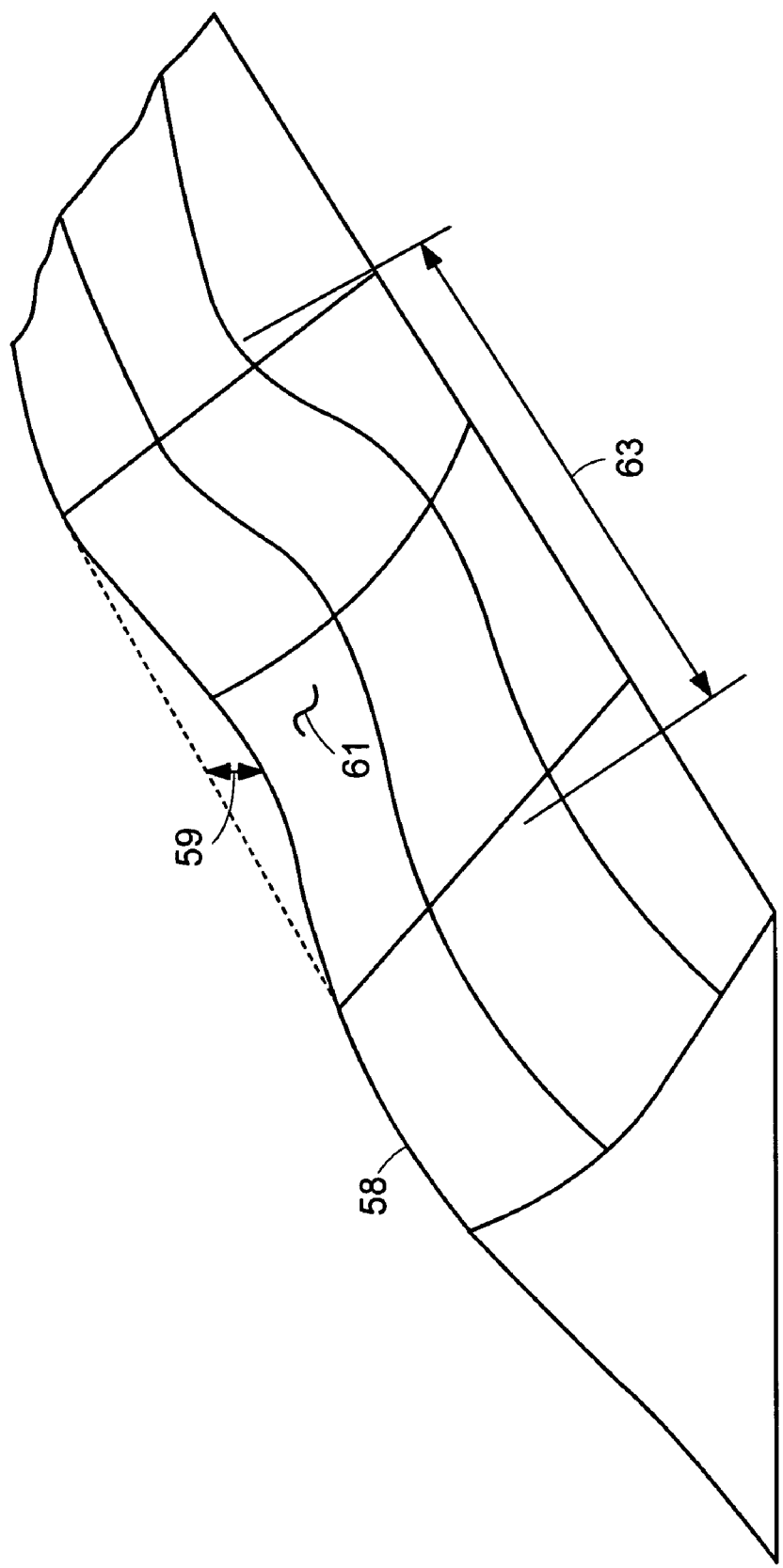
FIG. 13 is a perspective view of a differentially-cured linear prism.

FIG. 13 over-exaggerates a visible random shape surface that can be formed on prism 58 by the differentially-cured process. In this embodiment, about a 0.3 micrometer or one-half wavelength depth 59 structure 61 with a continuously varying, somewhat random slope causes the light ray path length as shown, for example, in FIGS. 8, 9, 10, and 11, to be random in length. In reality, there is a plurality of structures 61 on each prism 58. Therefore, the uniform phase changes that occur from a flat reflecting surface do not occur. Interference fringes do not occur and wet-out is not visible. Thus, the slight curvature of the structure 61 reduces Lloyd's mirror fringe effects. The structure 63 can have a random oscillation of about 250 micrometers.

In the area that was blocked, the prisms can have nanometer size striations caused by the differential cure shrinkage pattern. These striations can perform like a vertical linear moth-eye structure. Some striations can extend from the peak to valley. The striation can range in width of between about 250 and 770 nanometers, depending on the mask pattern. The striations can cause upward light tunneling.

Figure 14:
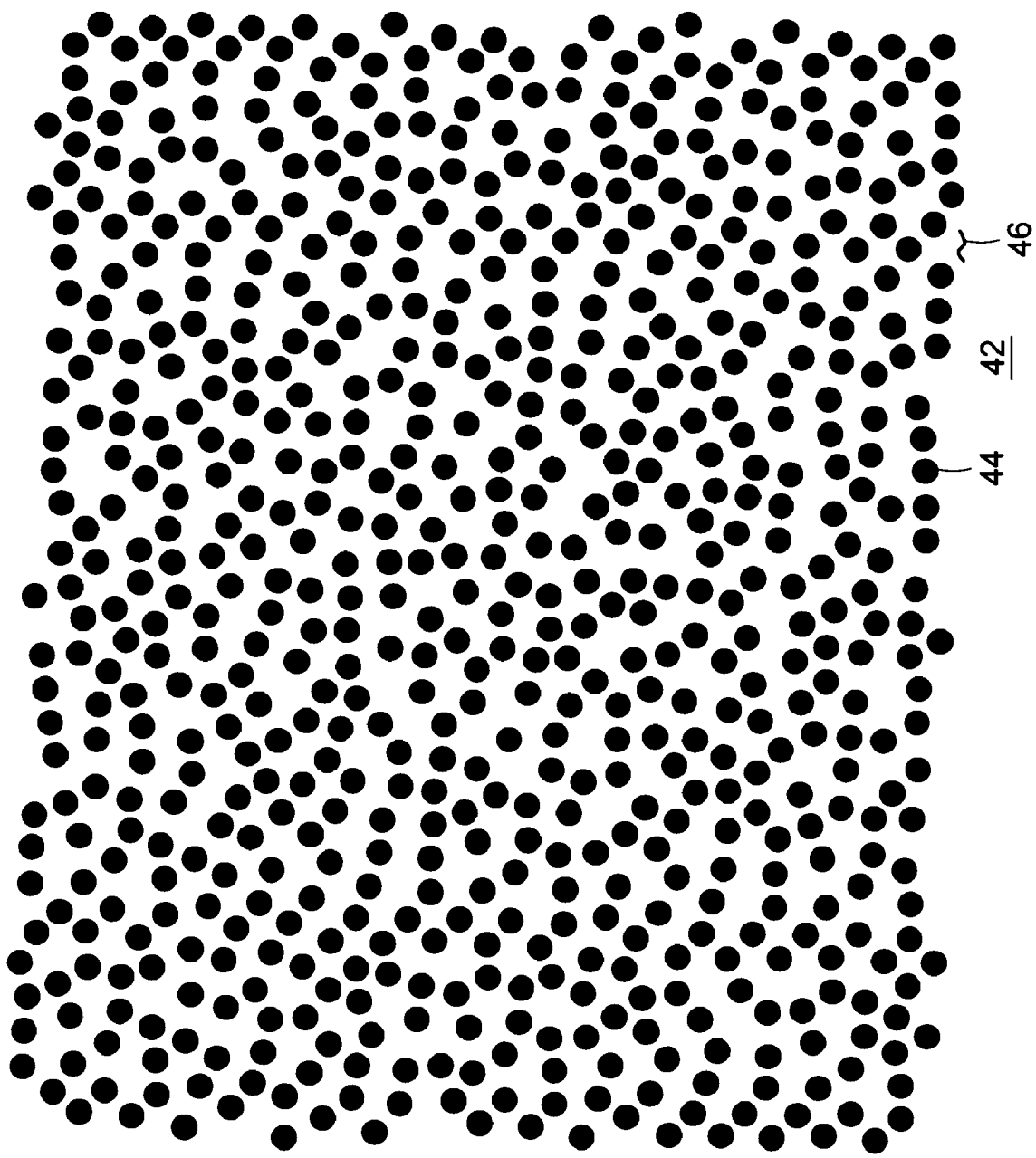
FIG. 14 illustrates a pattern used to form differentially-cured optical structures in accordance with an embodiment of the invention.

FIG. 14 is a mask pattern 42 used in a differentially-cured process in accordance with embodiments of the invention. A plurality of at least partially opaque or black dots or areas 44 is randomly positioned on a transparent layer 46. Opaque can be defined as capable of blocking more than about fifty percent of incoming light. The mask pattern 42 can be positioned over the peaks of linear prisms, in which case prism heights and prism facet surface variations occur where the black dots 44 are located and the height shift and facet surface variation are constant or the same for all masked areas or zones. Where there are no black dots 44, the prism height surface shape is constant. The mask pattern 42 can be used with any geometric structures including a smooth side of a film or sheet. In one embodiment, the opaque areas include alphanumerics or geometric patterns having line widths of about fifty to 500 micrometers. There are times when it is desirable to add control to the depth or height of the structure that a common random pattern differential cure process does not allow. Common random print patterns combine multiple dots or pixels to build half-tones and then the multiple dots act as one larger dot in the cure process, thereby adding a range of depths to the finished structure.

A process is provided that allows practitioners of the differential curing of optical products to control the shape of the resulting structures. Additionally, one may choose to build two, three, or more different heights and depths into a product while maintaining control of each in a stepwise fashion. The advantage gained is that the pattern is truly random in one dimension while the shape of the surface structure varies in a non-random, predictable fashion. One way in which this is accomplished is to make pattern mask prints in which the opaque pixels, for example, dots, hexagons, square, etc., have borders or "halos" around them.

Figure 15:
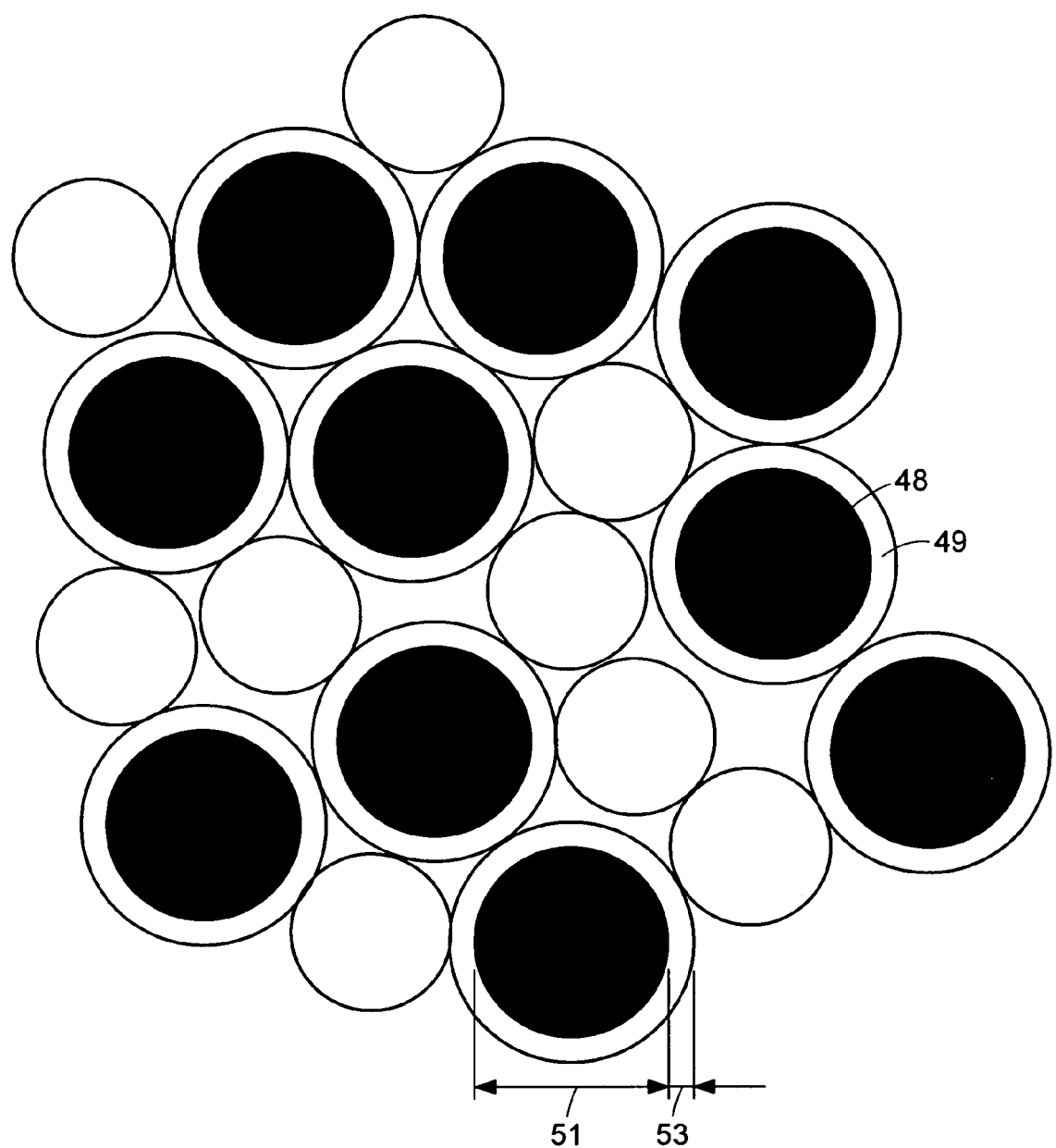
FIG. 15 illustrates an embodiment of a pattern used to form differentially-cured optical structures in accordance with an alternative embodiment of the invention.

As shown in FIG. 15, a halo 49 surrounds each opaque dot or pixel 48. This allows the pixels 48 to act as independent entities during the cure process so that the pixels 48 do not act as larger printed spots when the individual pixels 48 are adjacent to each other. The halo 49 needs to be large enough to allow sufficient radiation to cure the spaces between the pixels at a normal rate. In a particular embodiment, the opaque pixels 48 have a diameter 51 of about 152 micrometers (6 mils), and the halo 49 has a width 53 of about 76 micrometers (3 mils). These pixels 48 can be formed on one or both sides of an optical sheet or film and can be formed on a structured, for example, or non-structured surface.

In one method for forming the pattern illustrated in FIG. 15, a total coverage of the pattern by opaque pixels 48 is selected, for example, a coverage of 20 percent. Based on given pixel 48 and associated halo 49 diameters, the pixels 48 are randomly distributed throughout the pattern. In a specific embodiment, the pixels 48 are printed onto a transparent film that is then placed over a radiation-curable material during the curing process.

Many other types of prisms can be used including cube-corner prisms. Cube-corner or prismatic retroreflectors are described in U.S. Pat. No. 3,712,706, issued to Stamm on Jan. 23, 1973, the entire teachings of which are incorporated herein by reference. Generally, the prisms are made by forming a master negative die on a flat surface of a metal plate or other suitable material. To form the cube-corners, three series of parallel equidistance intersecting V-shaped grooves sixty degrees apart are inscribed in the flat plate. The die is then used to process the desired cube-corner array into a rigid flat plastic surface. Further details concerning the structures and operation of cube-corner microprisms can be found in U.S. Pat. No. 3,684,348, issued to Rowland on Aug. 15, 1972, the entire teachings of which are incorporated herein by reference. Also, the pattern transfer concept can include forming a structured coating onto a smooth surface and also forming a pattern structure onto a micro optical array of any type, including submicron to micron size surfaces. Further, a pattern can be placed on plano surfaces, prism surfaces, lens structures, and others. The pattern can be random, ordered, or designed to convey a message. In alternative embodiments, the cube-corner arrays can be oriented in two or more directions, as disclosed in U.S. Pat. No. 6,036,322, which issued on Mar. 14, 2000, and U.S. Pat. No. 6,457,835, which issued on Oct. 1, 2002. The entire teachings of these patents are incorporated herein by reference.

It has been discovered that a differentially-cured pattern formed on facets of the cube-corner prisms can improve the resulting light distribution, for example, by spreading out light to smooth out the diffraction patterns. Retroreflective sheeting that includes cube-corner prisms can be cut or formed into flakes, chips, or threads as disclosed in U.S. patent application Ser. No. 10/438,759, filed on May 15, 2003, the entire teachings of which are incorporated herein by reference. At least a portion of at least some of prism facets can include a differentially-cured surface to reduce or eliminate glint or glitter.

Figure 16:
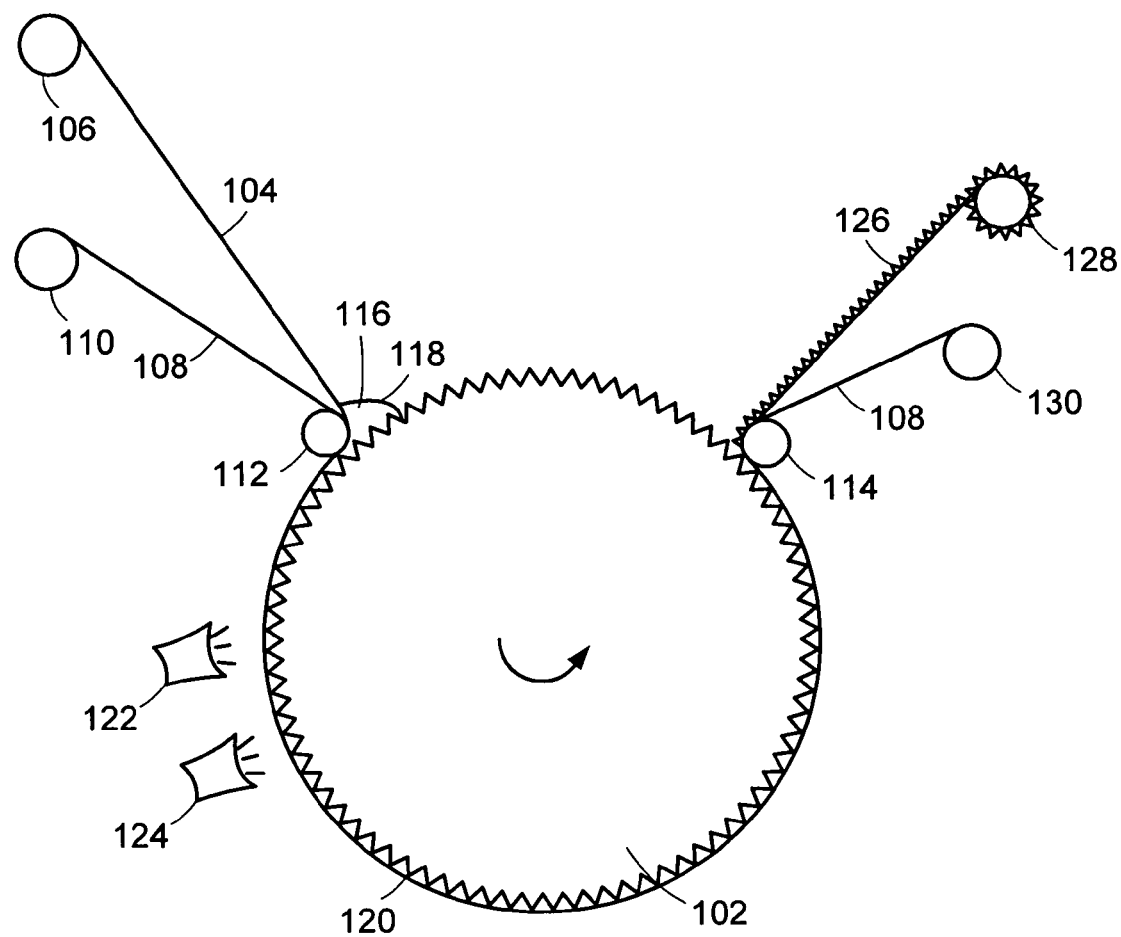
FIG. 16 is a schematic view of a method for forming the differentially-cured light-redirecting film.

Referring to FIG. 16, a method for forming the differentially-cured light-redirecting or collimating film will now be described in further detail. A mold 102 is ruled with linear grooves 120 essentially parallel to the axis about which the mold rotates. Although the linear grooves on the mold 102 are shown with their longitudinal axes oriented perpendicular to the paper, the grooves can be oriented in any direction. In a particular embodiment, the linear grooves 120 are ruled around the circumference of the mold 102. The linear grooves can be pitched between about 0.05 and 0.2 mm (0.002 and 0.008 inches). A base film 104 is unrolled from roll 106. The base film 104 can be a suitable material, such as a polyester. Mask film 108 is unrolled from second roll 110. Mask film can be formed of a suitable material, such as polyester, upon which a non-transparent design is printed on the transparent mask film. The non-transparent design can be printed on the mask film in the same manner as a design is printed on an overhead transparency. The base film 104 and mask film 108 are laminated together by first roller 112 against mold/roller 102. The base film 104 and mask film 108 are kept in close contact with mold 102 until second roller 114. In another embodiment, base film and mask film can be laminated together as a single sheet and then unrolled from a single roll.

In yet another embodiment, a removable pattern can be directly printed on a first side of the base film with a suitable light-blocking material, such as a water soluble ink or the like. A curable layer of light-curable material is placed on the second side of the base film, and the curable layer is differentially-cured in the presence of light directed through the pattern and base film to the curable layer. After differentially curing the layer, the removable pattern is removed from the base film. For example, it can be removed with a solvent, such as water for a water soluble ink. However, other solvents can be used, such as alcohol, hydrocarbons, etc., depending upon the ink or other material used to form the light-blocking pattern on the base film. An advantage of this embodiment is that a separate mask film is not needed.

In another embodiment, a pattern is directly printed onto a first side of a base film with a radiation or light-blocking pigmented or dyed ink that is colored or a clear ink that contains ultraviolet (UV) blocking chemicals, such as those sold by Ciba Geigy Corporation under the trade name of "Tinuvin". The pattern need not be removed after the curing step and it remains on the product. This negates the need for a separate masking film and can provide for an additional decorative or functional feature if the pattern remains on the product surface.

Prism monomer material 116 is placed at point 118 proximate to roller 112. The monomer material, such as an acrylic, flows into the grooves 120 of mold 102. The prism monomer material 116 is cured differentially by the partially blocked ultraviolet light as it passes ultraviolet lamps 122, 124 to form differentially-cured collimating film 126. Differentially-cured collimating or light-redirecting film 126 is wound up on wind-up roller 128. The mask film 108 is wound up on second wind-up roller 130.

In a collimating or light-redirecting film having portions that are differentially-cured, light is directed through the collimating film that results in different shades of lighting.

Lighter portions include the regions with ninety degree linear prisms. Regions with darker portions include the prisms that were differentially-cured by blocking by the mask. In these darker portions, the prisms are slightly distorted due to the different cure rate and appear darker because the light is spread over a broader range.

Figure 17:
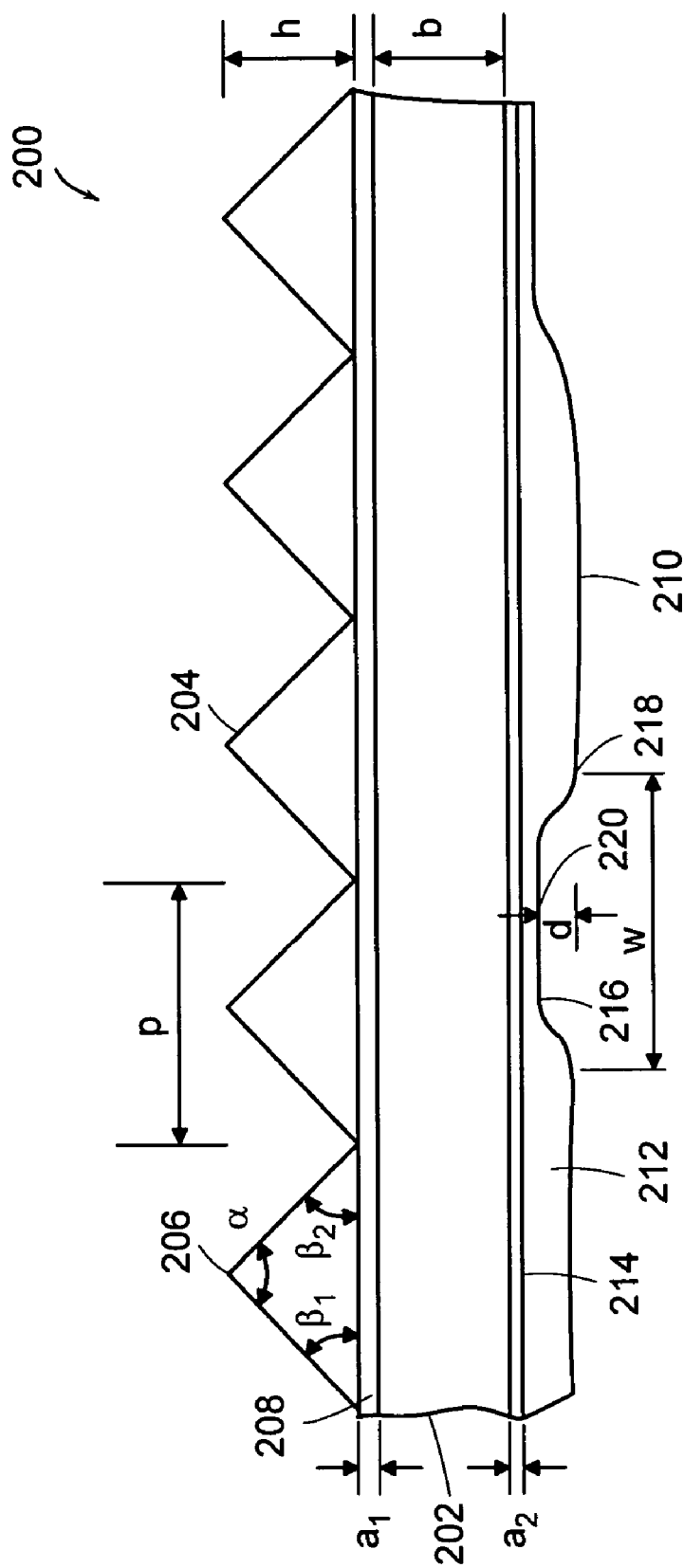
FIG. 17 is a cross-sectional view of another embodiment of a differentially-cured optical structure.
Figure 18:
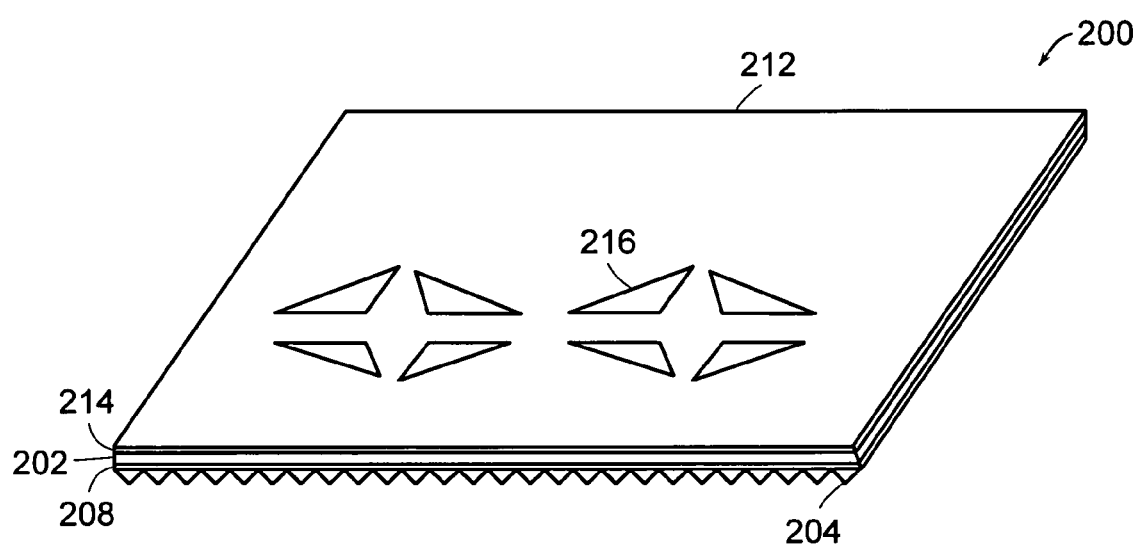
FIG. 18 is a perspective view of the embodiment illustrated in FIG. 17.

A light-redirecting film sheeting can be used for collimating or redirecting light in backlighting systems. The light-redirecting film sheeting 200, as shown in a cross-sectional side view in FIG. 17 and in a perspective view in FIG. 18, includes a base film 202 formed of a transparent polyester film, such as ICI Dupont 4000 PET, or polycarbonate, such as Rowland Technologies "Rowtec" film, having a thickness in the range of between about 50 and 250 micrometers (0.002 and 0.01 inches). In one embodiment, the sheeting can have a thickness in the range of between about 0.1 and 0.15 mm and (0.004 and 0.006 inches) and an index of refraction in the range of between about 1.49 and 1.59.

A series of transparent linear prisms 204 having sides 206 are formed over the base film 202. Sides 206 can be isosceles. The linear prisms 204 extend across the sheeting. The prisms are formed of a transparent resin, such as a mixture of polymerized CN104 polyacrylate available from Sartomer Chemical Co. and RDX51027 from UCB Chemical. The linear prisms are pitched a distance (p) in a range of between about 25 and 100 micrometers (0.001 and 0.004 inches), preferably about 48 micrometers (0.0019 inches) per prism. The linear prisms have a height (h) in a range of between about 20 and 100 micrometers (0.0008 and 0.004 inches), and in a particular embodiment about 25 micrometers (0.001 inches). The linear prisms have pointed peaks 206 with a peak angle ($\alpha$) as desired, with preferred values of 88 or 90 degrees in a sheeting. Base angles $\beta_1$ and $\beta_2$ can be the same or different. The linear prisms 204 can be attached to the base film 202 by an optional prism adhesive layer 208, such as 7650TC acrylic adhesive available from Bostik Chemical. Prism adhesive layer 208 has a thickness ($a_1$) in the range of between about 2.5 and 12 micrometers (0.0001 and 0.0005 inches).

On the non-prism side 210 of the base film 202, a pattern structure 212 is formed, such as with a resin composition similar to or the same as the prism side adhesive layer. The pattern structure 212 can be attached to the base film 202 by pattern adhesive layer 214, which is similar in material and thickness ($a_2$) to prism adhesive layer 208. Pattern structure 212 has a thickness in the range of between about 2.5 and 12 micrometers (0.0001 and 0.0005 inches). In alternative embodiments, the pattern structure 212 has a thickness in the range of between about 0.1 and 400 micrometers ($3.94 \times 10^{-6}$ and 0.016 inches). In a particular embodiment, the pattern structure 212 is formed on the base film 202 and cured through base film 202. The linear prisms 204 can then be formed to provide the film 200 shown in FIG. 17. In further embodiments, a mask can be provided on pattern structure 212 and a differentially-cured pattern can be formed in the prisms 204. The thin pattern structure 212 does not adversely affect the structure formed in the prisms 204. If the prisms 204 are first formed on film 202 and the pattern structure 212 is cured through the prisms 204, the structure 212 can be distorted because the path of radiation is changed by the prisms 204 as it travels therethrough. Additionally, it can be difficult to hold the mask on the prism tips.

Figure 19:
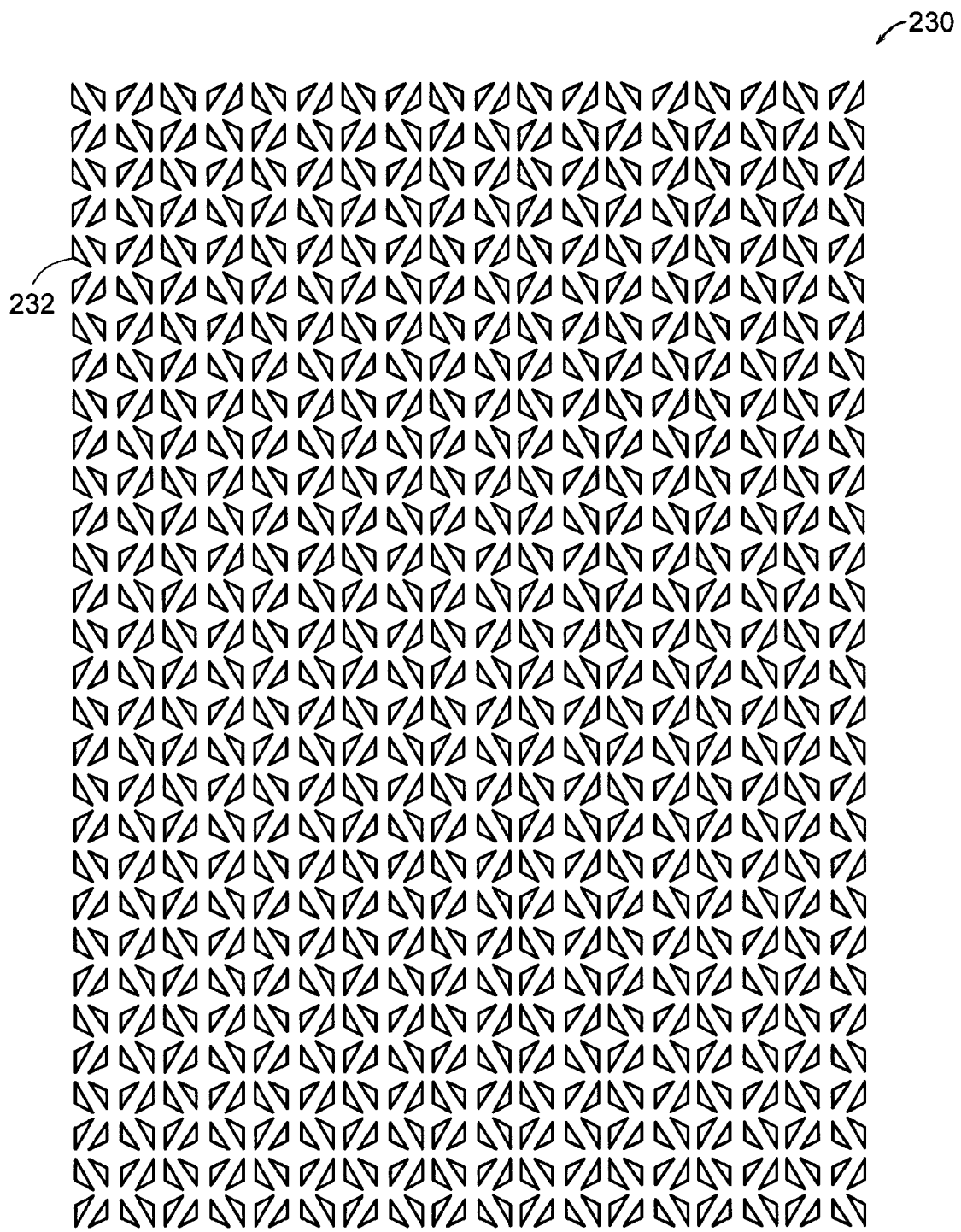
FIG. 19 is a perspective view of an embodiment of a logo pattern used to form a differentially-cured pattern.

As shown in FIG. 19, pattern structure 230 includes a logo 232, which is an arrangement of four obtuse scalene triangles. The logo can be a company name, a trademark, a figure, or other desired design. The pattern structure can be printed on sheeting such as a polyester overhead projector sheeting by a laser printer. In the shown embodiment, the logo is repeated in a line on a first axis about every 13 mm. The logos in each line are off-set in the next by a half of a logo and the lines repeat about every 7.5 mm along a second axis in the run/web direction, which is perpendicular to the first axis. The lines of the logo are about 0.5 mm in width. Other types of designs include cross hatching, geometric figures, numerals, letters, etc.

Returning to FIG. 18, the lines are depressions 216 or recesses in the surface of the non-prism side. Depressions 216 can have a depth (d) in the range of between about 0.3 and 2.0 micrometers, with an average depth of one micrometer. In alternative embodiments, the depth (d) can be in the range of between about 0.05 and 0.125 micrometers. The depressions are not uniform in slope from edges 218 to low point 220. The depressions can have an average slope of about 0.1 degrees to the surface of the base film 102 with the slope being as high as one degree.

The pattern structure is formed by placing a mask film temporarily on one side of the base film. The mask film has a logo, geometric form (lines, circles, curves, etc.), alphanumerics, or any other desired design formed thereon that can block a portion of the ultraviolet light as it passes from ultraviolet light source through the mask film to the base film. The portion of the mask film without the logo printed thereon is more transparent to ultraviolet light. On the other side of the base film, an adhesive layer is deposited and an uncured radiation-curable resin is placed on the adhesive layer. Ultraviolet light is directed from an ultraviolet light source through the mask layer through the base layer, through the adhesive layer, to the resin layer. The resin layer is differentially-cured because the ultraviolet light intensity is blocked unevenly by the printed patterned to the resin layer, resulting in the pattern structure. The pattern structure is uneven and segmented. The portions of the resin layer that have the greatest blockage from the ultraviolet light have the deepest depressions in the surface. The portions that were directly exposed to ultraviolet light, without blocking, resulted in segments with relatively flat surfaces. The mask film is then removed from the base film. The linear prisms are cast on the same side of the base film where the mask film had been placed. The linear prisms are cured by ultraviolet light directed through the base film. The linear prisms can be slightly differently cured in the portions that are exposed to the ultraviolet light that passes through the pattern structure that is uneven and segmented.

The film can be placed between a light guide and a display, such as a liquid crystal display. The fine pattern breaks up the pixel pattern in the display without as much light loss as with a diffuser sheet. The pattern structure on the film can be readily visible across the film.

The film can be used as a single sheet or as a two-sheet or more system. A two-sheet system has the peaks pointed in the same direction, and the length of the peaks on each sheet are often crossed at ninety degrees.

The differentially-cured process of the present invention can be used to form security coatings, for example, coatings on document or currency papers, fibers, threads, films, identification cards, or wrapping film for expensive products.

Figure 20:
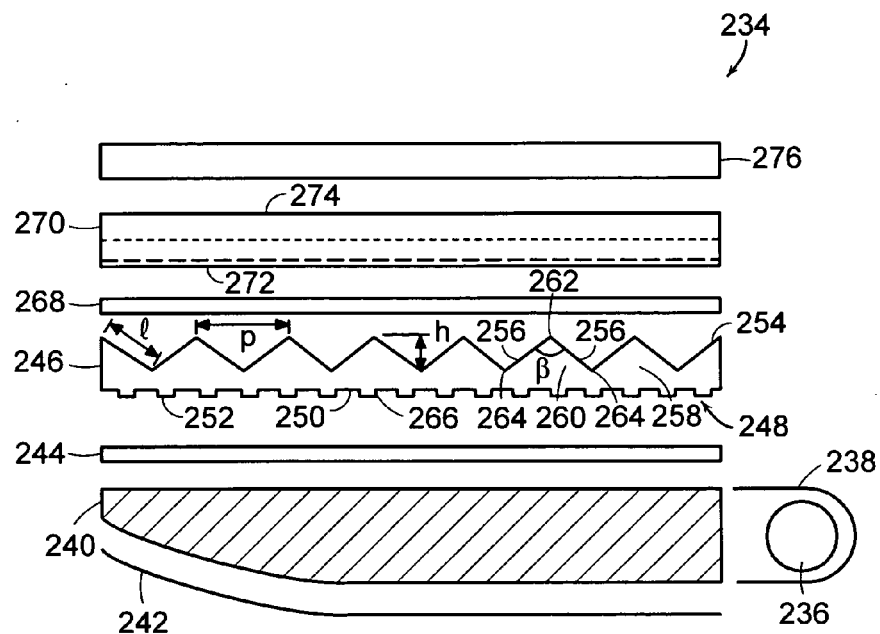
FIG. 20 is a cross-sectional view of a backlighting system in accordance with an embodiment of the present invention.

FIG. 20 illustrates an optical system in which sheets or films having differentially-cured structures can be implemented. In this embodiment, a back lighting system 234 includes a light source 236 and light reflector 238. Light source 236 can be a fluorescent light, incandescent light, or other suitable light source. Waveguide 240, which is for directing light out of a back lighting system, can be formed of a transparent solid material and is often wedge-shaped. On one side of waveguide 240 is waveguide reflector 242 formed of a specular material, such as aluminum or a coated white surface, for reflecting light back to waveguide 240. Waveguide reflector 242 can be curved or flat. Diffuser 244 is a film that diffuses the light from the waveguide into a substantially uniform distribution. An example of a suitable diffuser is a randomly textured surface or gradient index film or engineered diffractive structure.

Above diffuser 244, first light-redirecting or collimating film 246 can have a grooved structure 248 on a first side adjacent waveguide 240 as disclosed in U.S. patent application Ser. No. 10/046,929, filed on Jan. 15, 2002, published as U.S. Patent Application Publication 2003/0133301 on Jul. 17, 2003, the entire teachings of which are incorporated herein by reference. Grooved structure 248 can have a series of base planes 250 and plateaus 252 that run along a first axis from one side of collimating film 246 to a second side of collimating film 246 to provide an unsmooth surface opposite the prism surface 254. Linear prism surface 254 can have prism surfaces 256 and windows 258 and be formed of a transparent polymeric material. Prisms 260 have sides 256 with peaks 262 and valleys 264. The pitch (p) of the prisms 260 is measured from valley 264 to next valley 264. In one embodiment, the pitch can be in the range of between 25 and 76 micrometers (0.001 and 0.003 inches). The height (h) of the linear prisms 260 is measured by the vertical distance from the valley 264 to peak 262. The height (h) can be in the range of between 7.6 and 38 micrometers (0.0003 and 0.0015 inches). Included angle ($\beta$) is measured between the two sides 256 that meet at peak 262. The angle ($\beta$) can range from about sixty to 120 degrees. In one embodiment, the angle ($\beta$) is in a range of between about sixty and eighty-five degrees or between about 95 and 120 degrees. Sides 256 on each side of peak 262 can be side length (l) from valley 264 to peak 262 to form an isosceles triangle. Alternatively, the sides can have different lengths, such as with a scalene triangle, thereby tilting or canting the prisms.

Base planes 250 and plateaus 252 are connected by walls 266, which are substantially perpendicular to base planes 250 and plateaus 252. Walls 266 can be a few degrees off perpendicular to either base planes 250 and plateaus 252. Also, the walls 266 can be curved. Base planes 250 and plateaus 252 are of such sizes to reduce the visibility of Newton's rings and moiré fringes while minimizing surface-to-surface contact with films or the peaks of prisms, thereby reducing wet-out. The width of base plane 250 can be in the range of between about one and about 300 micrometers. In another embodiment, the width of base plane 250 can be in the range of between about ten and about 200 micrometers. In particular embodiments, the width of plateaus 252 can be in the range of between about one and fifty micrometers. In another embodiment, the width of plateaus 252 can be between about ten and about 50 micrometers. The ratio of the width of plateau 242 to the width of base planes 250 can be in the range of between about one and about ten. In one embodiment, base planes have a width of about 150 micrometers (0.006 inches) and plateaus have a width of about 25 micrometers (0.001 inches). In another embodiment, base planes 250 have a width of about 185 micrometers (0.0073 inches) and plateaus 252 have a width of about 33 micrometers (0.0013 inches). Walls 266 can have a height in the range of between about 0.4 and about 0.8 micrometers, which provides a difference in elevation between base planes 250 and plateaus 252 from a base point in the film. In one embodiment, the height of walls 266 is in the range of between about 0.5 and 0.8 micrometers. The difference in elevation between the base plane and plateaus can be less than about the wavelength of visible light. The dimensions of the width of the plateaus can each be less than about 3.175 micrometers ($1.25 \times 10^{-4}$ inches).

An optional abrasion reduction layer 268 can be positioned between first collimating film 246 and second collimating film 270. Abrasion reduction layer 268 can have a grooved structure on one or two surfaces to improve performance by reducing wetting or Newton's rings. In alternative embodiments, a diffusing layer can be positioned above first collimating film 246 in combination with or without the abrasion reduction layer 268.

Second light-redirecting or collimating film 270 can include second grooved structure 272 on a first side adjacent first collimating film 246 and prism structure 274 on an opposing side. Prism structure 274 of second collimating film 270 can be oriented in the same direction as the prisms on first collimating film 246. Alternatively, it may be offset by rotating the prism orientation up to about 180 degrees. In one embodiment, second collimating film 270 is rotated about ninety degrees with respect to the first collimating film to reduce moiré fringe formation and improve the uniformity of the exiting light distribution. Also, the peaks 262 cross the grooved structure 272 with minimal contact to reduce wet-out between films.

Above second collimating film 270 is liquid crystal display 276. A diffusing layer can be positioned above the second collimating film 270. A collimating film that has linear prisms designed with a tilt, size, and included angle that match the light source, waveguide, and diffuser properties provides enhanced performance. The advantages of employing linear prisms with included angles that range from ninety-five degrees to 120 degrees provide a light distribution that can be optimized for viewing angles of a computer screen. The included angle is considered the top angle of a triangular linear prism structure.

Figure 21:
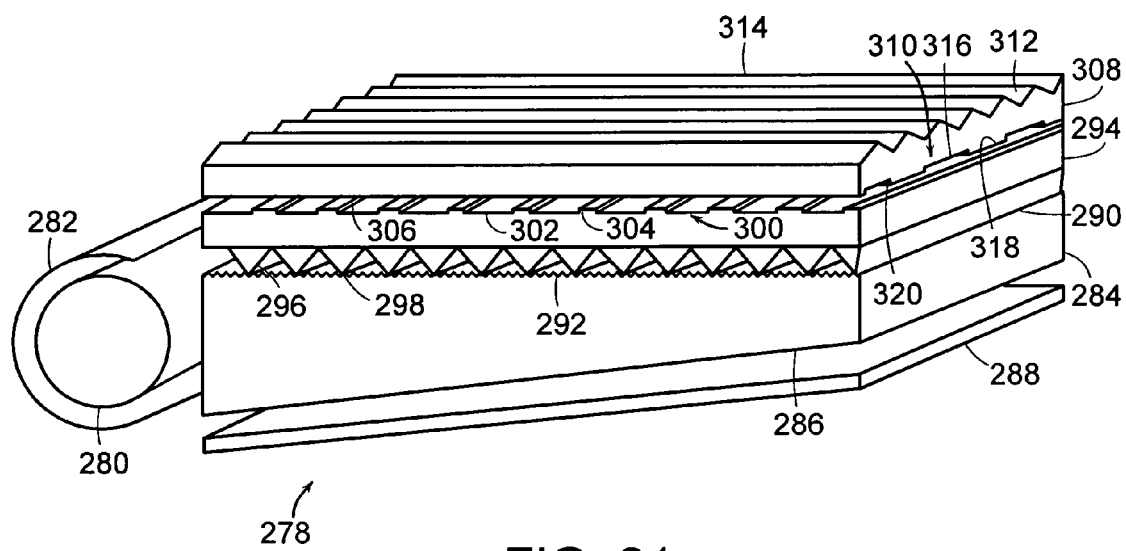
FIG. 21 is a perspective view of a backlighting system in accordance with an alternative embodiment of the present invention.

Another embodiment in which embodiments of optical films of the present invention can be used is shown in FIG. 21. A back lighting system 278 includes a light source 280 and a light reflector 282. Waveguide 284 can be formed of a transparent solid material and can be wedge-shaped and be formed from a thermoset or thermoplastic material.

Adjacent to the first side 286 of waveguide 284 is waveguide reflector 288 formed of a specular reflecting material. The reflector 288 can be spaced slightly away from surface 286 to allow total internal reflection at surface 286 to take place. Alternatively, the reflector 288 can have a grooved structure on the side facing waveguide 284. The grooved structure of the reflector can be coated with a specular reflecting material. Alternatively, if the reflector 288 is transparent, the reflector can be coated on the side away from waveguide 284. First side 286 can be stepped in shape. Second side 290 of waveguide 284 is on the opposite side away from waveguide reflector 288 and can have grooved structures 292. In other embodiments, a moth-eye structured layer can be superimposed on a differentially-cured structure on an undulating surface on the second side 290, as illustrated, for example, in FIG. 24.

Above waveguide 284, first light-redirecting or collimating film 294 has first prism structure 296 with peaks 298 pointed toward waveguide 284. In alternative embodiments, a diffusing layer is positioned above waveguide 284. First collimating film 294 can include first grooved structures 300 on the window side of first prism structure 296. The peaks of linear prisms on first collimating film 294 can run parallel to light source 280. First grooved structure 300 has base planes 302 and plateaus 304 that are parallel with peaks 298 to provide a non-smooth structured surface. Base planes 302 and plateaus 304 are connected by walls 306. Walls 306 can be substantially perpendicular to base planes 302 and plateaus 304, which includes walls 306 that can be a few degrees off perpendicular to either base planes and plateaus. Also, the walls can be curved. Base planes 302 and plateaus 304 are substantially parallel but not coplanar.

Above first collimating film 294, second light-redirecting or collimating film 308 can include second grooved structure 310 and second prism structure 312. Peaks 313 of second prism structure 312 point away from waveguide 284. Second grooved structure 310 has base planes 316 and plateaus 318 that are in parallel with peaks 314 to provide a non-smooth structured surface. Base planes 316 and plateaus 318 are connected by walls 320 and are substantially parallel but not coplanar in a particular embodiment. The peaks 314 of second prism structure 312 can be oriented in a non-parallel direction to peaks 298 of first prism structure 296. Another orientation is ninety degrees. A diffusing layer can be positioned above second collimating film 308. In alternative embodiments, the moth-eye structures can be provided on any of the prism structures, for example, on prism structure 296.

Differentially-cured structures or patterns and/or moth-eye structures can be provided on one or both sides of any of the elements or layers of any of the embodiments disclosed herein, including the embodiments of FIGS. 20 and 21 to reduce undesirable optical conditions, such as wet-out. For example, the linear prisms of collimating films 246, 270, 294, and/or 308 can include random and/or uniform differentially-cured patterns to minimize and eliminate wet-out between adjacent structures. Also, grooved structures 248, 272, 300, and/or 310 can include differentially-cured patterns for the same reason.

Figure 22:
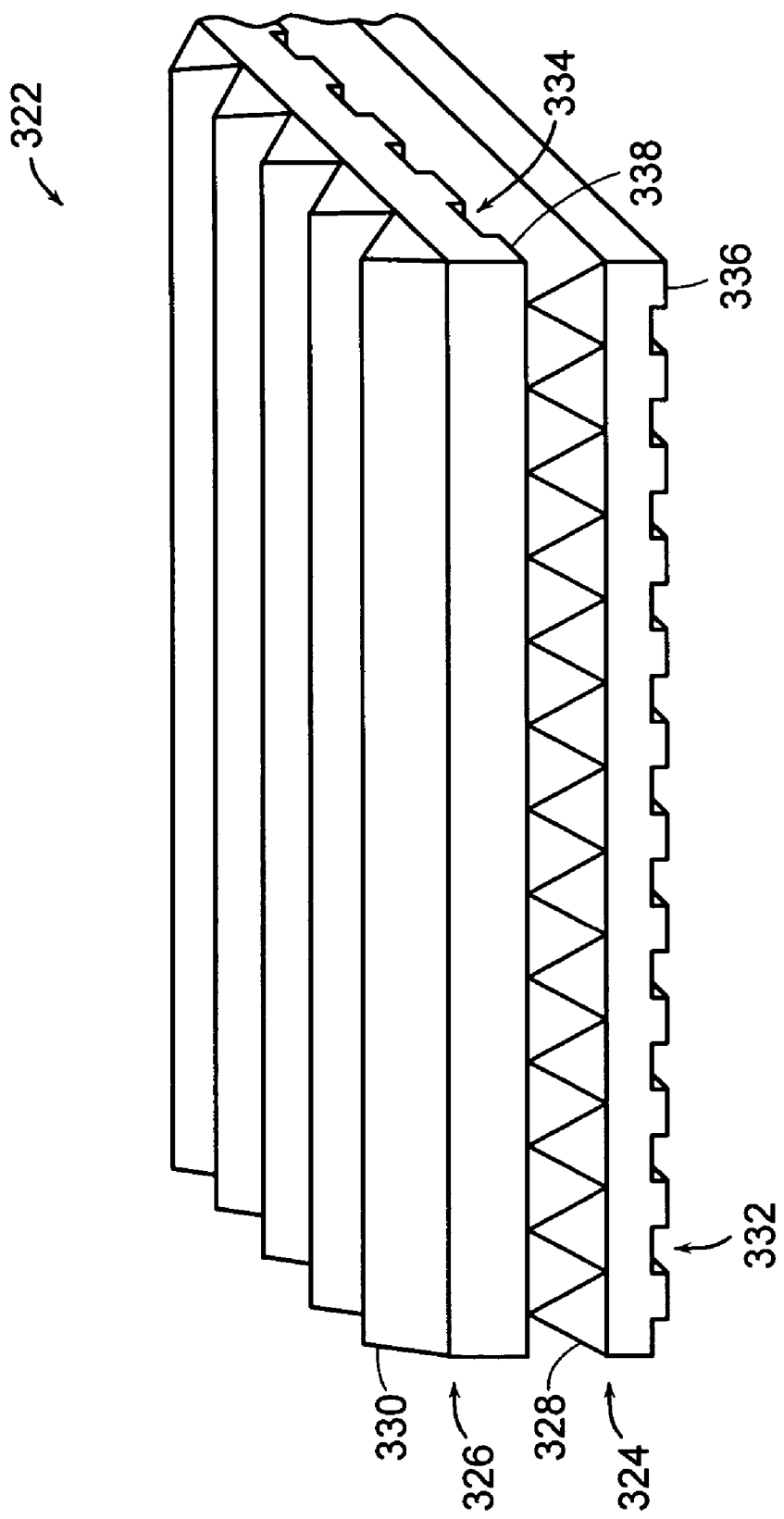
FIG. 22 is a perspective view of two films in accordance with alternative embodiments of the present invention.

FIG. 22 is a perspective view of an optical structure 322 that includes a first film 324 and a second film 326. In this embodiment, each film 324, 326 includes a series of linear prisms 328, 330, which can be used to redirect or collimate light. Films 324, 326 can also include grooved structures 332, 334 to reduce visible optical defects. Additionally, differentially-cured patterns and/or moth-eye structures can be formed on one or both sides of each film 324, 326 to further improve optical properties of the optical structure 322. In a particular embodiment, a random differentially-cured pattern is formed on linear prisms 328, 330 and a regular or uniform differentially-cured, for example, pattern 230, is formed on grooved structures 332, 334. In alternative embodiments, the grooved structures 332, 334 are not present, i.e., the sides 336, 338 are substantially planar and a regular differentially-cured pattern is formed thereon. In further embodiments, the uniform differentially-cured patterns on side 338 and the random differentially-cured pattern on prisms 328 are matched such that the combination of the patterns provides an air gap of at least about 0.5 micrometers to prevent wet-out, avoid moiré problems, reduce scratch resistance, and avoid Newton's rings. The depth of the differentially-cured patterns can be adjusted to avoid visibilities of the patterns, which can sometimes be a problem to the backlight manufacturers.

Having the differentially-cured patterns on both sides of a film, for example, film 324 or film 326, improves the thermal, mechanical, and moisture stability of the film. The differentially-cured pattern feature size, depth, and spacing on either the prism side or the opposing side can be matched to specific diffusers that can be used adjacent to the prism side or the non-prism side, depending on the application.

If a moth-eye structured surface is provided on side 338 with or without grooved structure 334, random differentially-cured patterns formed on linear prisms 328 prevent wet-out to the moth-eye surface. The moth-eye structured surface on side 338 can be formed with differentially-cured patterns superimposed in the moth-eye resin layer (see Example 1 below).

In alternative embodiments, microstructures that can include a regular and/or random pattern can be formed on either side of films 324, 326. For example, a drum can be faced and a negative image of the desired pattern can be formed in the drum. The drum can then be used to cast microstructures on the film.

The linear prisms in any of the embodiments of the present application can include three or more planar surfaces or facets (not including the base or window side) as disclosed in U.S. patent application Ser. No. 10/023,204, filed on Dec. 13, 2001, published as U.S. Patent Application Publication 2002/0097496 on Jul. 25, 2002, the entire teachings of which are incorporated herein by reference.

If a non-prism side of a film, for example, side 336 with or without grooved structure 332, is positioned adjacent to other structures that are smooth, Newton's rings or fringes may appear. A regular or random differentially-cured pattern can be provided on either or both contacting surfaces to provide at least a 0.3 micrometer structure to prevent Newton fringes.

Figure 23:
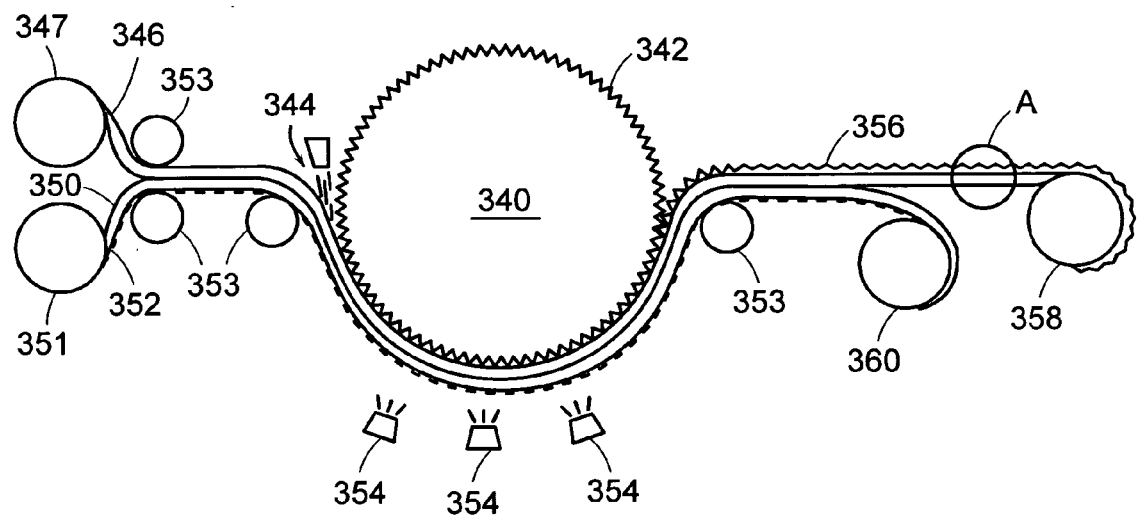
FIG. 23 is a schematic view of a method for forming a microstructured layer on a non-smooth layer.

In other embodiments, a microstructured surface, such as a moth-eye structure, can be provided on a non-smooth or undulating surface to provide an anti-glare, anti-reflection surface and for purposes, such as prevention or minimization of wet-out. A particular method of manufacturing an undulating structure is illustrated in FIG. 23 in which a casting drum 340 includes moth-eye tooling 342 on an outer surface thereof. Although the linear grooves of the moth-eye structure are shown with their longitudinal axes oriented perpendicular to the paper, the grooves can be oriented in any direction. In a particular embodiment, the linear grooves of the moth-eye structure are ruled around the circumference of the drum 340.

Figure 24:
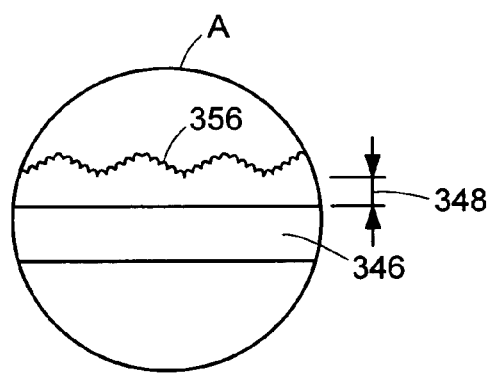
FIG. 24 is an enlarged view of area A of FIG. 23.

A resin 344, such as an ultraviolet-curable resin, can be flowed between the tooling 342 and a substrate film 346 dispensed from a roll 347. An excess layer of resin 348 can be provided on film 346 as illustrated in FIG. 24, for example, by a fixed gap provided between the film 346 and tooling 342. In other embodiments, the running speed of the film 346 and viscosity of the resin 344 can be used to control the excess resin 348 thickness. In particular embodiments, the layer 348 has a thickness between about 0.0127 and 0.127 mm (0.0005 and 0.005 inches).

A film 350, such as a transparent, flexible thermoplastic film, can include a mask 352 or pattern layer dispensed from roll 351. The film 350 can be laminated against the substrate film 346 as illustrated. Rollers 353 can be used to guide films 346, 350 and mask 352 in this manufacturing setup. As the mask 352 passes by one or more curing lamps 354, a differential shrinkage occurs in the excess resin layer 348. The moth-eye structure 356 is small and cures first and retains fidelity and is superimposed on the differentially-cured areas of excess resin 348 that can be formed in a non-smooth or wavy pattern that is determined by the pattern of the mask 352. Moth-eye structure 356 and film 346 can be wound up on take-up roll 358 and film 350 and mask 352 can be wound up on take-up roll 360.

Optical structures and inventive concepts are disclosed in commonly owned U.S. patent application Ser. No. 60/467,494, filed on May 2, 2003, the entire teachings of which are incorporated herein by reference. The optical structures and concepts can be used with the inventive principles disclosed herein.

EXAMPLE 1

A polycarbonate substrate was covered with a number 30LC mask film (manufactured by Ivex Packaging Corporation) that had a blue colored "PEEL" pattern printed on it. Moth-eye structures were cast on the opposite side of the substrate and cured by ultraviolet radiation at a web speed of about twelve meters per minute (forty feet per minute) past two 157–236 watts/lineal centimeter (400–600 Watts/lineal inch) ultraviolet lamps manufactured by Eye Ultraviolet Corporation. After removing the mask film, the cured moth-eye structures retained the "PEEL" pattern that could not be readily seen at a zero degree viewing angle but were pronounced at about a fifteen degree viewing angle.

EXAMPLE 2

Alphanumeric images were handwritten onto the surface of a mask film on a cling mask sample of polycarbonate film manufactured by Rowland Technologies Incorporated. Commonly available felt tip marker pens were used to form the images. An ultraviolet curable coating of epoxy acrylate was applied to the other side of the polycarbonate film and cured under a 236 Watts per lineal centimeter (600 Watts per lineal inch) lamp at about 4.6 meters per minute (fifteen feet per minute). The mask film was removed and the cured coating was visually examined at various angles. The images that had been on the mask film were visible at shallow viewing angles in the cured coating.

EXAMPLE 3

Figure 25:
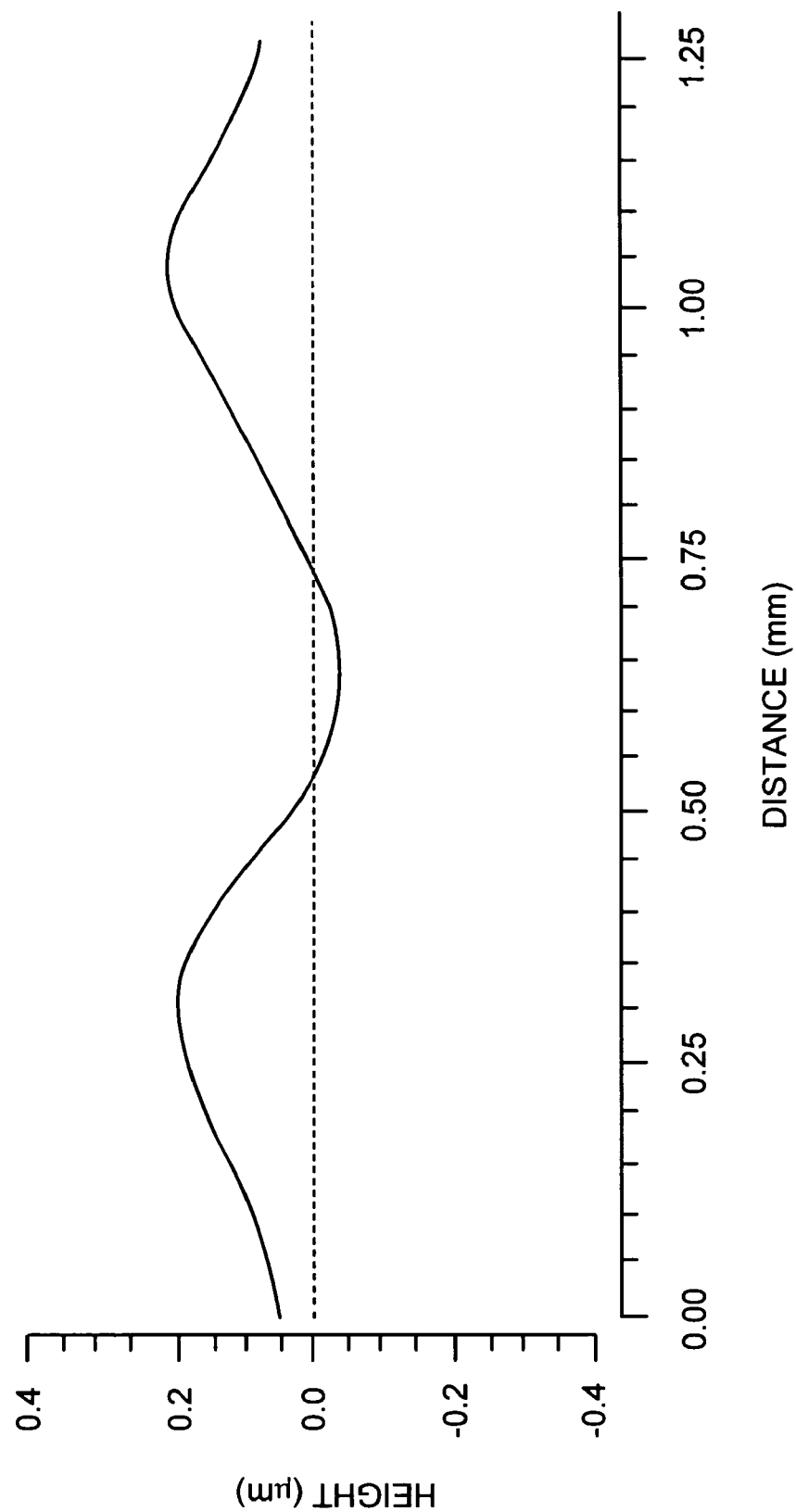
FIG. 25 shows a plot of a surface profile with an interference microscope trace that was made across the surface of a film made with the pattern transfer process.

FIG. 25 shows a plot of a surface profile with an interference microscope trace that was made across the surface of a film made with the pattern transfer process.

The height of the features is slightly less than one wavelength of red light. Red light wavelength is 632.8 nm ($2.49 \times 10^{-5}$ inches). The height of the features is approximately 500 to 900 nm ($1.9685 \times 10^{-5}$ to $3.5433 \times 10^{-5}$ inches). The average height is about 640 nm ($2.5197 \times 10^{-5}$ inches).

The height and slope of the features caused some light deviation as the light passes through the film. However, the effect on LCD back light brightness appears to be positive by about a one percent gain. Additionally, these features can act as resting points for the prism peaks of collimating films as the films are stacked upon each other and therefore prevent the majority of the prism peaks from being damaged by abrasion.

Figure 26:
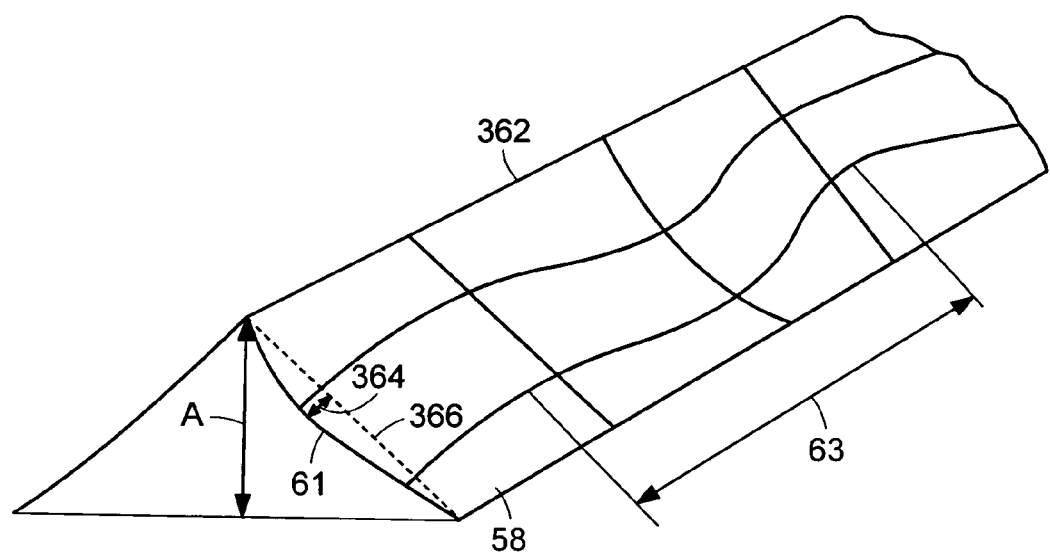
FIG. 26 is a perspective view of a differentially-cured linear prism in accordance with another embodiment of the present invention.

FIG. 26 is similar to the embodiment of FIG. 13 and illustrates a visible random shaped surface that can be formed on prism 58 by a differentially-cured process. In this embodiment, the amplitude A of the prism 58 is about 0.3 micrometers and the differentially-cured structure 63 can have a random oscillation of about 250 micrometers. In this embodiment, the sides 61 of the linear prism 58 are curved as shown while the peak 362 is substantially linear. The edges 61 of the prism 58 extend a distance 364 of about 0.3 micrometers from an imaginary line 366 that represents a flat side of the prism 58.

Figure 27:
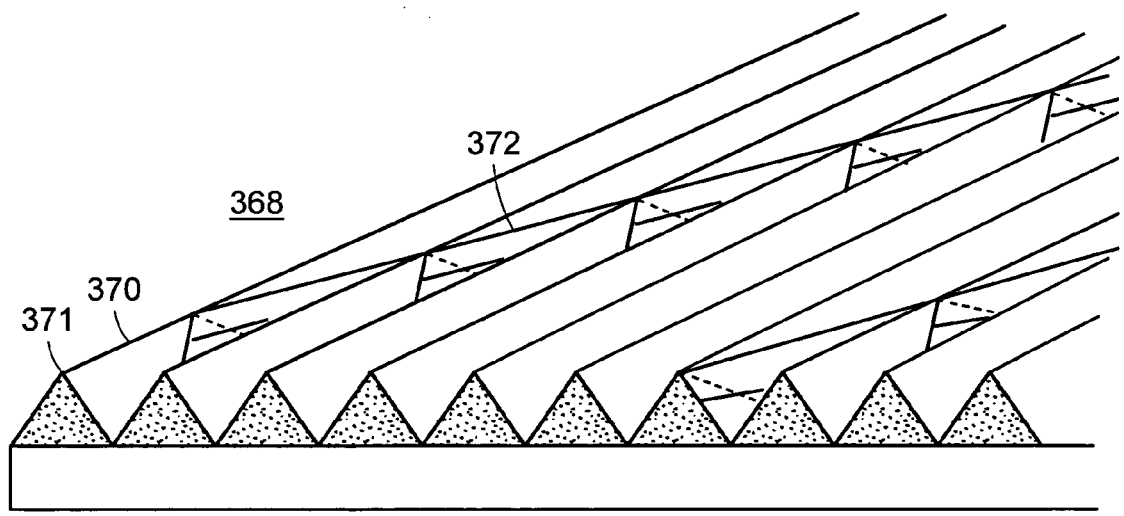
FIG. 27 is a partial perspective view of a light-redirecting optical structure in accordance with an embodiment of the present invention.

FIG. 27 is a partial perspective view of a light-redirecting optical structure 368 that includes linear prisms 370 and "cross-cut" prisms or reverse threads 372. In a particular embodiment, the prisms 370 have an included angle at the apex 371 of about 90 degrees. The cross-cut prisms 372 help smooth out the optical output when used as light piping. If one set of prisms 370, 372 is taller than the other, wet-out can be reduced with respect to adjacent optical structures. In a particular embodiment, a drum can be ruled with a first set of grooves which will form linear prisms 370. The drum can then be ruled at a wider pitch which will form the cross-cut prisms 372.

Figure 28:
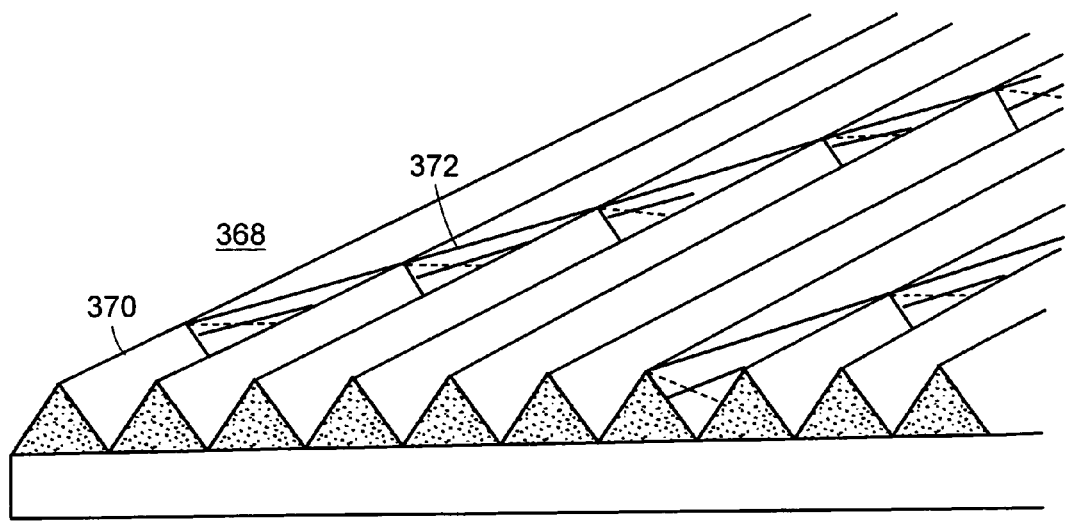
FIG. 28 is a partial perspective view of a light-redirecting optical structure in accordance with another embodiment of the present invention.

FIG. 28 is similar to FIG. 27 but the included angle of the cross-cut prisms 372 is varied to optimize optical performance. If the included angle of the cross-cut prisms 372 is greater or less than 90 degrees, more light is allowed to escape, i.e., less light is reflected toward the light source.

Figure 29:
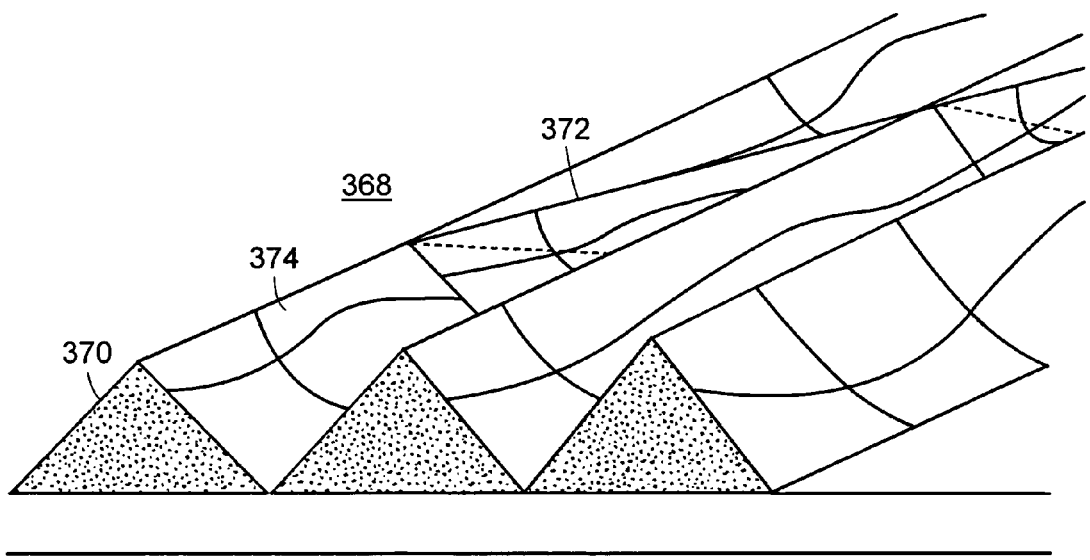
FIG. 29 is a partial perspective view of a light-redirecting optical structure in accordance with a further embodiment of the present invention.

FIG. 29 is a partial perspective view of a light-redirecting optical structure 368 that includes linear prisms 370, cross-cut prisms 372, and differentially-cured patterns 374 formed in the prisms 370, 372. The differentially-cured patterns 374 can be used to reduce wet-out and smooth out light that is collimated.

Figure 30:
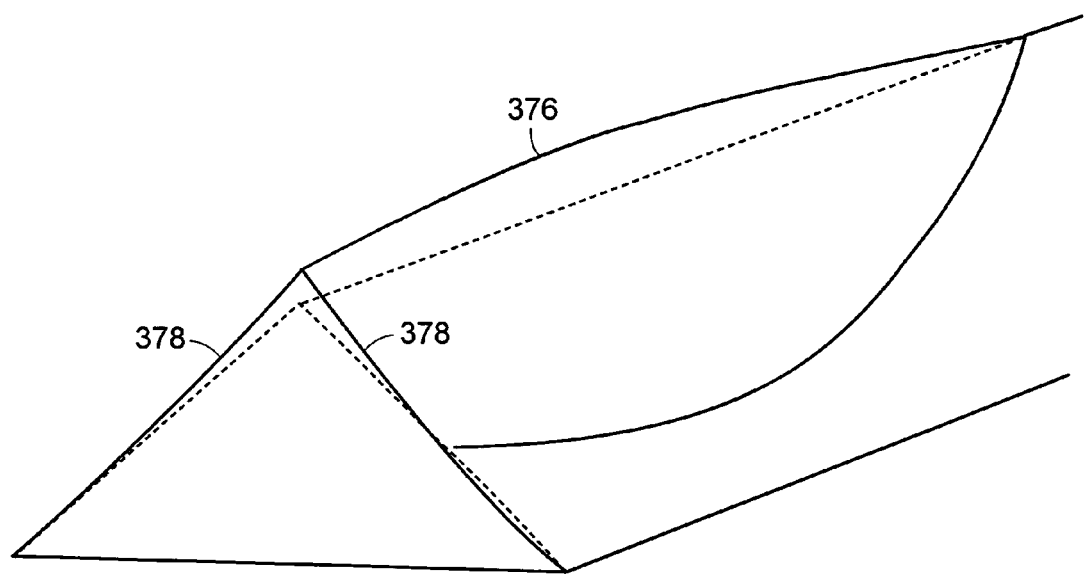
FIG. 30 is a perspective view of an elevated portion in accordance with an embodiment of the present invention.

FIG. 30 illustrates an elevated portion 376, which can also be referred to as a bump, feature, pip, or differential height locator, provided on at least some of the peaks of the prisms 370, cross-cut prisms 372, or both. Elevated portions are disclosed in U.S. patent application Ser. No. 10/830,701, filed on Apr. 23, 2004, the entire teachings of which are incorporated herein by reference. A plurality of elevated portions 376 can be used to beneficially space the prisms 370, 372 away from adjacent optical sheets, surfaces, films, substrates, or other layers to minimize wet-out, Newton's rings, abrasions, moiré fringes, or other undesirable optical conditions. The slight curvature created in the prism sides 378 reduces Lloyd's mirror fringe effects. In a particular embodiment, the elevated portions 376 are randomly located on the prism peaks. In another embodiment, the elevated portions 376 are located on the peaks in a predetermined pattern.

Figure 31:
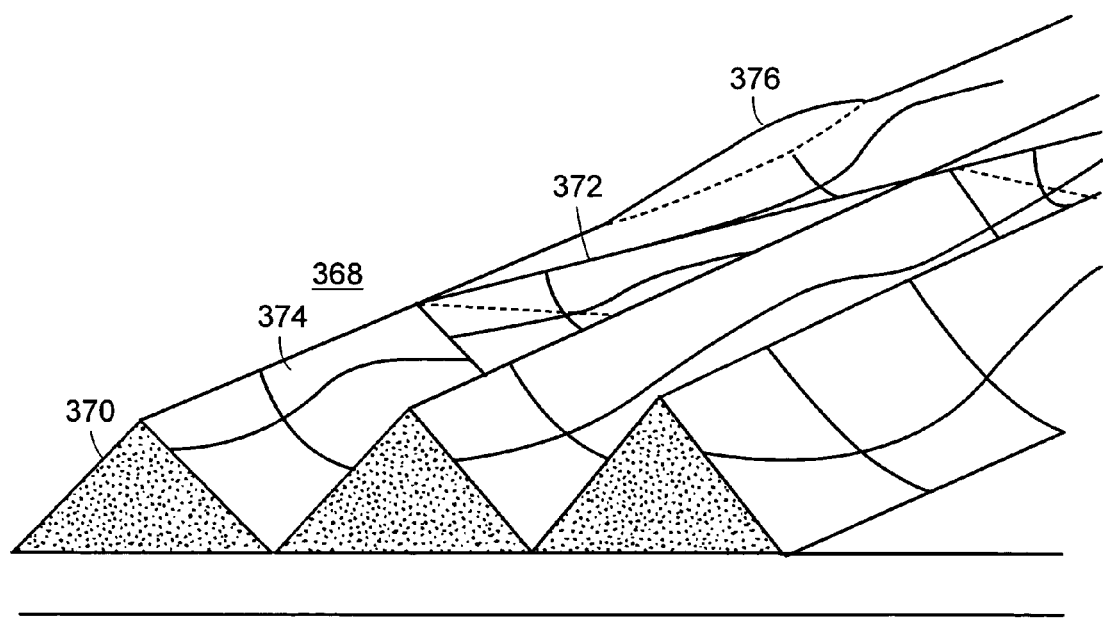
FIG. 31 is similar to the structure of FIG. 29, but further including elevated portions.

FIG. 31 is similar to the structure of FIG. 29 but further includes the elevated portions 376 on the peaks of the prisms 370 and/or cross-cut prisms 372.

Figure 32:
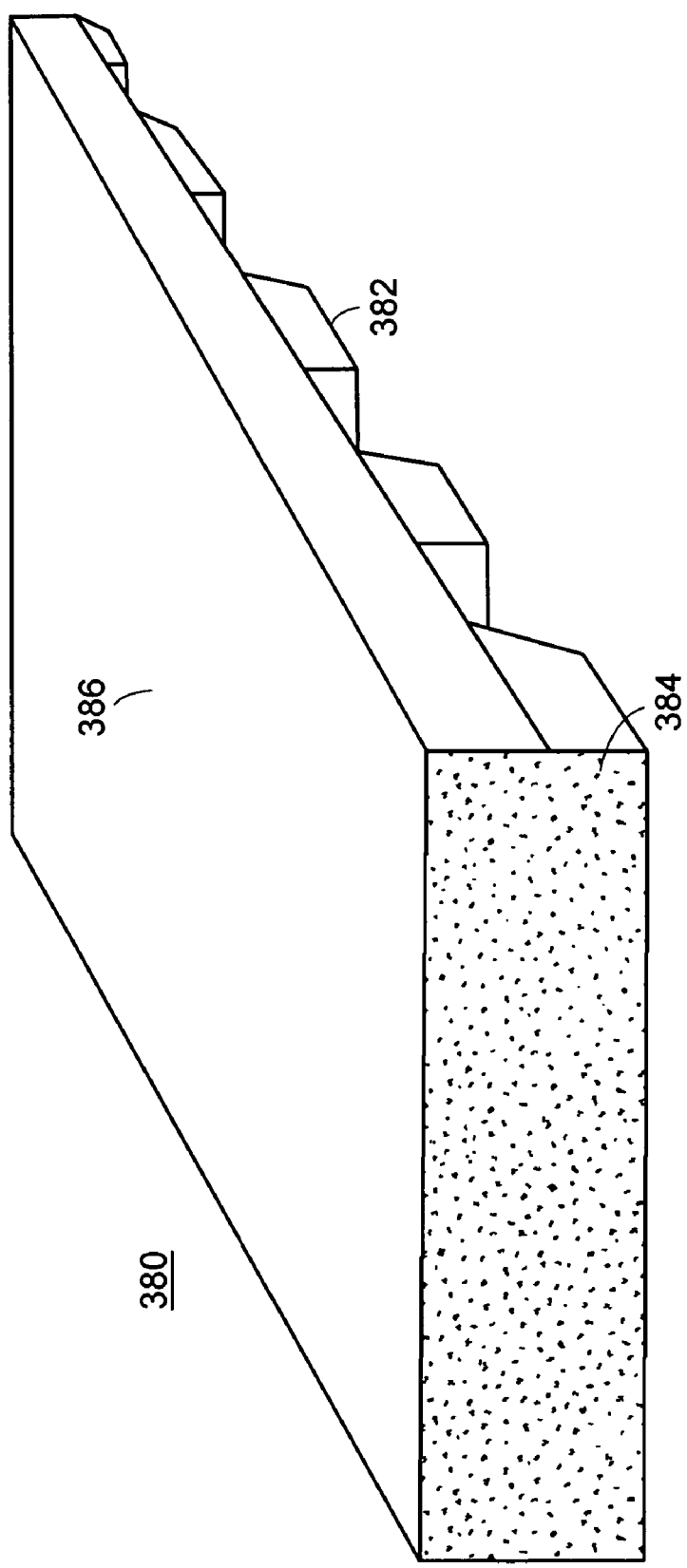
FIG. 32 is a perspective view of a backlight wedge that includes a stepped structure on a bottom side thereof.

FIG. 32 is a perspective view of a backlight wedge 380 that includes a stepped structure 382 on a bottom side that decreases in size traversing the wedge away from the light source which is positioned at end 384. The wedge 380 can be used in a backlit system, for example, a computer display device, to redirect light uniformly along output surface 386. In one embodiment, the structures 382 are integrally molded to the wedge 380.

Figure 33:
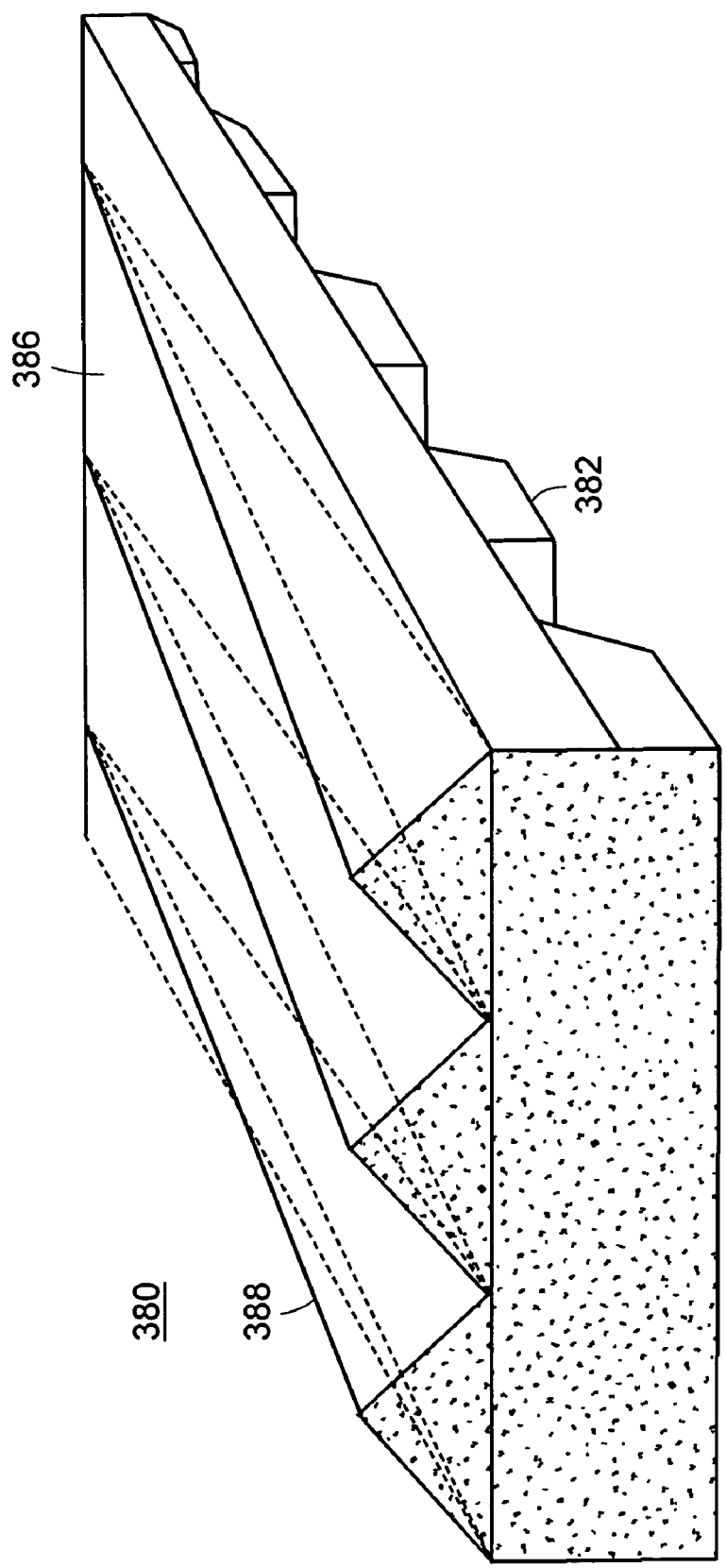
FIG. 33 is a perspective view of a backlight wedge that includes tapered prisms on the output surface.

FIG. 33 is a perspective view of a backlight wedge 380 that includes tapered prisms 388 on the output surface 386 to optimize the light exiting the wedge. The tapered prisms 388 reduce light piping away from the light source and collimates light exiting the wedge 380.

Figure 34:
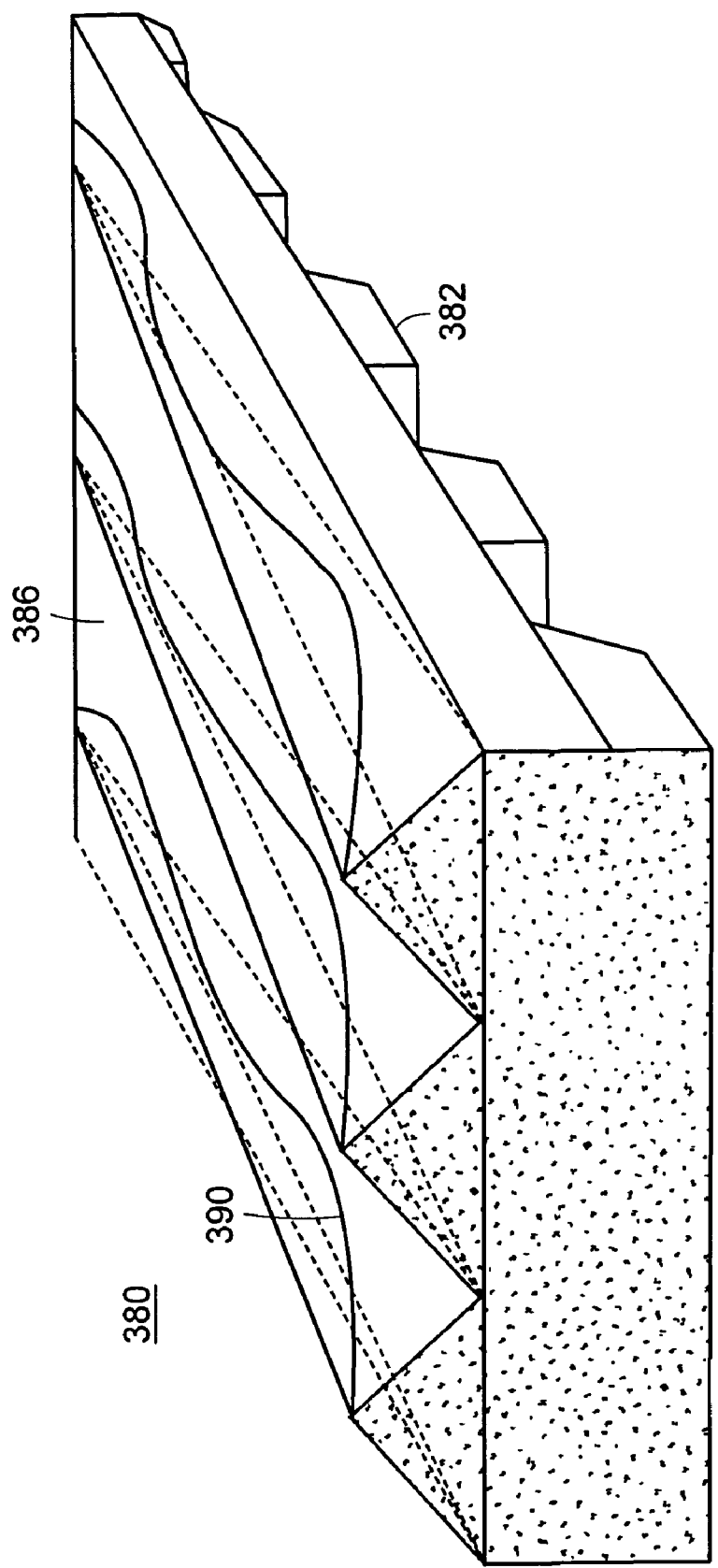
FIG. 34 is a perspective view of a backlight wedge similar to that shown in FIG. 33, but further includes a differentially-cured pattern on the tapered prisms.
Figure 35:
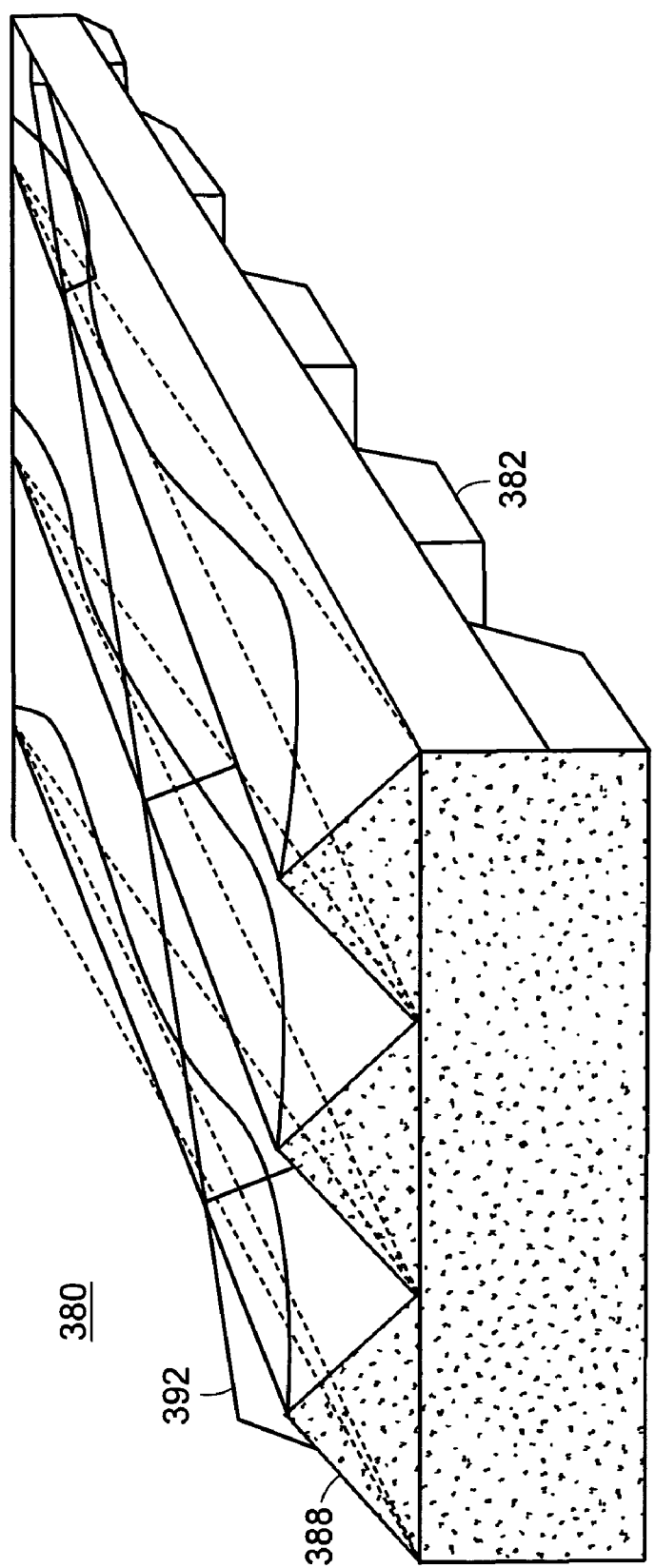
FIG. 35 is a perspective view of a backlight wedge similar to that shown in FIG. 33, but further includes cross-cut prisms.

FIG. 34 illustrates a backlight wedge 380 similar to that shown in FIG. 33, but further includes a differentially-cured pattern 390 on the tapered prisms 388. FIG. 35 illustrates a backlight wedge 380 that also includes cross-cut prisms 392 traversing the wedge. The cross-cut prisms 392 can be elevated above the tapered prisms 388 to prevent wet-out conditions. In other embodiments, the cross-cut prisms 392 can be about the same height as the tapered prisms 388.

Figure 36:
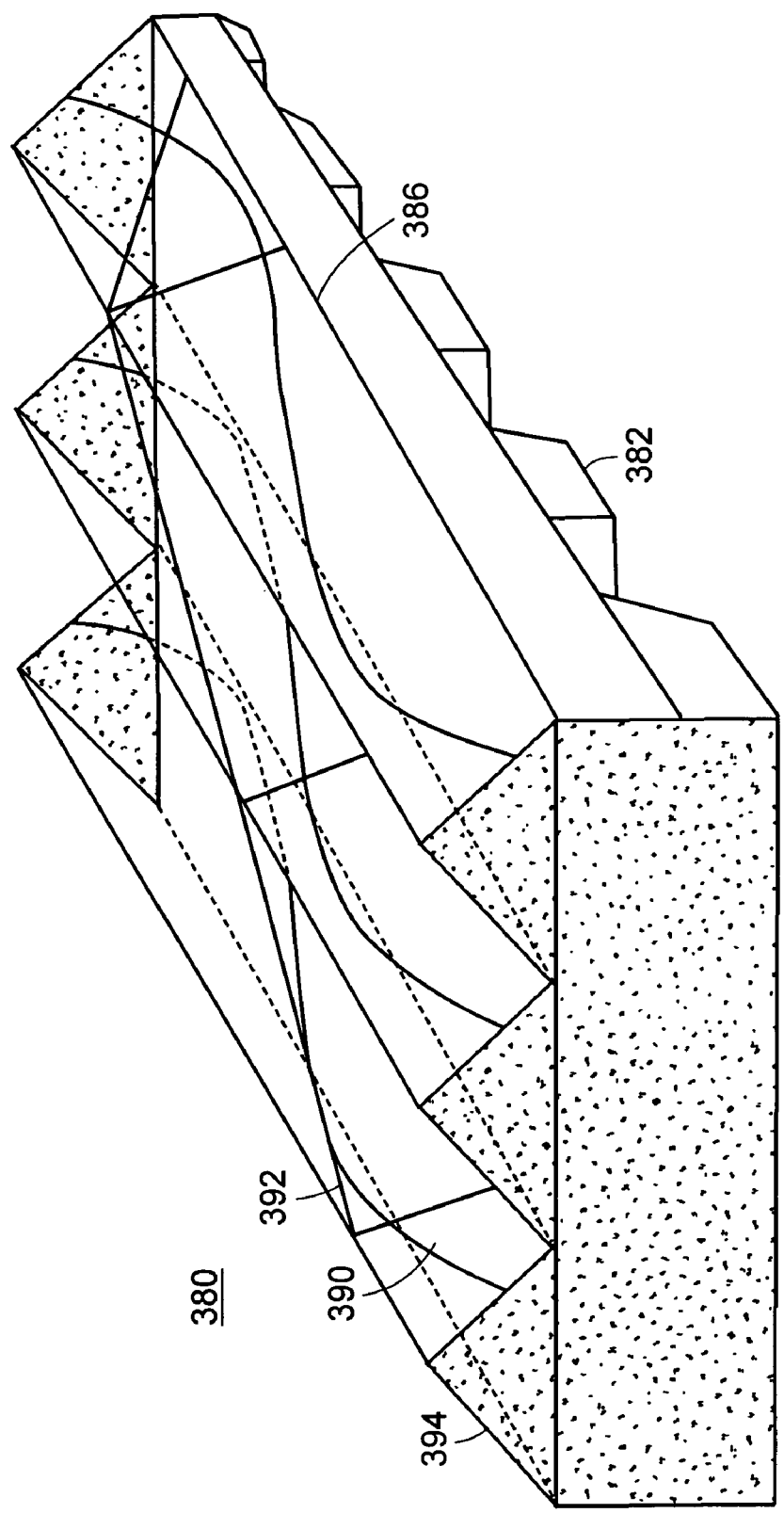
FIG. 36 is a perspective view of another embodiment of a backlight wedge in accordance with an embodiment of the present invention.

FIG. 36 illustrates a backlight wedge 380 that includes linear prisms 394 on the output surface 386 for collimating or redirecting light. A plurality of cross-cut prisms can also be provided on the output surface 386. Differentially-cured patterns 390 can be provided on the prisms 392, 394 for the reasons discussed above.

Figure 37:
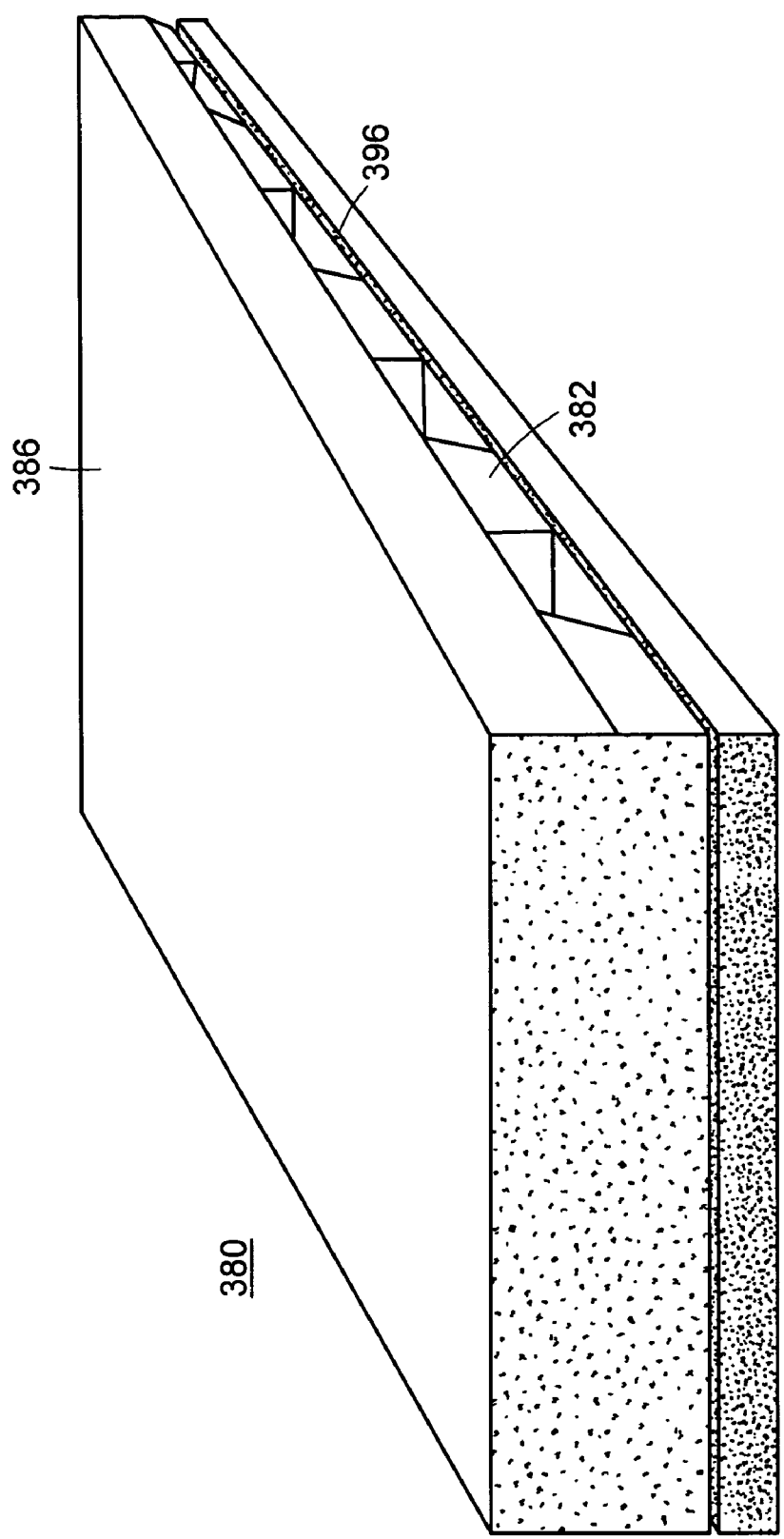
FIG. 37 is a perspective view of a backlight wedge that includes a stepped structure on a bottom surface.
Figure 38:
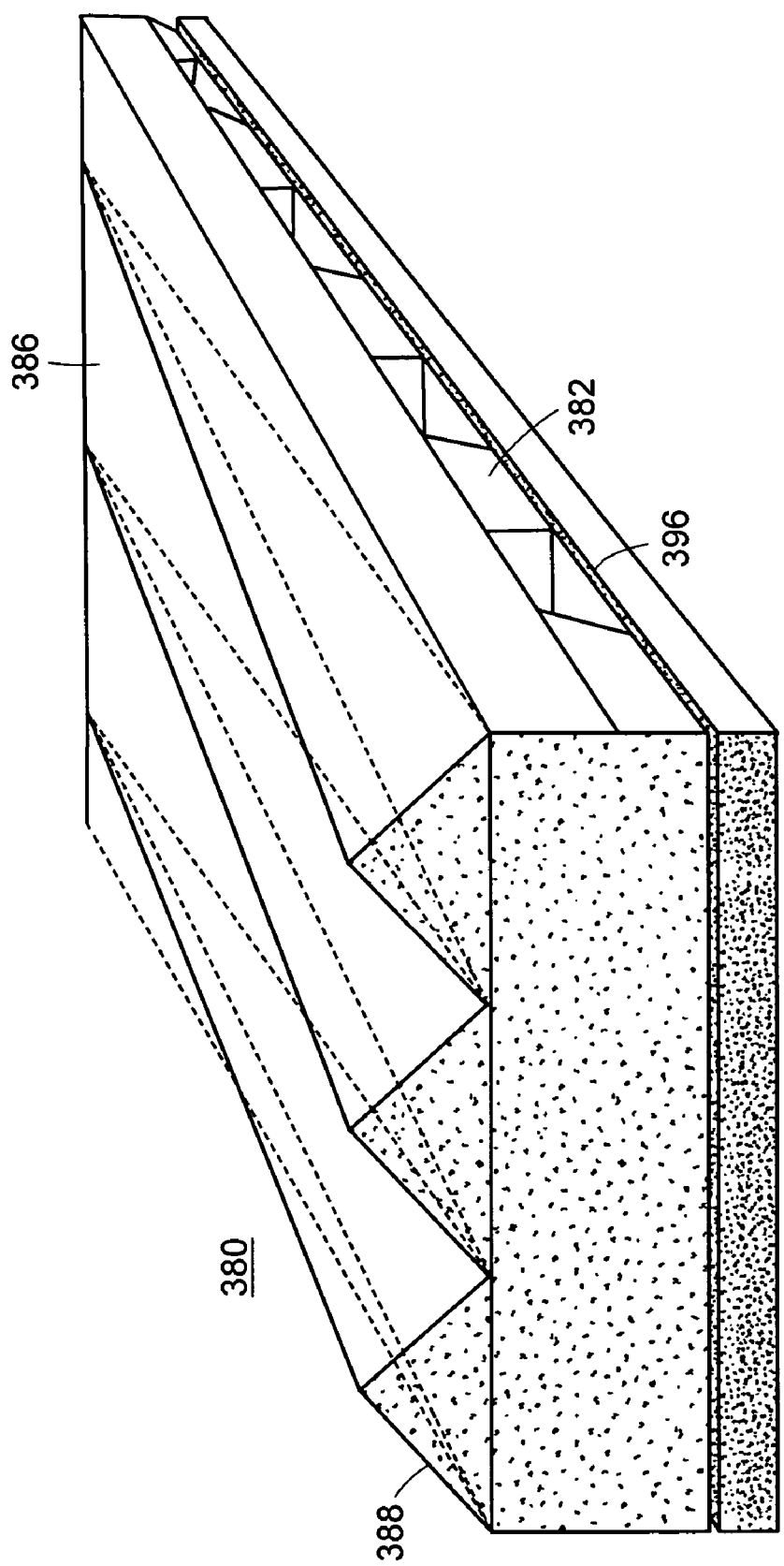
FIG. 38 is a perspective view of the backlight wedge of FIG. 37 that further includes tapered prisms on a top surface.
Figure 39:
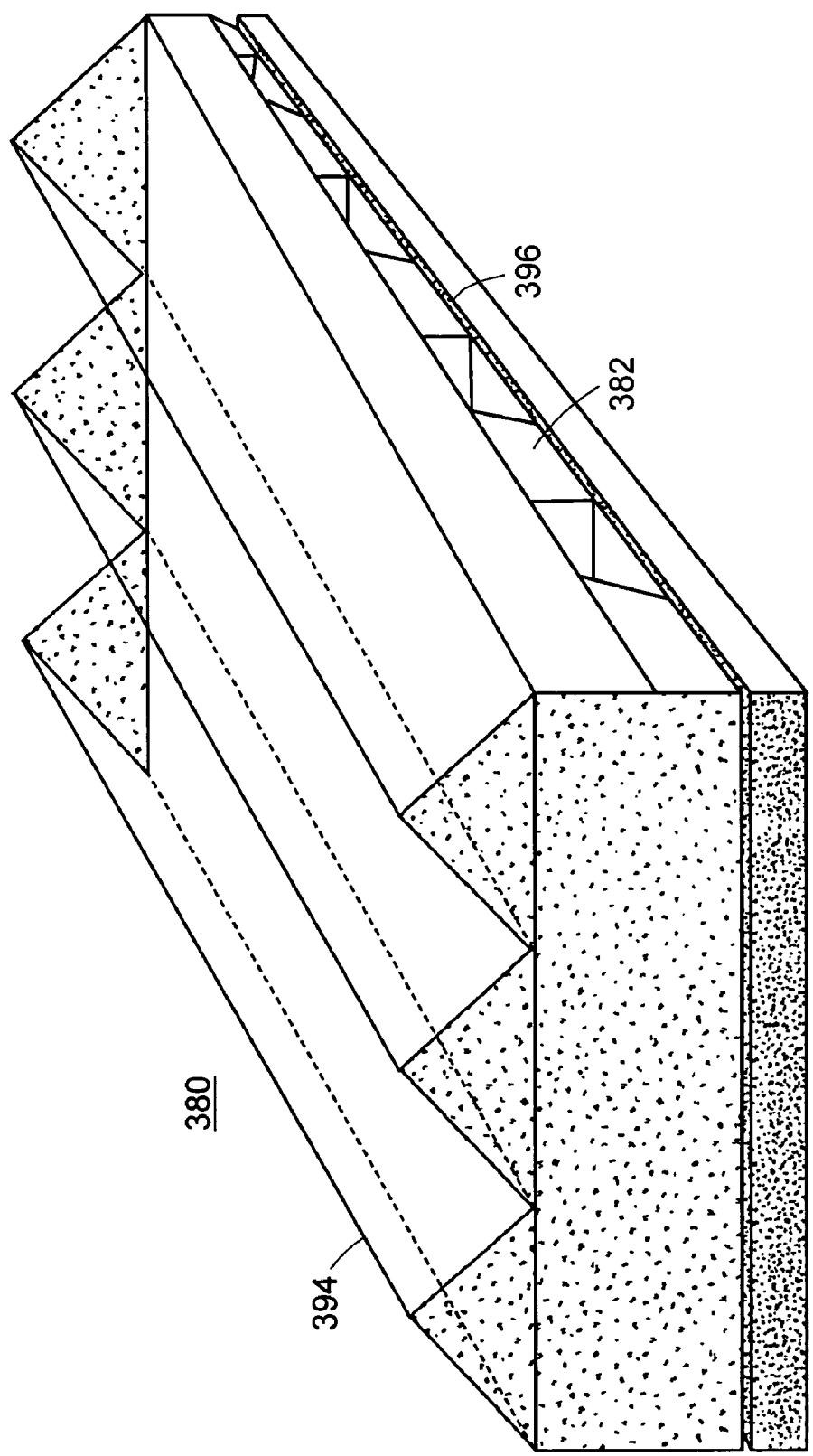
FIG. 39 is a perspective view of the backlight wedge of FIG. 37 that further includes linear prisms on a top surface.
Figure 40:
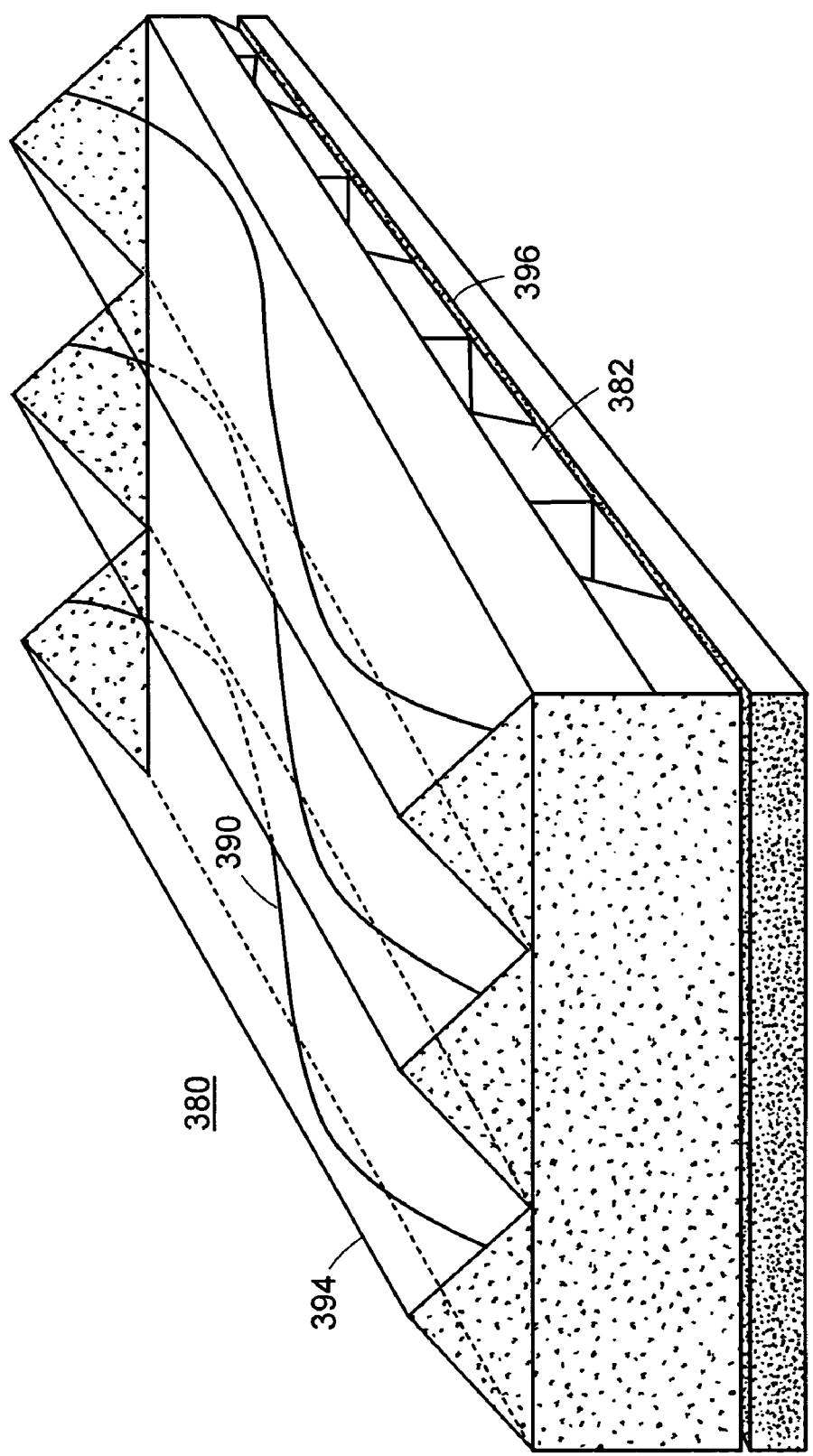
FIG. 40 is a perspective view of the backlight wedge of FIG. 39 that further includes a differentially-cured pattern on the linear prisms.
Figure 41:
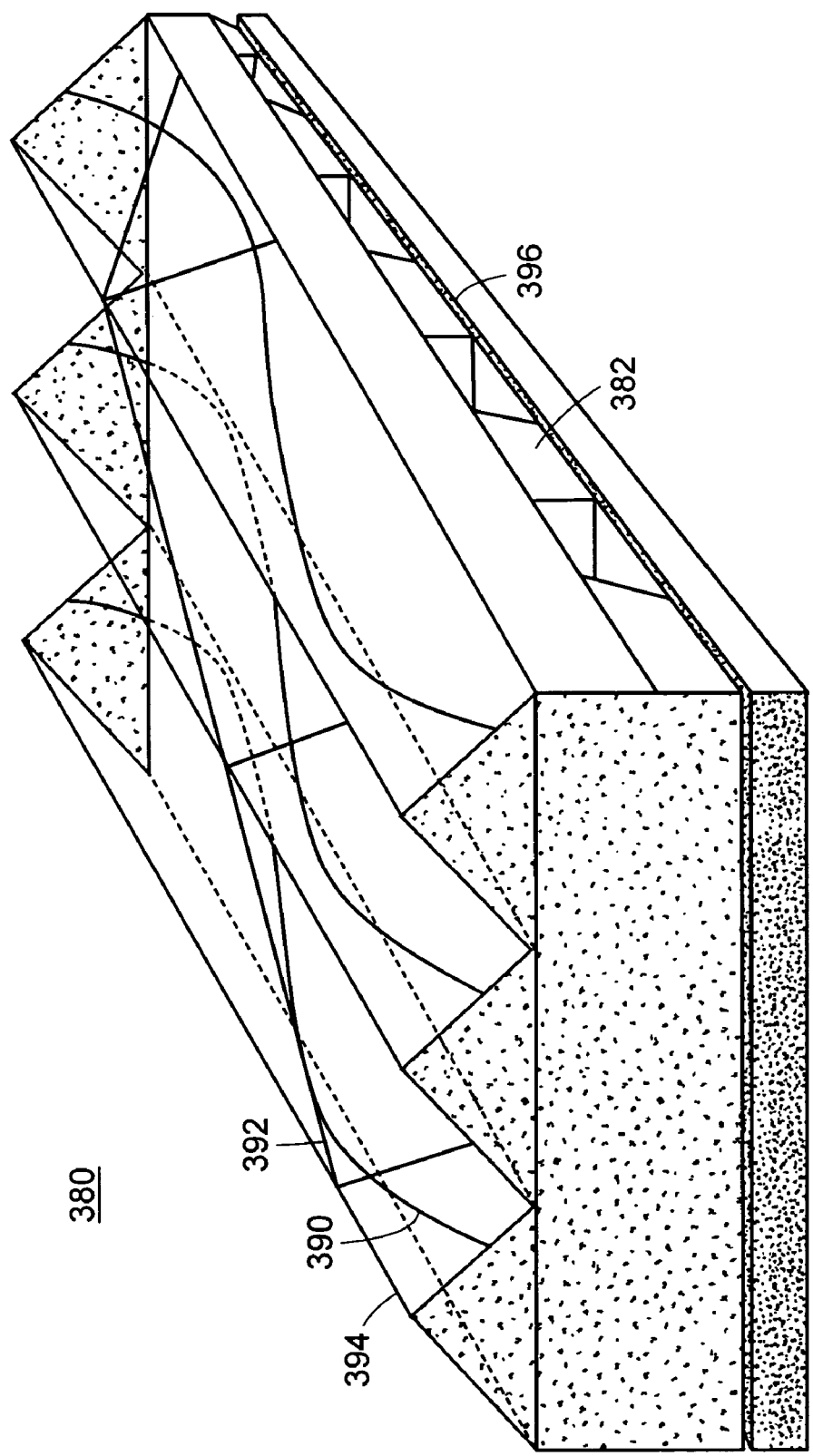
FIG. 41 is a perspective view of the backlight wedge of FIG. 41 that further includes cross-cut prisms.

FIG. 37 illustrates a backlight wedge 380 having a stepped structure 382 on a bottom surface. A reflective surface 396 can be provided on the bottom of the stepped structure 382 for redirecting light up toward the output surface 386. Reflective surface can be a reflective coating which can be formed of aluminum, silver or gold. FIG. 38 is a wedge 382 similar to FIG. 37, but includes tapered prisms 388 on the output surface 386. FIG. 39 is similar to the embodiment of FIG. 39, but includes linear prisms 394 instead of tapered prisms. The linear prisms 394 can include a differentially-cured pattern 390 as illustrated in FIG. 40. One or more cross-cut prisms 392 can further be provided as illustrated in FIG. 41.

Figure 42:
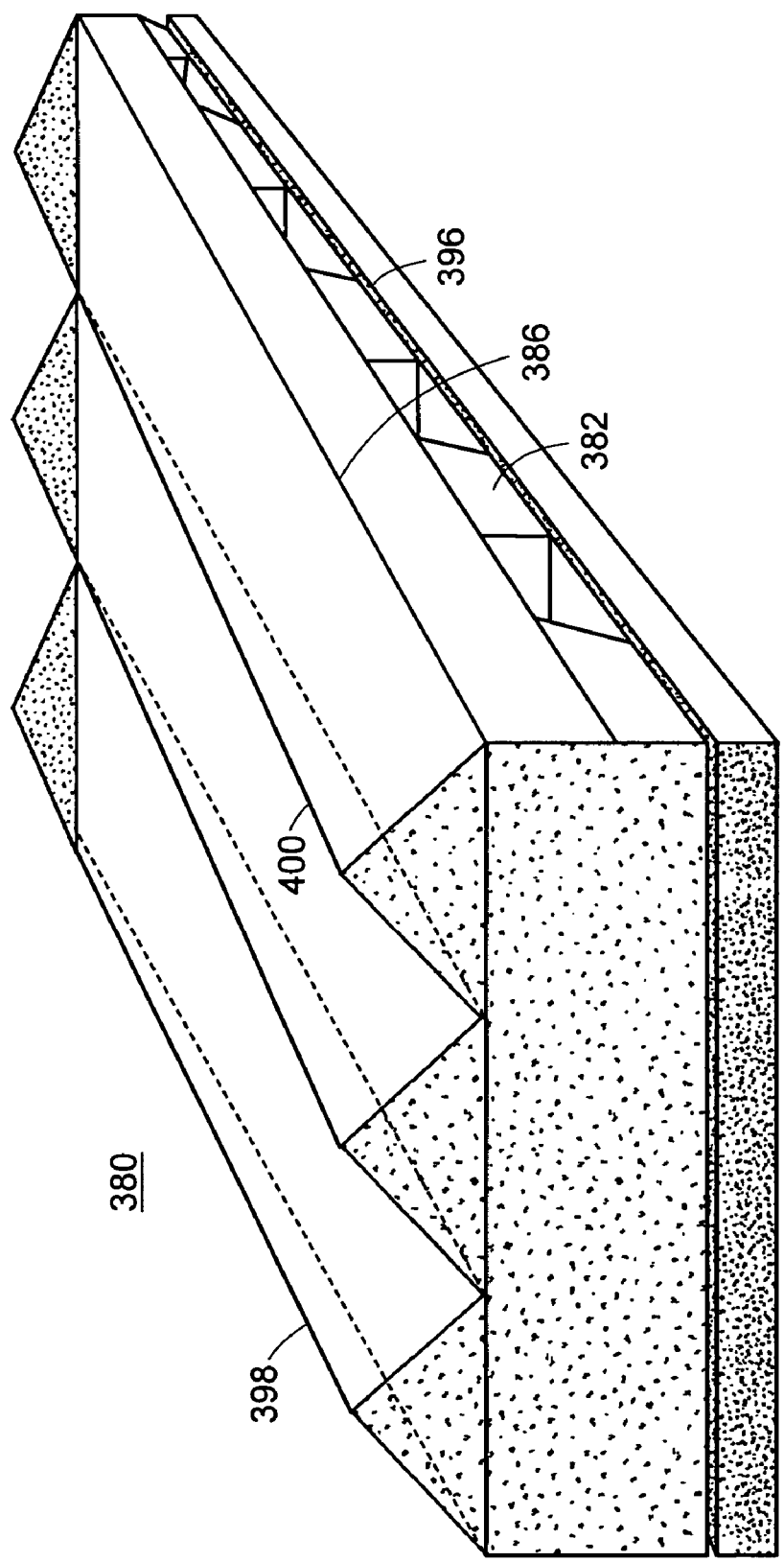
FIG. 42 is a perspective view of the backlight wedge of FIG. 37 that further includes prisms that have a varying included angle.
Figure 43:
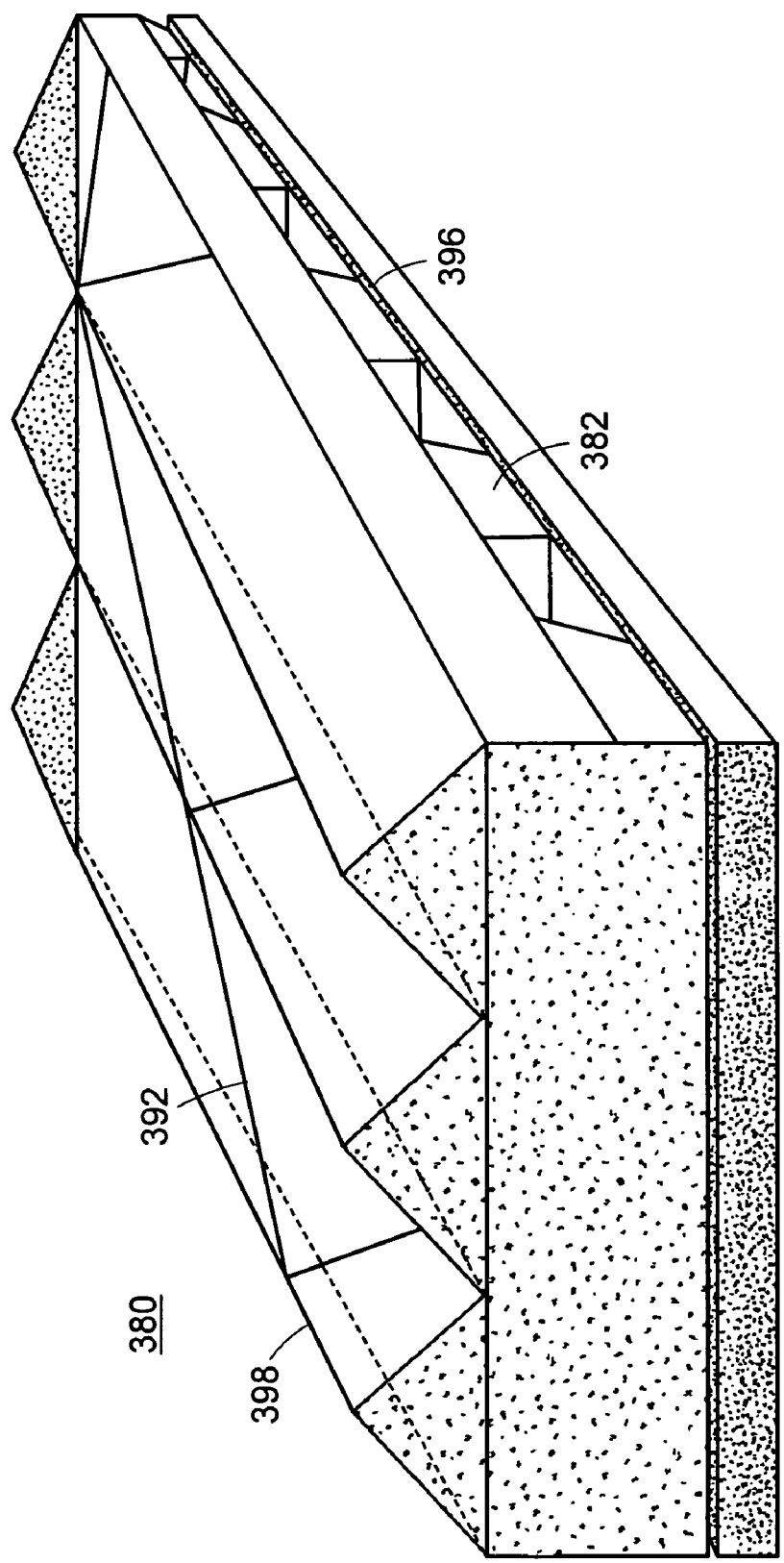
FIG. 43 is a perspective view of the backlight wedge of FIG. 42 that further includes cross-cut prisms.
Figure 44:
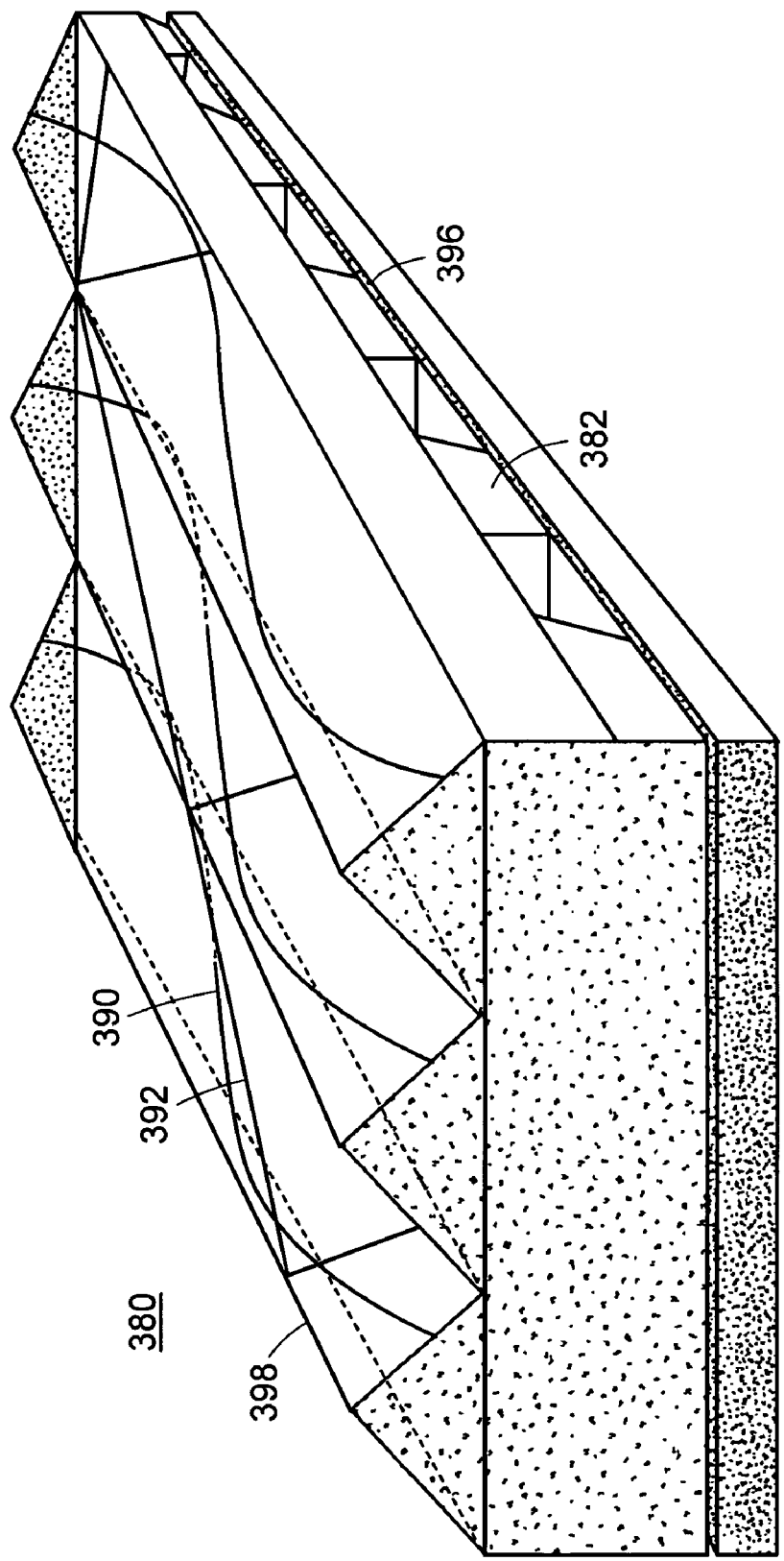
FIG. 44 is a perspective view of the backlight wedge of FIG. 43 that further includes a differentially-cured pattern on the prisms.
Figure 45:
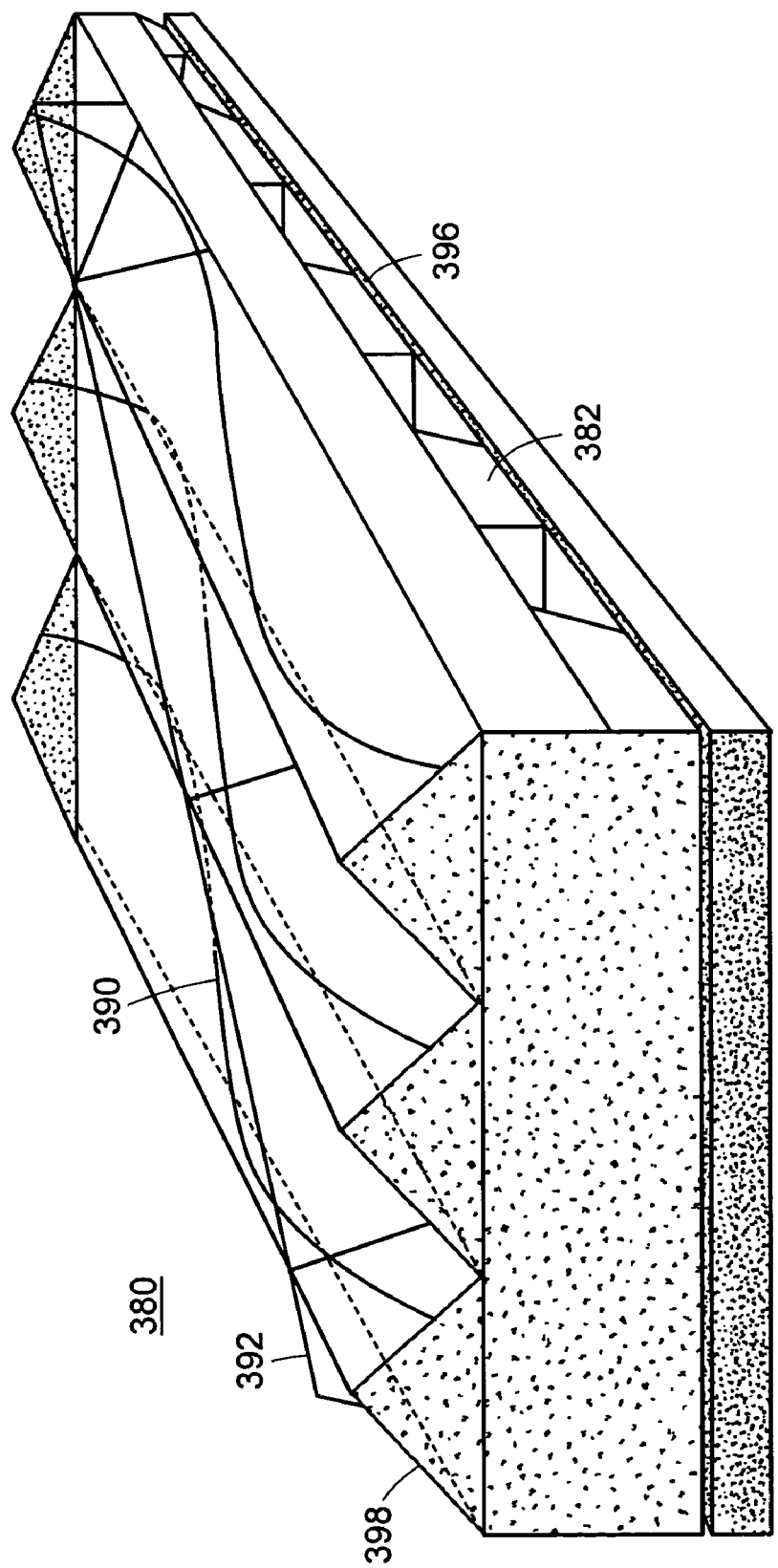
FIG. 45 is similar to the embodiment of FIG. 44, but the cross-cut prisms extend above the prisms having the varying included angle.

FIG. 42 illustrates a backlight wedge 380 that includes prisms 398 which have a varying included angle along the apex 400. The varying included angles can vary in a stepped fashion along the length of the prisms. The varying included angle provides a different degree of light collimation along the wedge 380, i.e., the prism 398 at the end farthest away from the light source has a shallower [larger?] included angle thereby allowing more light to pass therethrough. One or more cross-cut prisms 392 can further be provided as illustrated in FIG. 43. The prisms 398, 390 can include a differentially-cured pattern 390 as illustrated in FIG. 44. FIG. 45 is similar to the embodiment of FIG. 44 but the cross-cut prisms 390 extended above the prisms 398.

Figure 46:
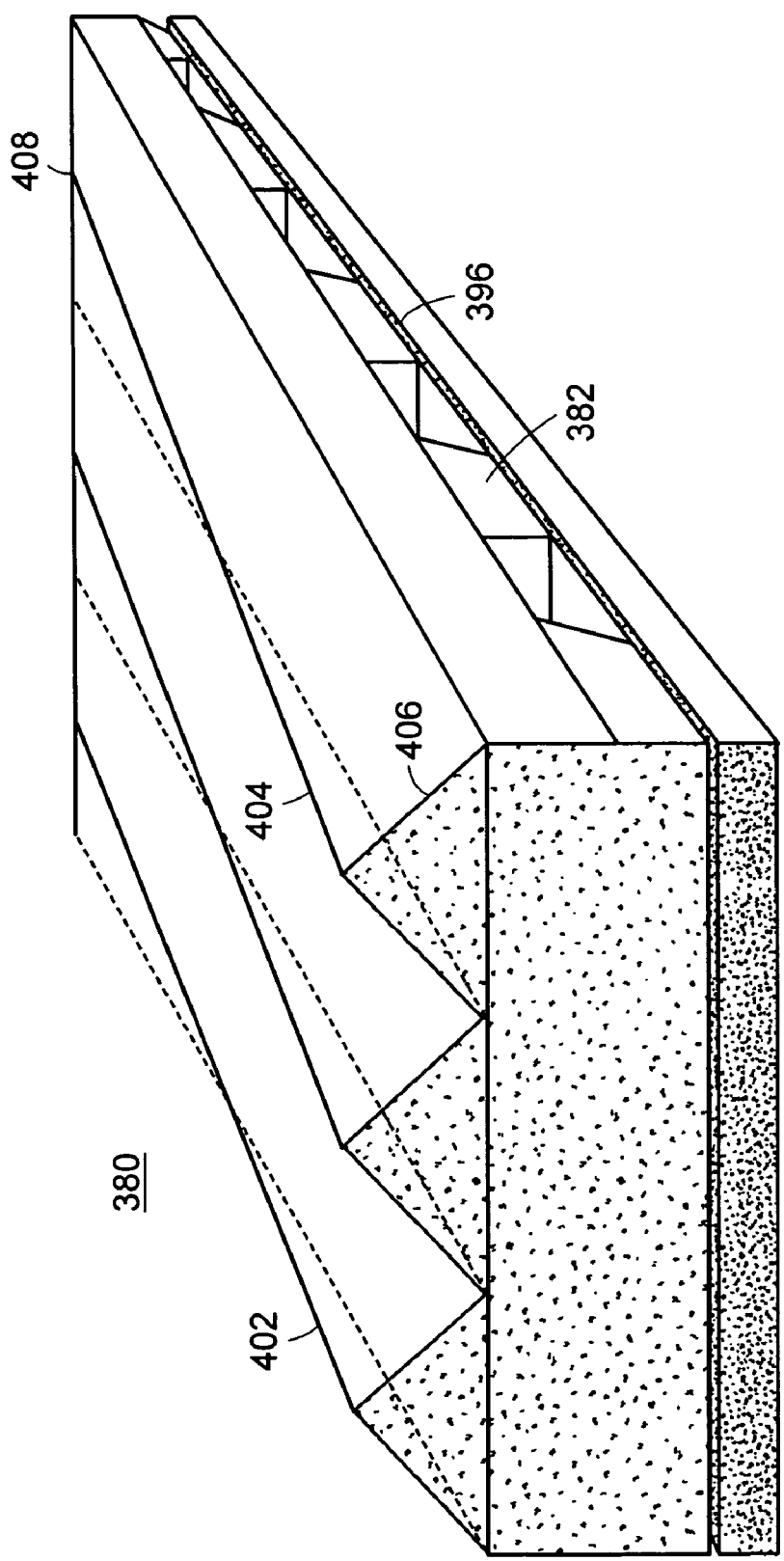
FIG. 46 is a perspective view of the backlight wedge of FIG. 37 that further includes prisms having a varying included angle on a top surface in accordance with another embodiment of the present invention.

FIG. 46 illustrates a backlight wedge 380 that includes prisms 402 which have a varying included angle along the apex 404. In this embodiment, the included angle varies from a predetermined angle, for example, 90 degrees, at a first end 406, to zero degrees at a second end 408.

Figure 47:
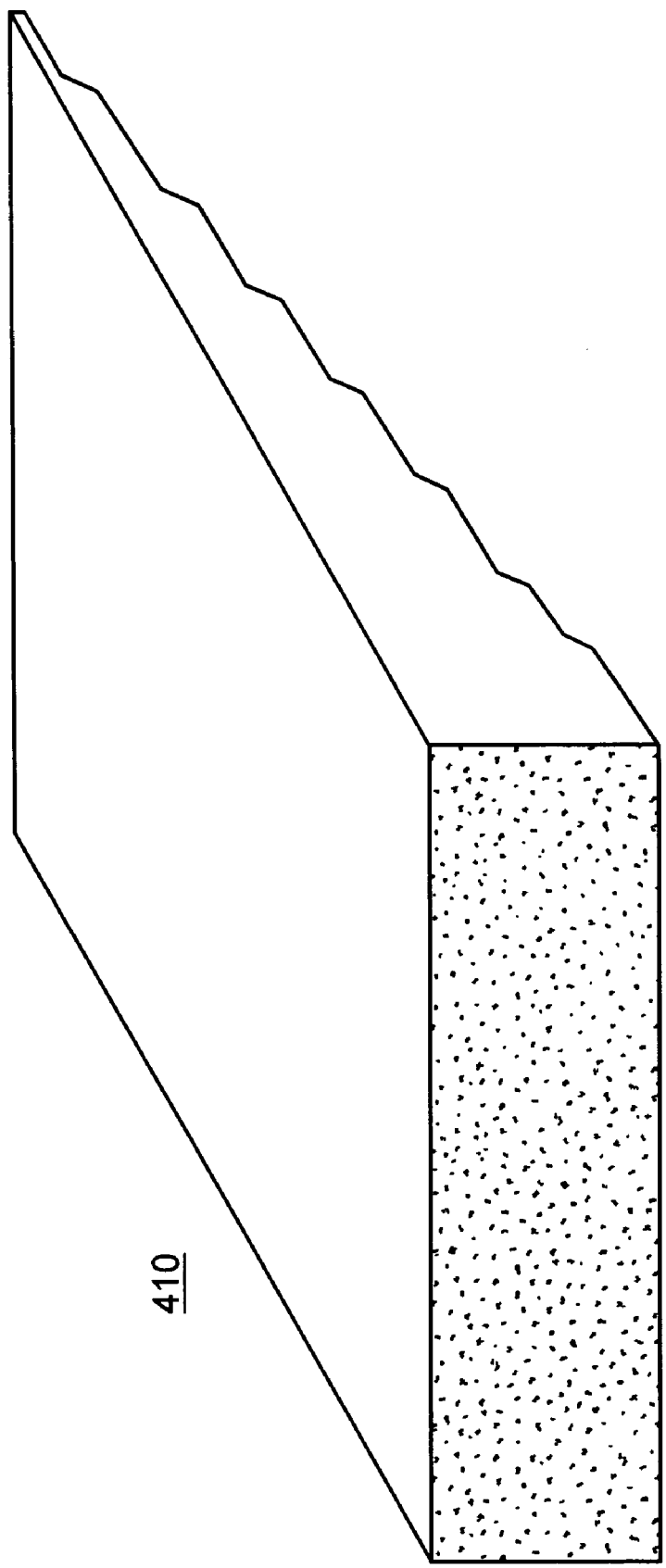
FIG. 47 is a perspective view of a prior art stepped waveguide.
Figure 48:
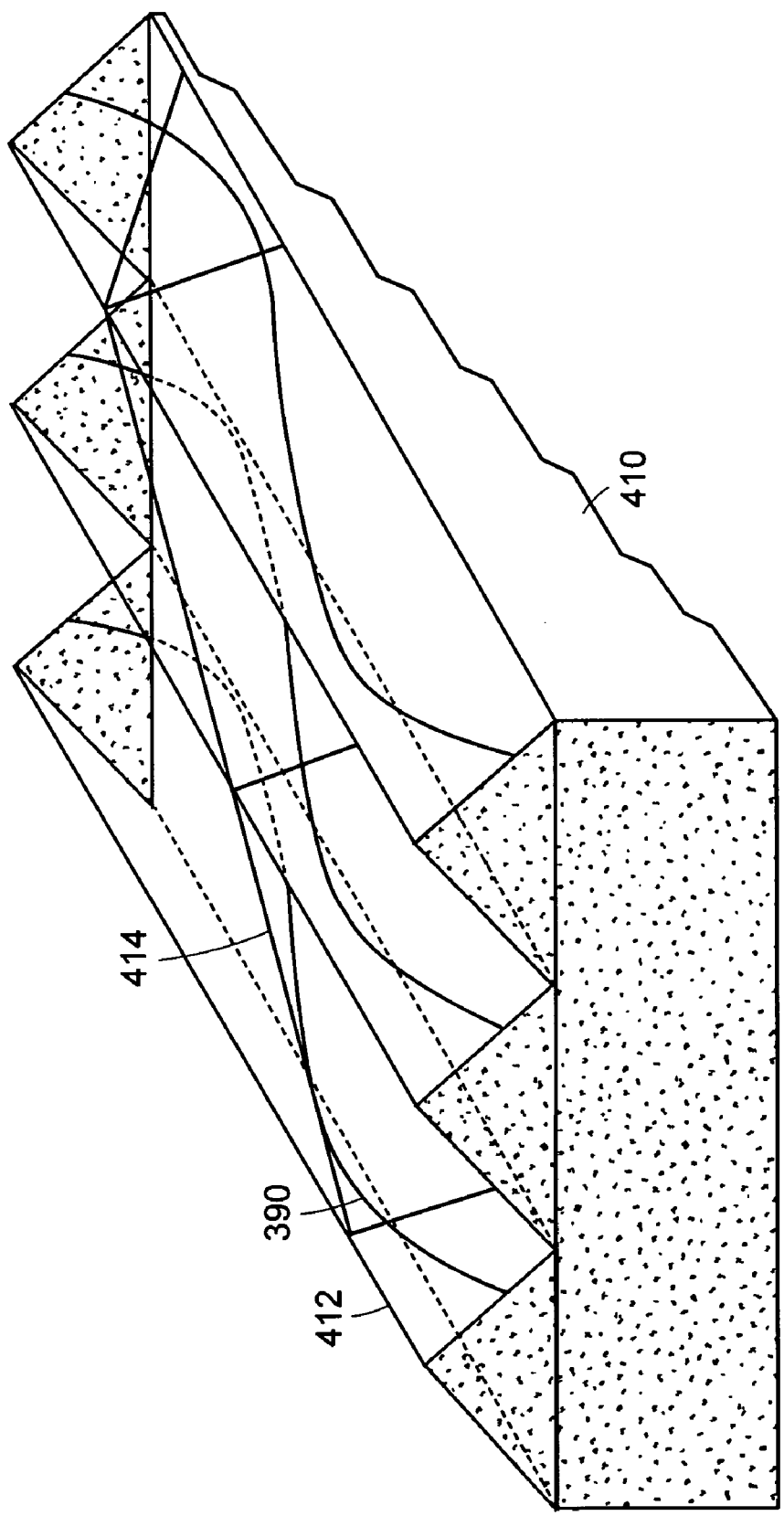
FIG. 48 is a perspective view of the waveguide of FIG. 47 that further includes linear and cross-cut prisms on the top surface having a differentially-cured pattern thereon.
Figure 49:
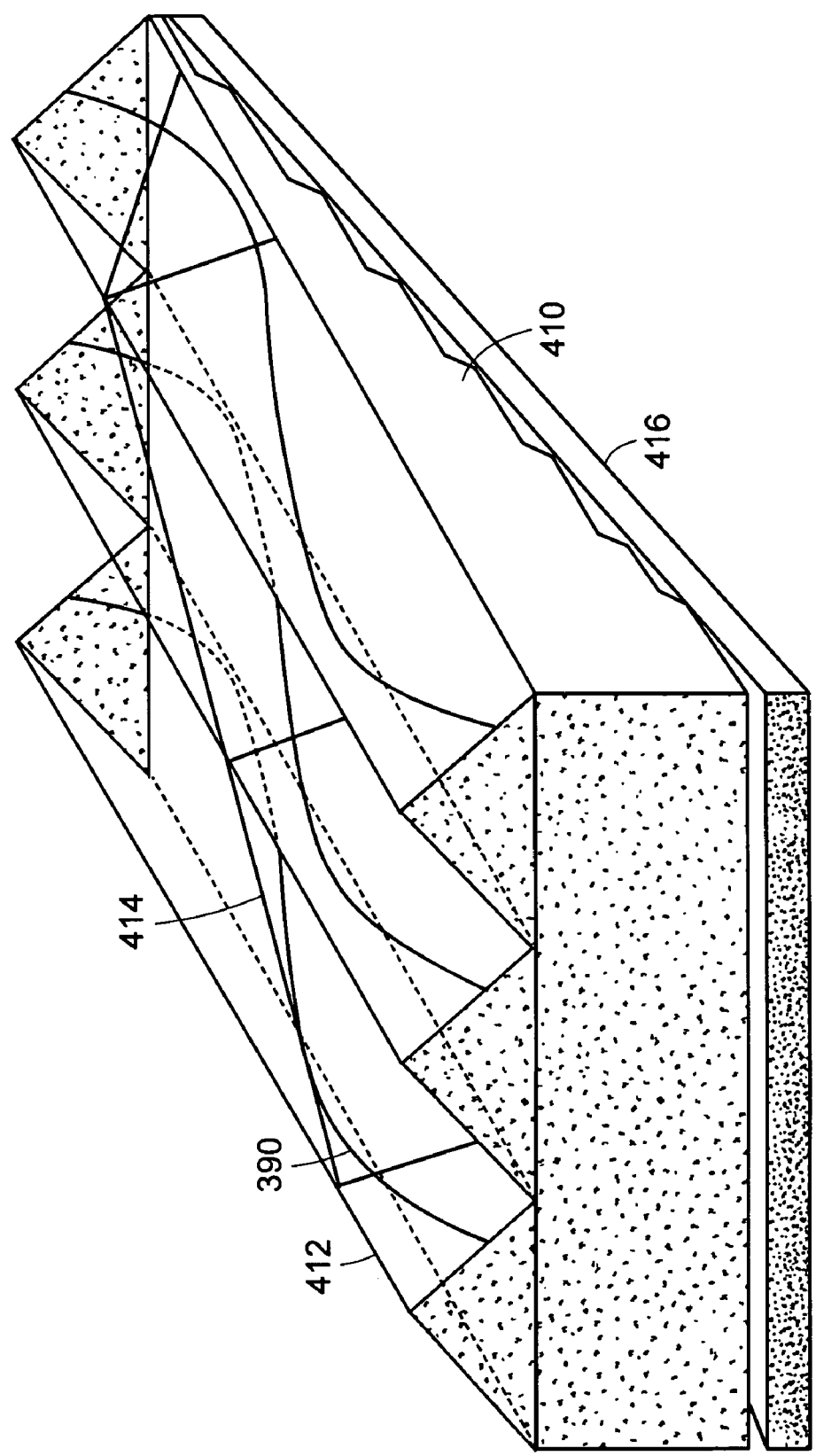
FIG. 49 is a perspective view of the waveguide of FIG. 48 that further includes a waveguide positioned below the stepped waveguide.
Figure 50:
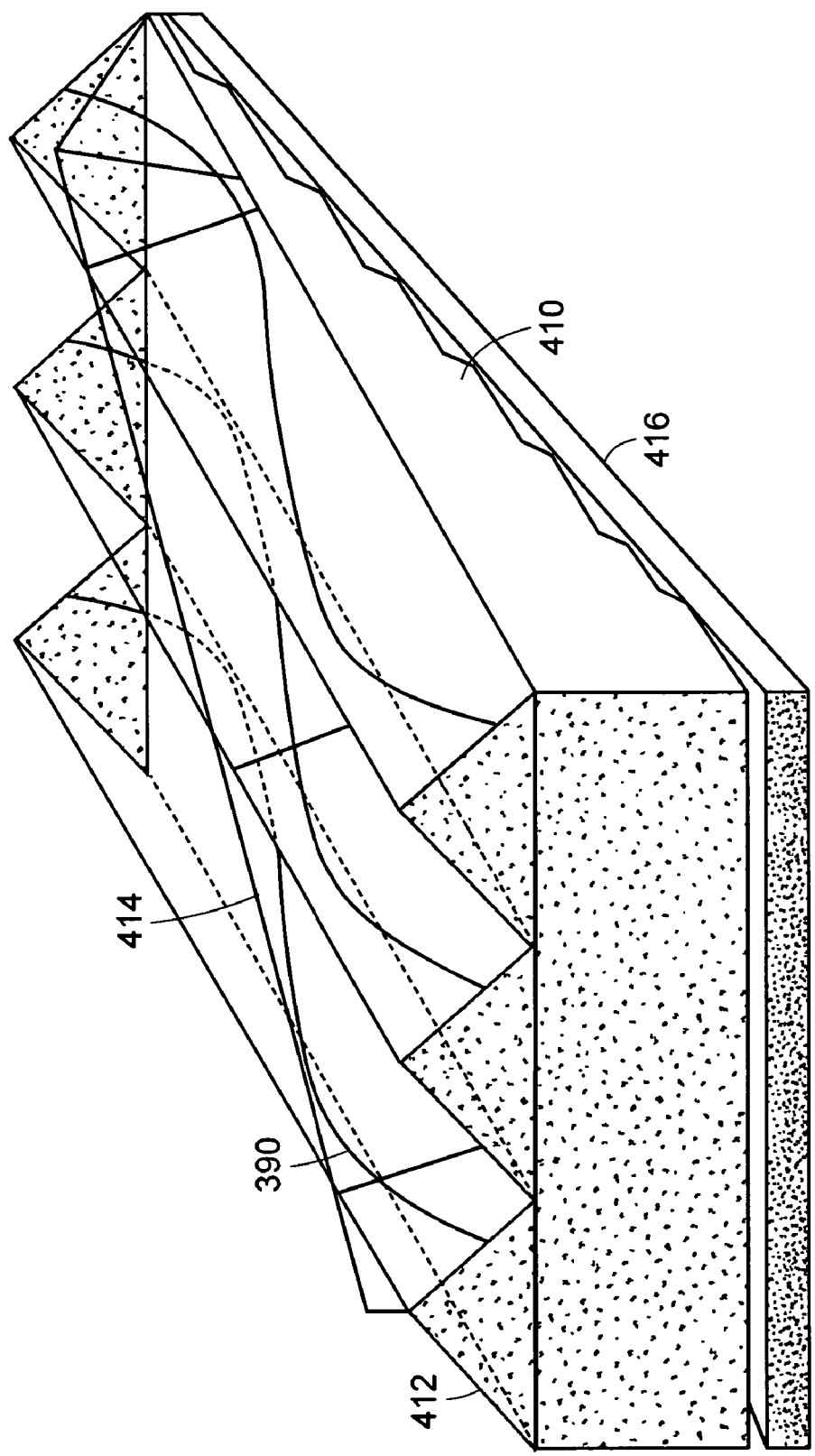
FIG. 50 is a perspective view of the waveguide of FIG. 49, but the cross-cut prisms extend above the linear prisms.
Figure 51:
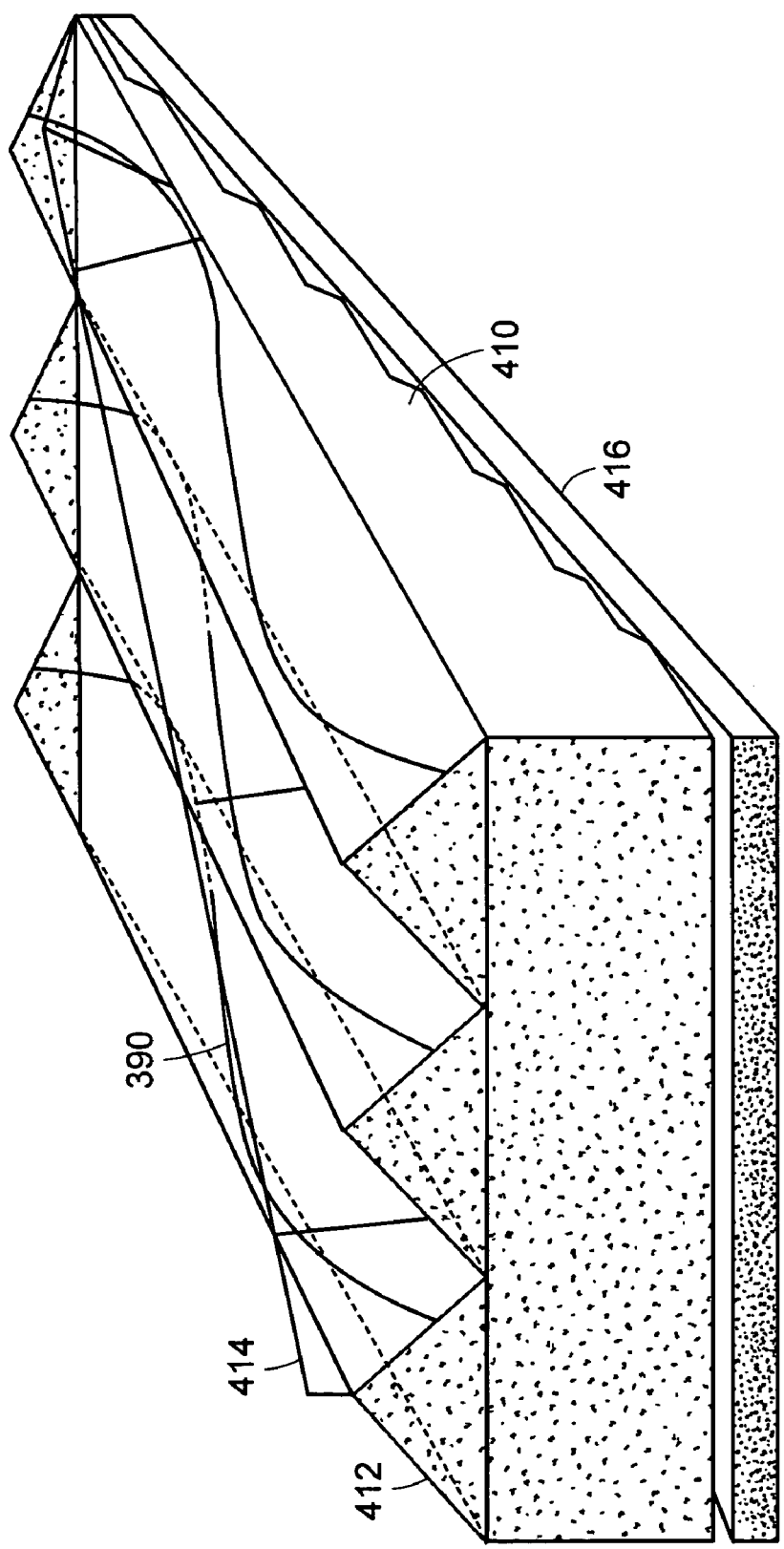
FIG. 51 is similar to the embodiment of FIG. 50, but the prisms on top of the waveguide have a varying included angle.
Figure 52:
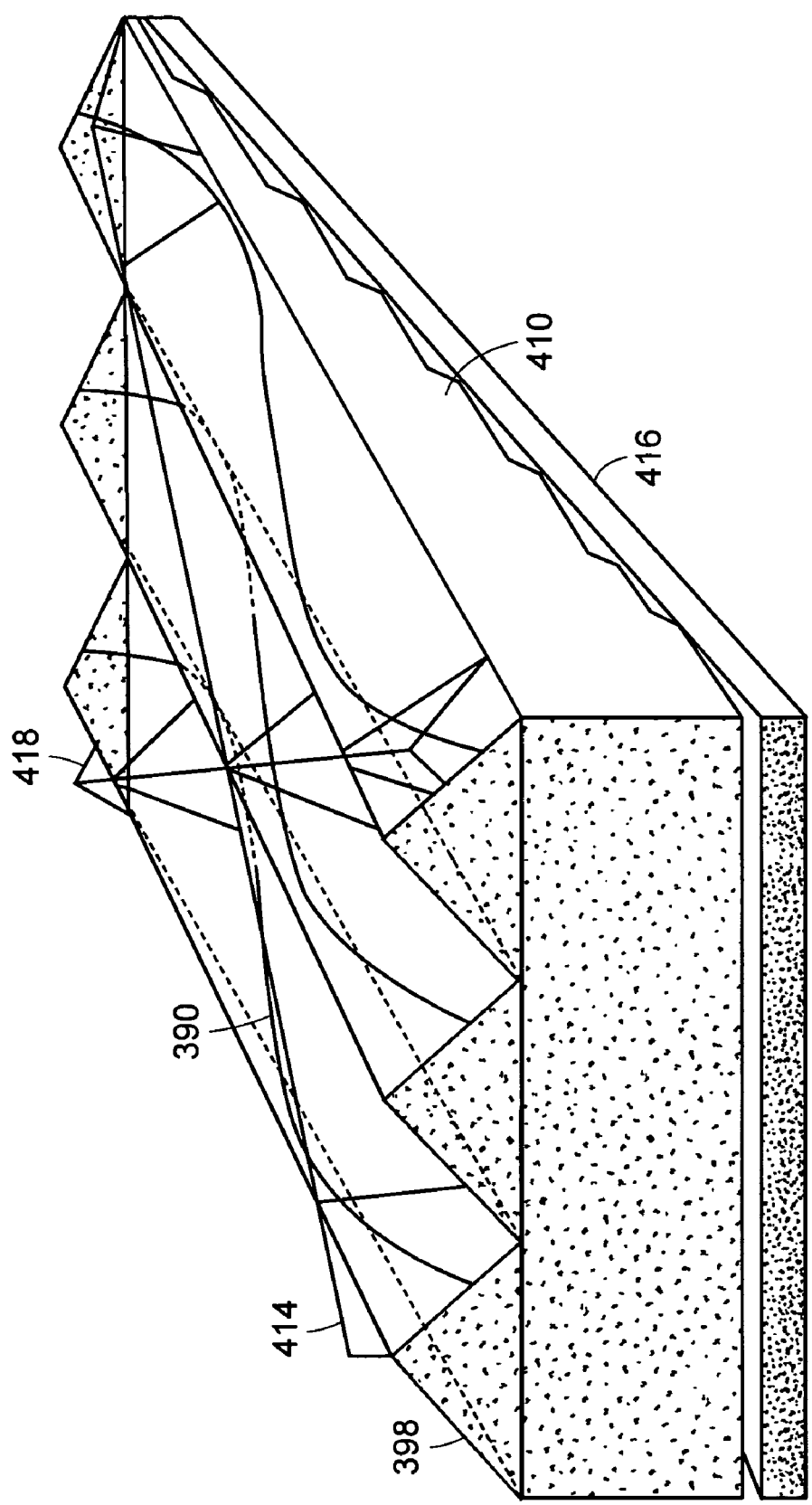
FIG. 52 is similar to the embodiment of FIG. 51, but further includes additional cross-cut prisms.

FIG. 47 is a perspective view of a prior art stepped waveguide 410. The waveguide 410 can include linear prisms 412 and cross-cut prisms 414 on the top surface as illustrated in FIG. 48. The prisms 412, 414 can include a differentially-cured pattern 390 thereon. As illustrated in FIG. 49, a waveguide 416 can be positioned below the stepped waveguide 410 for redirecting light towards the waveguide 410. The cross-cut prisms 390 in FIG. 50 can extend above the prisms 412 to prevent, for example, wet-out conditions. FIG. 51 is similar to the embodiment of FIG. 50 but the prisms 398 on the top surface of the waveguide 410 have varying included angles. Additional cross-cut prisms 418 can be provided on the top surface as illustrated in FIG. 52.

Figure 53:
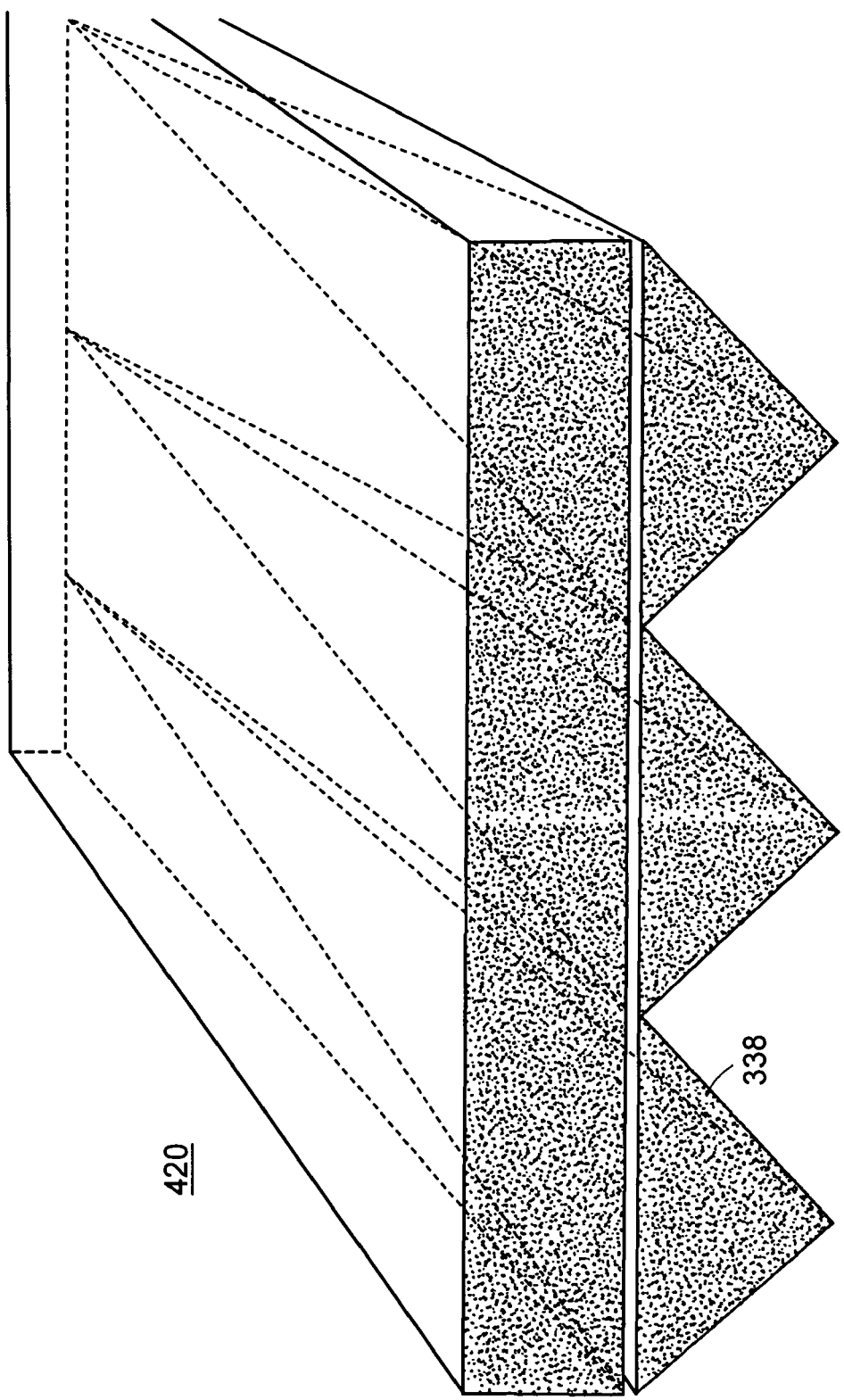
FIG. 53 is a perspective view of a waveguide that includes tapered prisms on the bottom surface.
Figure 54:
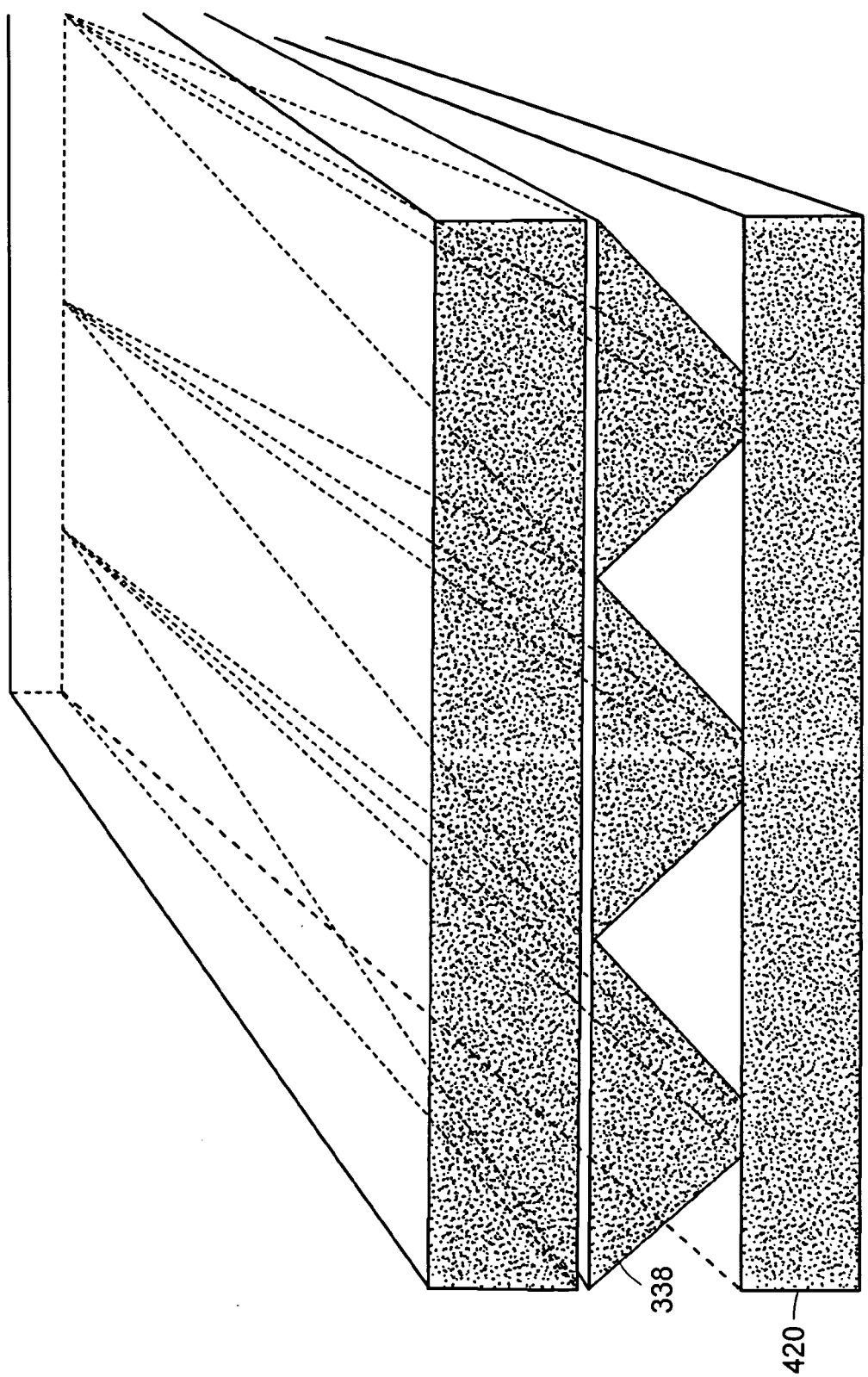
FIG. 54 is a perspective view of the waveguide of FIG. 53 that has been modified and another waveguide provided at the apices of the prisms.
Figure 55:
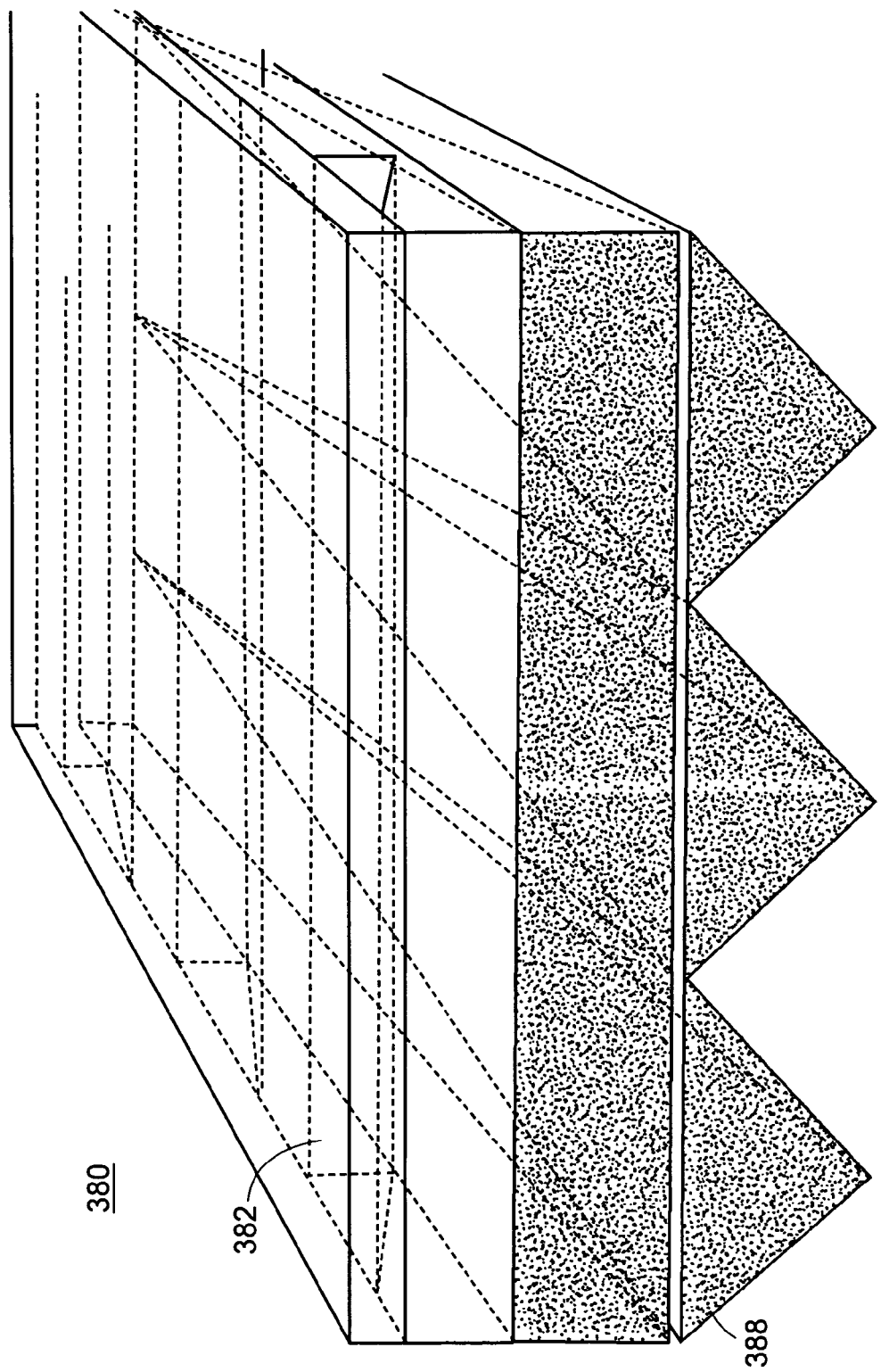
FIG. 55 is a perspective view of the backlight wedge of FIG. 38 shown upside down.

FIG. 53 is a perspective view of a waveguide 420 that includes tapered prisms 338 on the bottom surface. The prism apices can be truncated and a second waveguide 420 can be provided thereat for redirecting light towards the waveguide 420. FIG. 55 is the backlight wedge 380 of FIG. 38 shown upside down.

While this invention has been particularly shown and described with references to various embodiments thereof, it will be understood by those skilled in the art that various changes in form and details may be made therein without departing from the scope of the invention encompassed by the appended claims.

What is claimed is:

1. A light-directing optical structure comprising:
   a) a first side and a second side, the first side including plurality of linear prisms having a visibly random shaped surface on said prisms; and
   b) a plurality of cross-cut prisms on first side which are oriented at an angle such that it is greater than zero degrees but less than 180 degrees, wherein the apexes of the linear prisms include a sufficient portion that include sufficient curvature to reduce Lloyd's mirror fringe effects as compared to linear prisms without curvature.

2. A light-directing optical structure comprising:
   a) a first side and a second side, the first side including plurality of linear prisms having a visibly random shaped surface on said prisms; and
   b) a plurality of cross-cut prisms on first side which are oriented at an angle such that it is greater than zero degrees but less than 180 degrees, wherein the linear prisms or cross-cut prisms include elevated portions in a predetermined pattern located on the prism peaks.

3. The structure of claim 2 wherein the linear prisms include substantially linear peaks.

4. The structure of claim 2 wherein the linear prisms include apexes having an included angle of about ninety degrees.

5. The structure of claim 2 wherein the cross-cut prisms include apexes having an included angle of about ninety degrees.

6. The structure of claim 2 wherein the linear prisms have a height greater than the height of the cross-cut prisms.

7. The structure of claim 2 wherein the linear prisms have a height less than the height of the cross-cut prisms.

8. The structure of claim 2 wherein the cross-cut prisms include apexes having an included angle of less than about ninety degrees.

9. The structure of claim 2 wherein the cross-cut prisms include apexes having an included angle of greater than about ninety degrees.

10. The structure of claim 2 wherein said first side includes a plurality of first cured portions and a plurality of second cured portions that are formed from a same radiation-curable material, the first plurality of cured portions being cured to a first amount of time or at a first rate and the plurality of second cured portions being cured to a second amount of time or at a second rate, the first amount of time or rate being sufficiently different than the second amount of time or rate to result with discontinuities on and/or within the surface of the structure.

11. The structure of claim 2 wherein said linear prisms or cross-cut prisms include a bump, pip or differential height.

* * * * *